United States Patent
Sun et al.

(10) Patent No.: US 9,461,054 B2
(45) Date of Patent: Oct. 4, 2016

(54) SEMICONDUCTOR DEVICES HAVING VERTICAL DEVICE AND NON-VERTICAL DEVICE AND METHODS OF FORMING THE SAME

(71) Applicant: Samsung Electronics Co., Ltd., Suwon-si (KR)

(72) Inventors: Min-Chul Sun, Seoul (KR); Byung-Gook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/789,433

(22) Filed: Jul. 1, 2015

(65) Prior Publication Data

US 2015/0303202 A1    Oct. 22, 2015

Related U.S. Application Data

(62) Division of application No. 13/412,760, filed on Mar. 6, 2012, now Pat. No. 9,087,922.

(30) Foreign Application Priority Data

Jun. 16, 2011  (KR) .................. 10-2011-0058623

(51) Int. Cl.
*H01L 27/11* (2006.01)
*H01L 21/8234* (2006.01)
(Continued)

(52) U.S. Cl.
CPC ... *H01L 27/1104* (2013.01); *H01L 21/823487* (2013.01); *H01L 21/823885* (2013.01); *H01L 27/092* (2013.01); *H01L 29/7827* (2013.01)

(58) Field of Classification Search
CPC .............. H01L 21/823885; H01L 21/823487; H01L 27/092
See application file for complete search history.

(56) References Cited

U.S. PATENT DOCUMENTS 5,073,519 A    12/1991  Rodder
5,554,870 A *  9/1996  Fitch .................. H01L 27/1104
                                                  257/329
(Continued)

FOREIGN PATENT DOCUMENTS

JP    09232447        9/1997
JP    2003224211      8/2003
(Continued)

OTHER PUBLICATIONS

Office Action dated Mar. 17, 2016, in related Taiwanese Patent Application No. 10520323600.
(Continued)

*Primary Examiner* — Mark Tornow
(74) *Attorney, Agent, or Firm* — Onello & Mello, LLP

(57) ABSTRACT

A semiconductor device comprises a substrate extending in a horizontal direction and a vertical transistor on the substrate. The vertical transistor comprises: a first diffusion region on the substrate; a channel region on the first diffusion region and extending in a vertical direction relative to the horizontal direction of the extension of the substrate; a second diffusion region on the channel region; and a gate electrode at a sidewall of, and insulated from, the channel region. A horizontal transistor is positioned on the substrate, the horizontal transistor comprising: a first diffusion region and a second diffusion region on the substrate and spaced apart from each other; a channel region on the substrate between the first diffusion region and the second diffusion region; and a gate electrode on the channel region and isolated from the channel region. A portion of a gate electrode of the vertical transistor and a portion of the gate electrode of the horizontal transistor are at a same vertical position in the vertical direction relative to the substrate.

20 Claims, 34 Drawing Sheets

(51) Int. Cl.
  *H01L 21/8238* (2006.01)
  *H01L 27/092* (2006.01)
  *H01L 29/78* (2006.01)

(56) References Cited

U.S. PATENT DOCUMENTS

| | | | |
|---|---|---|---|
| 6,970,372 B1 | 11/2005 | Furukawa et al. | |
| 7,148,522 B2 | 12/2006 | Quek et al. | |
| 7,364,997 B2 | 4/2008 | Juengling | |
| 7,535,016 B2 | 5/2009 | Furukawa et al. | |
| 7,879,660 B2 | 2/2011 | Booth, Jr. et al. | |
| 9,087,922 B2 * | 7/2015 | Sun | H01L 21/823487 |
| 2004/0159853 A1 | 8/2004 | Nemati et al. | |
| 2006/0186483 A1 | 8/2006 | Cho et al. | |
| 2006/0278921 A1 * | 12/2006 | Pellizzer | H01L 27/2454 257/328 |
| 2007/0010078 A1 | 1/2007 | Juengling | |
| 2010/0203695 A1 | 8/2010 | Oh et al. | |
| 2012/0248529 A1 * | 10/2012 | Liu | H01L 21/823487 257/334 |
| 2012/0319201 A1 * | 12/2012 | Sun | H01L 21/823487 257/338 |

FOREIGN PATENT DOCUMENTS

| | | |
|---|---|---|
| JP | 2004096065 | 3/2004 |
| JP | 2004128448 | 4/2004 |
| JP | 2004186197 | 7/2004 |
| JP | 2004349291 | 12/2004 |
| JP | 2007201021 | 8/2007 |
| KR | 100843710 | 6/2008 |
| KR | 1020090107346 | 10/2009 |
| KR | 1020100092239 | 8/2010 |

OTHER PUBLICATIONS

Office Action dated Sep. 29, 2015 in corresponding Chinese Patent Application No. 201210202070.6.
Woo Young Choi, et al., Tunneling Field-Effect Transistors (TFETs) With Subthreshold Swing (SS) Less Than 60 mV/dec, IEEE Electron Device Letters, vol. 28., No. 8 Aug. 2007, pp. 743-745.
Min-Chul Sun, et al., Co-Integration of Nano-Scale Vertical-and Horizontal-Channel MOSFETs for Low Power CMOS Technology, Nano Korea Conference, Aug. 2011.
"Semiconductor Device Having Vertical Device and Non-Vertical Device and Method of Forming the Same" Specification, Drawings, Claims and Prosecution History of U.S. Appl. No. 13/412,760, filed Mar. 6, 2012 by Min-Chul Sun.

* cited by examiner

SEMICONDUCTOR DEVICES HAVING VERTICAL DEVICE AND NON-VERTICAL DEVICE AND METHODS OF FORMING THE SAME

CROSS-REFERENCE TO RELATED APPLICATION

This U.S. non-provisional patent application is a divisional of U.S. patent application Ser. No. 13/412,760, filed Mar. 6, 2012, which claims benefit under 35 U.S.C. §119 to Korean Patent Application No. 10-2011-0058623 filed on Jun. 16, 2011, the disclosure of which is hereby incorporated by reference in its entirety.

BACKGROUND

1. Field

Embodiments of the inventive concepts relate to semiconductor devices having a vertical transistor and a non-vertical transistor and methods of forming the same.

2. Description of Related Art

A vast amount of research has been conducted on various methods for embodying low-power semiconductor devices. With the growing tendency for MOSFETs to have channel lengths of about 100 nm or less, the fabrication of semiconductor devices having both a high driving current and a low off-leakage current has become increasingly difficult due to a phenomenon known in the industry as the short-channel effect. To overcome these limitations, fabrication techniques have been employed whereby devices having different threshold voltages are formed on the same semiconductor substrate by controlling the doping profile of a channel region. However, as the operating voltage of devices becomes about 1 V or lower, the leakage current of a low threshold voltage ($V_T$) device may greatly increase, leading to unreliable and inefficient operation.

SUMMARY

Embodiments of the inventive concepts provide semiconductor devices suitable for increasing integration density and reducing power consumption, and methods of forming the same.

Other embodiments of the inventive concepts provide a static random access memory (SRAM) cell, suitable for increased integration density and reduced power consumption.

Aspects of the inventive concepts are not limited by the above description, and other unmentioned aspects will be clearly understood by one of ordinary skill in the art from example embodiments described herein.

In one aspect, a semiconductor device comprises: a substrate extending in a horizontal direction; a vertical transistor on the substrate, the vertical transistor comprising: a first diffusion region on the substrate; a channel region on the first diffusion region and extending in a vertical direction relative to the horizontal direction of the extension of the substrate; a second diffusion region on the channel region; and a gate electrode at a sidewall of, and insulated from, the channel region; and a horizontal transistor on the substrate, the horizontal transistor comprising: a first diffusion region and a second diffusion region on the substrate and spaced apart from each other; a channel region on the substrate between the first diffusion region and the second diffusion region; and a gate electrode on the channel region and isolated from the channel region; wherein a portion of a gate electrode of the vertical transistor and a portion of the gate electrode of the horizontal transistor are at a same vertical position in the vertical direction relative to the substrate.

In one embodiment, the semiconductor device further comprises a layer of material on the horizontal transistor and the vertical transistor, the gate electrode of the vertical transistor and the gate electrode of the horizontal transistor both in direct contact with the layer of material.

In one embodiment, the layer of material comprises an etch stop layer.

In one embodiment, the layer of material comprises an insulating layer.

In one embodiment, the gate electrode of the vertical transistor and the gate electrode of the horizontal transistor comprise portions of a same layer of material.

In one embodiment, the first diffusion region of the horizontal transistor is contiguous with the first diffusion region of the vertical transistor.

In one embodiment, the first diffusion region of the horizontal transistor that is contiguous with the first diffusion region of the vertical transistor has a lower boundary that is higher in vertical position than a lower boundary of the first diffusion region of the vertical transistor, relative to an upper surface of the substrate.

In one embodiment, the first diffusion region of the horizontal transistor that is contiguous with the first diffusion region of the vertical transistor has a lower boundary that is lower in vertical position than a lower boundary of the first diffusion region of the vertical transistor, relative to an upper surface of the substrate.

In one embodiment, the first diffusion region of the horizontal transistor that is contiguous with the first diffusion region of the vertical transistor has a lower boundary that has a same vertical position as a lower boundary of the first diffusion region of the vertical transistor, relative to an upper surface of the substrate.

In one embodiment, the first diffusion region of the vertical transistor comprises a drain of the vertical transistor; the second diffusion region of the vertical transistor comprises a source of the vertical transistor; the first diffusion region of the horizontal transistor comprises one of a drain and source of the horizontal transistor; the second diffusion region of the horizontal transistor comprises the other of the drain and source of the horizontal transistor.

In one embodiment, the first diffusion region of the vertical transistor and the first diffusion region and second diffusion region of the horizontal transistor lie at a same vertical position relative to the substrate.

In one embodiment, the first diffusion region of the vertical transistor includes a vertical protrusion extending in the vertical direction, and wherein the vertical channel region is on the vertical protrusion.

In one embodiment, the vertical transistor further comprises a silicide region on the second diffusion region.

In one embodiment, the vertical transistor further comprises a metal pattern on the silicide region.

In one embodiment, the second diffusion region of the vertical transistor comprises a silicide region in direct contact with the vertical channel region of the vertical transistor.

In one embodiment, the first diffusion region of the horizontal transistor and the first diffusion region of the vertical transistors both have a silicide region thereon.

In one embodiment, the semiconductor device further comprises an insulating spacer on sidewalls of the gate electrode of the vertical transistor and on sidewalls of the gate electrode of the horizontal transistor.

In one embodiment, the semiconductor device further comprises a silicide region on the gate electrode of the vertical transistor and on the gate electrode of the horizontal transistor.

In one embodiment, the second diffusion region of the vertical transistor has a width in the horizontal direction that is greater than a width of the channel region of the vertical transistor in the horizontal direction.

In one embodiment, the gate electrode of the horizontal transistor has a bottom that is at a position that is lower than a lower boundary of the first and second diffusion regions of the horizontal transistor.

In one embodiment, the semiconductor device further comprises an interlayer via in direct contact with a top of the second diffusion region of the vertical transistor.

In one embodiment, the semiconductor device further comprises a buried oxide layer on the substrate and wherein the vertical transistor and the horizontal transistor are on the buried oxide layer.

In one embodiment, the channel region of the vertical transistor comprises single-crystal material.

In one embodiment, the vertical transistor comprises a first vertical transistor, and further comprising: a second vertical transistor on the substrate, the second vertical transistor comprising: a first diffusion region on the substrate; a channel region on the first diffusion region and extending in a vertical direction relative to the horizontal direction of the extension of the substrate; a second diffusion region on the first vertical channel region; and a gate electrode at a sidewall of, and insulated from, the vertical channel region.

In one embodiment, the first vertical transistor and second vertical transistor comprise an inverter pair.

In one embodiment, the first vertical transistor comprises one of a p-channel and re-channel transistor and wherein the second vertical transistor comprise the other of a p-channel and n-channel transistor.

In one embodiment, the substrate comprises one of a bulk substrate and a silicon-on-insulator (SOI) substrate.

In another aspect, a semiconductor device comprises: a substrate extending in a horizontal direction; a vertical transistor on the substrate, the vertical transistor comprising: a first diffusion region on the substrate; a channel region on the first diffusion region and extending in a vertical direction relative to the horizontal direction of the extension of the substrate; a second diffusion region on the channel region; and a gate electrode at a sidewall of, and insulated from, the channel region; a horizontal transistor on the substrate, the horizontal transistor comprising: a first diffusion region and a second diffusion region on the substrate and spaced apart from each other; a channel region on the substrate between the first diffusion region and the second diffusion region; and a gate electrode on the channel region and isolated from the channel region; and a layer of material on the horizontal transistor and the vertical transistor, the gate electrode of the vertical transistor and the gate electrode of the horizontal transistor both in direct contact with the layer of material.

In one embodiment, the layer of material comprises an etch stop layer

In one embodiment, the layer of material comprises an insulating layer.

In one embodiment, a portion of a gate electrode of the vertical transistor and a portion of the gate electrode of the horizontal transistor are at a same vertical position in the vertical direction relative to the substrate.

In one embodiment, the gate electrode of the vertical transistor and the gate electrode of the horizontal transistor comprise portions of a same layer of material.

In one embodiment, the first diffusion region of the horizontal transistor is contiguous with the first diffusion region of the vertical transistor.

In one embodiment, the first diffusion region of the horizontal transistor that is contiguous with the first diffusion region of the vertical transistor has a lower boundary that is higher in vertical position than a lower boundary of the first diffusion region of the vertical transistor, relative to an upper surface of the substrate.

In one embodiment, the first diffusion region of the horizontal transistor that is contiguous with the first diffusion region of the vertical transistor has a lower boundary that is lower in vertical position than a lower boundary of the first diffusion region of the vertical transistor, relative to an upper surface of the substrate.

In one embodiment, the first diffusion region of the horizontal transistor that is contiguous with the first diffusion region of the vertical transistor has a lower boundary that has a same vertical position as a lower boundary of the first diffusion region of the vertical transistor, relative to an upper surface of the substrate.

In one embodiment, the first diffusion region of the vertical transistor comprises a drain of the vertical transistor; the second diffusion region of the vertical transistor comprises a source of the vertical transistor; the first diffusion region of the horizontal transistor comprises one of a drain and source of the horizontal transistor; the second diffusion region of the horizontal transistor comprises the other of the drain and source of the horizontal transistor.

In one embodiment, the first diffusion region of the vertical transistor and the first diffusion region and second diffusion region of the horizontal transistor lie at a same vertical position relative to the substrate.

In one embodiment, the first diffusion region of the vertical transistor includes a vertical protrusion extending in the vertical direction, and wherein the vertical channel region is on the vertical protrusion.

In one embodiment, the vertical transistor further comprises a silicide region on the second diffusion region.

In one embodiment, the vertical transistor further comprises a metal pattern on the silicide region.

In one embodiment, the second diffusion region of the vertical transistor comprises a silicide region in direct contact with the vertical channel region of the vertical transistor.

In one embodiment, the first diffusion region of the horizontal transistor and the first diffusion region of the vertical transistors both have a silicide region thereon.

In one embodiment, the semiconductor device further comprises an insulating spacer on sidewalls of the gate electrode of the vertical transistor and on sidewalls of the gate electrode of the horizontal transistor.

In one embodiment, the semiconductor device further comprises a silicide region on the gate electrode of the vertical transistor and on the gate electrode of the horizontal transistor.

In one embodiment, the second diffusion region of the vertical transistor has a width in the horizontal direction that is greater than a width of the channel region of the vertical transistor in the horizontal direction.

In one embodiment, the gate electrode of the horizontal transistor has a bottom that is at a position that is lower than a lower boundary of the first and second diffusion regions of the horizontal transistor.

In one embodiment, the semiconductor device further comprises an interlayer via in direct contact with a top of the second diffusion region of the vertical transistor.

In one embodiment, the semiconductor device further comprises a buried oxide layer on the substrate and wherein the vertical transistor and the horizontal transistor are on the buried oxide layer.

In one embodiment, the channel region of the vertical transistor comprises single-crystal material.

In one embodiment, the vertical transistor comprises a first vertical transistor, and further comprising: a second vertical transistor on the substrate, the second vertical transistor comprising: a first diffusion region on the substrate; a channel region on the first diffusion region and extending in a vertical direction relative to the horizontal direction of the extension of the substrate; a second diffusion region on the first vertical channel region; and a gate electrode at a sidewall of, and insulated from, the vertical channel region.

In one embodiment, the first vertical transistor and second vertical transistor comprise an inverter pair.

In one embodiment, the first vertical transistor comprises one of a p-channel and re-channel transistor and wherein the second vertical transistor comprise the other of a p-channel and n-channel transistor.

In one embodiment, the substrate comprises one of a bulk substrate and a silicon-on-insulator (SOI) substrate.

In another aspect, a semiconductor device comprises: a substrate extending in a horizontal direction; a vertical transistor on the substrate, the vertical transistor comprising: a first diffusion region on the substrate; a channel region on the first diffusion region and extending in a vertical direction relative to the horizontal direction of the extension of the substrate; a second diffusion region on the channel region; and a gate electrode at a sidewall of, and insulated from, the channel region; and a horizontal transistor on the substrate, the horizontal transistor comprising: a first diffusion region and a second diffusion region on the substrate and spaced apart from each other; a channel region on the substrate between the first diffusion region and the second diffusion region; and a gate electrode on the channel region and isolated from the channel region, wherein the gate electrode of the vertical transistor and the gate electrode of the horizontal transistor comprise portions of a same layer of material.

In one embodiment, a portion of a gate electrode of the vertical transistor and a portion of the gate electrode of the horizontal transistor are at a same vertical position in the vertical direction relative to the substrate.

In one embodiment, the semiconductor device further comprises a layer of material on the horizontal transistor and the vertical transistor, the gate electrode of the vertical transistor and the gate electrode of the horizontal transistor both in direct contact with the layer of material.

In one embodiment, the layer of material comprises an etch stop layer

In one embodiment, the layer of material comprises an insulating layer

In one embodiment, the first diffusion region of the horizontal transistor is contiguous with the first diffusion region of the vertical transistor.

In one embodiment, the first diffusion region of the horizontal transistor that is contiguous with the first diffusion region of the vertical transistor has a lower boundary that is higher in vertical position than a lower boundary of the first diffusion region of the vertical transistor, relative to an upper surface of the substrate.

In one embodiment, the first diffusion region of the horizontal transistor that is contiguous with the first diffusion region of the vertical transistor has a lower boundary that is lower in vertical position than a lower boundary of the first diffusion region of the vertical transistor, relative to an upper surface of the substrate.

In one embodiment, the first diffusion region of the horizontal transistor that is contiguous with the first diffusion region of the vertical transistor has a lower boundary that has a same vertical position as a lower boundary of the first diffusion region of the vertical transistor, relative to an upper surface of the substrate.

In one embodiment, the first diffusion region of the vertical transistor comprises a drain of the vertical transistor; the second diffusion region of the vertical transistor comprises a source of the vertical transistor; the first diffusion region of the horizontal transistor comprises one of a drain and source of the horizontal transistor; the second diffusion region of the horizontal transistor comprises the other of the drain and source of the horizontal transistor.

In one embodiment, the first diffusion region of the vertical transistor and the first diffusion region and second diffusion region of the horizontal transistor lie at a same vertical position relative to the substrate.

In one embodiment, the first diffusion region of the vertical transistor includes a vertical protrusion extending in the vertical direction, and wherein the vertical channel region is on the vertical protrusion.

In one embodiment, the vertical transistor further comprises a silicide region on the second diffusion region.

In one embodiment, the vertical transistor further comprises a metal pattern on the silicide region.

In one embodiment, the second diffusion region of the vertical transistor comprises a silicide region in direct contact with the vertical channel region of the vertical transistor.

In one embodiment, first diffusion region of the horizontal transistor and the first diffusion region of the vertical transistors both have a silicide region thereon.

In one embodiment, the semiconductor device further comprises an insulating spacer on sidewalls of the gate electrode of the vertical transistor and on sidewalls of the gate electrode of the horizontal transistor.

In one embodiment, the semiconductor device further comprises a silicide region on the gate electrode of the vertical transistor and on the gate electrode of the horizontal transistor.

In one embodiment, the second diffusion region of the vertical transistor has a width in the horizontal direction that is greater than a width of the channel region of the vertical transistor in the horizontal direction.

In one embodiment, the gate electrode of the horizontal transistor has a bottom that is at a position that is lower than a lower boundary of the first and second diffusion regions of the horizontal transistor.

In one embodiment, the semiconductor device further comprises an interlayer via in direct contact with a top of the second diffusion region of the vertical transistor.

In one embodiment, the semiconductor device further comprises a buried oxide layer on the substrate and wherein the vertical transistor and the horizontal transistor are on the buried oxide layer.

In one embodiment, the channel region of the vertical transistor comprises single-crystal material.

In one embodiment, the vertical transistor comprises a first vertical transistor, and further comprising: a second vertical transistor on the substrate, the second vertical transistor comprising: a first diffusion region on the substrate; a channel region on the first diffusion region and extending in a vertical direction relative to the horizontal direction of the extension of the substrate; a second diffusion region on the first vertical channel region; and a gate electrode at a sidewall of, and insulated from, the vertical channel region.

In one embodiment, the first vertical transistor and second vertical transistor comprise an inverter pair.

In one embodiment, the first vertical transistor comprises one of a p-channel and re-channel transistor and wherein the second vertical transistor comprise the other of a p-channel and n-channel transistor.

In one embodiment, the substrate comprises one of a bulk substrate and a silicon-on-insulator (SOI) substrate.

In another aspect, a memory cell of a memory device comprises: a first pull-up transistor and a first pull-down transistor coupled at a first node and connected in series between a first voltage source and a second voltage source, gates of the first pull-up transistor and the first pull-down transistor coupled at a second node; a first access transistor coupled between the first node and a first bit line of the memory device, a gate of the first access transistor coupled to a word line of the memory device; a second pull-up transistor and a second pull-down transistor coupled at the second node and connected in series between the first voltage source and the second voltage source, gates of the second pull-up transistor and the second pull-down transistor coupled to the first node; a second access transistor coupled between the second node and a second bit line of the memory device, a gate of the second access transistor coupled to the word line of the memory device; wherein the first pull-up transistor, the first pull-down transistor, the second pull-up transistor and the second pull-down transistor each comprise vertical channel transistors having channel regions that extend in a vertical direction relative to a substrate of the memory device, and each comprise gate electrodes at sidewalls of the vertically extending channel regions; wherein the first access transistor and the second access transistor each comprise horizontal channel transistors having channel regions that extend in a horizontal direction of the substrate, and each comprise gate electrodes on the channel regions; and wherein the gate electrodes of the first pull-up transistor, the first pull-down transistor, the second pull-up transistor and the second pull-down transistor and the gate electrodes of the first access transistor and the second access transistor comprise portions of a same layer of material.

In one embodiment, the vertical channel transistors each comprise: a first diffusion region on the substrate; the channel region on the first diffusion region and extending in the vertical direction relative to the horizontal direction of extension of the substrate; a second diffusion region on the channel region; and the gate electrode at a sidewall of, and insulated from, the channel region; and wherein the horizontal channel transistors each comprise: a first diffusion region and a second diffusion region on the substrate and spaced apart from each other; the channel region on the substrate between the first diffusion region and the second diffusion region; and the gate electrode on the channel region and isolated from the channel region.

In one embodiment, the first diffusion region of each of the horizontal channel transistors is contiguous with the first diffusion region of one of the vertical channel transistors.

In one embodiment, the first diffusion region of each of the horizontal transistors that is contiguous with the first diffusion region of one of the vertical transistors has a lower boundary that is higher in vertical position than a lower boundary of the first diffusion region of the vertical transistor, relative to an upper surface of the substrate.

In one embodiment, the first diffusion region of each of the horizontal transistors that is contiguous with the first diffusion region of one of the vertical transistors has a lower boundary that is lower in vertical position than a lower boundary of the first diffusion region of the vertical transistor, relative to an upper surface of the substrate.

In one embodiment, the first diffusion region of each of the horizontal transistors that is contiguous with the first diffusion region of one of the vertical transistors has a lower boundary that has a same vertical position as a lower boundary of the first diffusion region of the vertical transistor, relative to an upper surface of the substrate.

In one embodiment, the first diffusion region of each vertical transistor comprises a drain of the vertical transistor; the second diffusion region of each vertical transistor comprises a source of the vertical transistor; the first diffusion region of each horizontal transistor comprises one of a drain and source of the horizontal transistor; the second diffusion region of each horizontal transistor comprises the other of the drain and source of the horizontal transistor.

In one embodiment, the first diffusion region of the vertical transistors and the first diffusion region and second diffusion regions of the horizontal transistors lie at a same vertical position relative to the substrate.

In one embodiment, the first diffusion regions of the vertical transistors each includes a vertical protrusion extending in the vertical direction, and wherein the vertical channel region is on the vertical protrusion.

In one embodiment, the vertical transistors each further comprise a silicide region on the second diffusion region.

In one embodiment, the vertical transistors each further comprise a metal pattern on the silicide region.

In one embodiment, the second diffusion region of each vertical transistor comprises a silicide region in direct contact with the vertical channel region of the vertical transistor.

In one embodiment, the first diffusion region of the horizontal transistors and the first diffusion region of the vertical transistors both have a silicide region thereon.

In one embodiment, the second diffusion region of the vertical transistors has a width in the horizontal direction that is greater than a width of the channel region of the vertical transistors in the horizontal direction.

In one embodiment, the gate electrodes of the horizontal transistors have a bottom that is at a position that is lower than a lower boundary of the first and second diffusion regions of the horizontal transistors.

In one embodiment, the memory cell further comprises an interlayer via in direct contact with a top of the second diffusion region of the vertical transistors.

In one embodiment, a portion of the gate electrodes of the first pull-up transistor, the first pull-down transistor, the second pull-up transistor and the second pull-down transistor and a portion of the gate electrodes of the first access transistor and the second access transistor are at a same vertical position in the vertical direction relative to the substrate.

In one embodiment, the memory cell further comprises a layer of material on the horizontal transistor and the vertical transistor, the gate electrodes of the first pull-up transistor, the first pull-down transistor, the second pull-up transistor and the second pull-down transistor and the gate electrodes of the first access transistor and the second access transistor both in direct contact with the layer of material.

In one embodiment, the layer of material comprises an etch stop layer.

In one embodiment, the layer of material comprises an insulating layer

In one embodiment, the memory cell further comprises a buried oxide layer on the substrate and wherein the vertical transistor and the horizontal transistor are on the buried oxide layer.

In one embodiment, the channel region of the vertical transistor comprises single-crystal material.

In one embodiment, the substrate comprises one of a bulk substrate and a silicon-on-insulator (SOI) substrate.

In another aspect, a method of forming a semiconductor device comprising: forming a first diffusion region on a substrate; forming a channel region for a vertical transistor on the first diffusion region that extends in a vertical direction relative to the substrate; and providing a vertical transistor gate electrode at sidewalls of the vertical transistor channel region and simultaneously providing a horizontal transistor gate electrode on the substrate at a position that is spaced apart from the vertical transistor.

In one embodiment, forming the channel region for the vertical transistor comprises: forming a first well in the substrate; forming the first diffusion region in a portion of the first well by doping the first diffusion region with a doping element of a first polarity; epitaxially growing a first channel layer on the first diffusion region; doping an upper portion of the first channel layer with a doping element of a second polarity; patterning the first channel layer to form the channel region for the vertical transistor, the channel region extending between the first diffusion region and a second diffusion region comprising the patterned upper portion of the first channel layer.

In one embodiment, providing a vertical transistor gate electrode at sidewalls of the vertical transistor channel region and simultaneously providing a horizontal transistor gate electrode on the substrate at a position that is spaced apart from the vertical transistor comprises: providing a gate insulating layer on the channel region of the vertical transistor and on the first well; providing a gate electrode layer on the gate insulating layer; patterning the gate electrode layer to form the vertical transistor gate electrode and to form the horizontal transistor gate electrode on a portion of the first well spaced apart from the first diffusion region In one embodiment, the method further comprises forming a third diffusion region and a fourth diffusion region for a horizontal transistor in the substrate at sidewalls of the horizontal transistor gate electrode.

In one embodiment, the fourth diffusion region of the horizontal transistor is contiguous with the first diffusion region of the vertical transistor.

In one embodiment, providing the vertical transistor gate electrode and simultaneously providing a horizontal gate electrode comprises: providing a gate insulating layer on sidewalls of the vertical transistor channel region and on the substrate; providing a gate electrode layer to cover the gate insulating layer; patterning the gate electrode layer to form the vertical transistor gate electrode and simultaneously form the horizontal gate electrode.

In one embodiment, the method further comprises: forming a second diffusion region on the vertical transistor channel region; fainting a third diffusion region in the substrate at a side of the horizontal gate electrode opposite the vertical transistor channel region; forming a fourth diffusion region in the substrate at a side of the horizontal gate electrode opposite the third diffusion region, wherein the fourth diffusion region and the first diffusion region are contiguous with each other.

In one embodiment, the method further comprises forming a layer of material on and in direct contact with the gate electrode of the vertical transistor and the gate electrode of the horizontal transistor.

In another aspect, a method of forming a semiconductor device comprises: epitaxially forming an epitaxial layer of material on a substrate including a first region of amorphous material and a second region of single-crystal material; and etching the epitaxial layer of material to form a channel region for a vertical transistor on the second region, the channel region extending in a vertical direction relative to the substrate.

In one embodiment, the first region of amorphous material comprises an insulating structure present in the substrate.

In one embodiment, the method further comprises: forming a first diffusion region on the substrate at a position that is below the channel region of the vertical transistor, prior to formation of the channel region of the vertical transistor; forming a second diffusion region on the channel region of the vertical transistor.

In one embodiment, the method further comprises: providing a vertical transistor gate electrode at sidewalls of the vertical transistor channel region and simultaneously providing a horizontal transistor gate electrode on the substrate at a position that is spaced apart from the vertical transistor.

In another aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises: a substrate extending in a horizontal direction; a vertical transistor on the substrate, the vertical transistor comprising: a first diffusion region on the substrate; a channel region on the first diffusion region and extending in a vertical direction relative to the horizontal direction of the extension of the substrate; a second diffusion region on the channel region; and a gate electrode at a sidewall of, and insulated from, the channel region; and a horizontal transistor on the substrate, the horizontal transistor comprising: a first diffusion region and a second diffusion region on the substrate and spaced apart from each other; a channel region on the substrate between the first diffusion region and the second diffusion region; and a gate electrode on the channel region and isolated from the channel region; wherein a portion of a gate electrode of the vertical transistor and a portion of the gate electrode of the horizontal transistor are at a same vertical position in the vertical direction relative to the substrate.

In accordance with an aspect of the inventive concepts, a semiconductor device includes a first vertical transistor and a non-vertical transistor disposed on a substrate. The first vertical transistor includes a first drain region disposed on the substrate, a first vertical channel region protruding from the first drain region, a first source region disposed on the first vertical channel region, and a first gate electrode covering sidewalls of the first vertical channel region. The non-vertical transistor includes a channel region disposed on the substrate, a second gate electrode disposed on the channel region, and a non-vertical drain region and a non-vertical source region disposed adjacent to both sides of the second gate electrode. The first drain region, the non-vertical drain region, and the non-vertical source region are disposed at the same level. One of the non-vertical drain region and the non-vertical source region is in continuity with the first drain region.

In one embodiment, the first drain region, the channel region, the non-vertical drain region, and the non-vertical source region may include a single-crystalline semiconductor.

In one embodiment, the first vertical channel region may have a fin structure, a pillar structure, or a wire structure.

In one embodiment, the first drain region may include a protrusion, which may be aligned with the first vertical channel region. The first vertical channel region may have a horizontal width smaller than a vertical height.

In one embodiment, the first vertical channel region may have a first horizontal width, the first source region may have a second horizontal width, and the first horizontal width may be smaller than the second horizontal width.

In one embodiment, the first source region may include a metal silicide pattern. The metal silicide pattern may be in contact with the first vertical channel region.

In one embodiment, the non-vertical transistor may include a planar transistor or a recess channel transistor. A bottom of the second gate electrode may be at a lower level than the non-vertical drain region and the non-vertical source region. A top of the second gate electrode may be at a lower level than top surfaces of the non-vertical drain region and the non-vertical source region.

In one embodiment, the first and second gate electrodes may include the same material layers formed at the same time.

In one embodiment, the semiconductor device may further include an isolation layer disposed adjacent to the first vertical transistor and the non-vertical transistor. Top surfaces of the first drain region, the non-vertical drain region, and the non-vertical source region may be at a lower level than a top surface of the isolation layer.

In one embodiment, the semiconductor device may further include a first gate dielectric layer interposed between the first vertical channel region and the first gate electrode and a second gate dielectric layer interposed between the channel region and the second gate electrode. The first and second gate dielectric layers may include the same material layers formed at the same time.

In one embodiment, the semiconductor device may further include a second vertical transistor disposed on the substrate. The second vertical transistor may include a second drain region disposed on the substrate, a second vertical channel region protruding from the second drain region, a second source region disposed on the second vertical channel region, and a third gate electrode covering sidewalls of the second vertical channel region. The second drain region is connected to the first drain region. The second vertical channel region may have a different conductivity type from the first vertical channel region.

In accordance with another aspect of the inventive concept, a semiconductor device includes a buried oxide layer disposed on a substrate. A first vertical transistor, a non-vertical transistor, and a second vertical transistor are disposed on the buried oxide layer. The first vertical transistor includes an n-drain region disposed on the buried oxide layer, a p-vertical channel region disposed on the n-drain region, an n-source region disposed on the p-vertical channel region, and a first gate electrode covering sidewalls of the p-vertical channel region. The non-vertical transistor includes a channel region disposed on the buried oxide layer, a second gate electrode disposed on the channel region, and a non-vertical drain region and a non-vertical source region disposed adjacent to both sides of the second gate electrode. The second vertical transistor includes a p-drain region disposed on the buried oxide layer, an n-vertical channel region disposed on the p-drain region, a p-source region disposed on the n-vertical channel region, and a third gate electrode covering sidewalls of the n-vertical channel region. The n-drain region, the p-drain region, the non-vertical drain region, and the non-vertical source region are disposed at the same level. One of the non-vertical drain region and the non-vertical source region is in continuity with the n-drain region. The p-drain region is in contact with at least one of the n-drain region, the non-vertical drain region, and the non-vertical source region.

In one embodiment, each of the p-vertical channel region and the n-vertical channel region may have a fin structure, a pillar structure, or a wire structure.

In one embodiment, the n-drain region may include a first protrusion, which may be aligned with the p-vertical channel region. The p-drain region may include a second protrusion, which may be aligned with the n-vertical channel region.

In one embodiment, the n-source region may include a first metal silicide pattern, and the p-source region may include a second metal silicide pattern. The first metal silicide pattern may be in contact with the p-vertical channel region, and the second metal silicide pattern may be in contact with the n-vertical channel region.

In one embodiment, the semiconductor device may further include a first gate dielectric layer interposed between the p-vertical channel region and the first gate electrode, a second gate dielectric layer interposed between the channel region and the second gate electrode, and a third gate dielectric layer interposed between the n-vertical channel region and the third gate electrode. The first, second, and third gate dielectric layers may include the same material layers formed at the same time.

In accordance with another aspect of the inventive concept, a static random access memory (SRAM) cell includes first and second pull-up transistors disposed on a substrate, A first pull-down transistor is connected to the first pull-up transistor, and a second pull-down transistor is connected to the second pull-up transistor. A first access transistor is connected to a first bit line disposed on the substrate, and a second access transistor is connected to a second bit line disposed on the substrate. The first access transistor is connected between the first pull-up transistor and the first pull-down transistor, and the second access transistor is connected between the second pull-up transistor and the second pull-down transistor. Herein, the first pull-down transistor is a first vertical transistor, and the first access transistor is a non-vertical transistor. The first vertical transistor includes an n-drain region, a p-vertical channel region, an n-source region, and a first gate electrode disposed on the substrate. The non-vertical transistor includes a channel region, a second gate electrode, a non-vertical drain region, and a non-vertical source region disposed on the substrate. The n-drain region, the non-vertical drain region, and the non-vertical source region are disposed at the same level. One of the non-vertical drain region and the non-vertical source region is in continuity with the n-drain region.

In one embodiment, the first pull-up transistor may be a second vertical transistor. The second vertical transistor includes a p-drain region disposed on the substrate, an n-vertical channel region protruding from the p-drain region, a p-source region disposed on the n-vertical channel region, and a third gate electrode covering sidewalls of the n-vertical channel region. The p-drain region may be connected to the n-drain region.

In accordance with another aspect of the inventive concept, an SRAM includes a buried oxide layer disposed on a substrate. First and second pull-up transistors are disposed on the buried oxide layer. A first pull-down transistor is connected to the first pull-up transistor, and a second pull-down transistor is connected to the second pull-up transistor. A first access transistor is connected to a first bit line disposed on the substrate, and a second access transistor is connected to a second bit line disposed on the substrate. Herein, the first access transistor is connected between the first pull-up transistor and the first pull-down transistor, and the second access transistor is connected between the second pull-up transistor and the second pull-down transistor. The first pull-down transistor is a first vertical transistor, the first access transistor is a non-vertical transistor, and the first pull-up transistor is a second vertical transistor. The first vertical transistor includes an n-drain region, a p-vertical channel region, an n-source region, and a first gate electrode disposed on the buried oxide layer. The non-vertical transistor includes a channel region, a second gate electrode, a non-vertical drain region, and a non-vertical source region disposed on the buried oxide layer. The second vertical transistor includes a p-drain region, an n-vertical channel region, a p-source region, and a third gate electrode disposed on the buried oxide layer. The n-drain region, the p-drain region, the non-vertical drain region, and the non-vertical source region are disposed at the same level. One of the non-vertical drain region and the non-vertical source region is in continuity with the n-drain region, and the p-drain region is in contact with at least one of the n-drain region, the non-vertical drain region, and the non-vertical source region.

In accordance with another aspect of the inventive concept, a method of forming a semiconductor device includes forming a first vertical transistor on a substrate. The first vertical transistor includes a first drain region disposed on a substrate, a first vertical channel region protruding from the first drain region, a first source region disposed on the first vertical channel region, and a first gate electrode covering sidewalls of the first vertical channel region. A non-vertical transistor is formed on the substrate. The non-vertical transistor includes a channel region disposed on the substrate, a second gate electrode disposed on the channel region, and a non-vertical drain region and a non-vertical source region disposed adjacent to both sides of the second gate electrode. The formation of the first vertical transistor and the non-vertical transistor includes forming a semiconductor layer on the substrate using an epitaxial growth technique and forming the first vertical channel region and the channel region by patterning the semiconductor layer and the substrate. One of the non-vertical drain region and the non-vertical source region is in continuity with the first drain region.

In one embodiment, the first drain region, the non-vertical drain region, and the non-vertical source region may be formed at the same level.

In one embodiment, the method may further include forming an isolation layer adjacent to the first vertical transistor and the non-vertical transistor. Top surfaces of the first drain region, the non-vertical drain region, and the non-vertical source region may be formed at a lower level than a top surface of the isolation layer.

In one embodiment, the first drain region may include a protrusion, which may be aligned with the first vertical channel region.

In one embodiment, the first vertical channel region may have a fin structure, a pillar structure, or a wire structure.

In one embodiment, the method may further include forming a first gate dielectric layer between the first vertical channel region and the first gate electrode and forming a second gate dielectric layer between the channel region and the second gate electrode. The first and second gate dielectric layers may include the same material layers formed at the same time.

In one embodiment, the method may further include forming a second vertical transistor on the substrate. The second vertical transistor may include a second drain region disposed on the substrate, a second vertical channel region protruding from the second drain region, a second source region disposed on the second vertical channel region, and a third gate electrode covering sidewalls of the second vertical channel region. The second vertical channel region may have a different conductivity type from the first vertical channel region, and the second drain region may be connected to the first drain region.

In accordance with another aspect of the inventive concept, a method of forming a semiconductor device includes forming a buried oxide layer on a substrate. A first vertical transistor is formed on the buried oxide layer. The first vertical transistor includes an n-drain region disposed on the buried oxide layer, a p-vertical channel region disposed on the n-drain region, an n-source region disposed on the p-vertical channel region, and a first gate electrode covering sidewalls of the p-vertical channel region. A non-vertical transistor is formed on the buried oxide layer. The non-vertical transistor includes a channel region disposed on the buried oxide layer, a second gate electrode disposed on the channel region, and a non-vertical drain region and a non-vertical source region disposed adjacent to both sides of the second gate electrode. The second vertical transistor is formed on the buried oxide layer. The second vertical transistor includes a p-drain region disposed on the buried oxide layer, an n-vertical channel region disposed on the p-drain region, a p-source region disposed on the n-vertical channel region, and a third gate electrode covering sidewalls of the n-vertical channel region. The formation of the first vertical transistor, the non-vertical transistor, and the second vertical transistor includes forming a semiconductor layer on the substrate using an epitaxial growth technique and forming the p-vertical channel region, the channel region, and the n-vertical channel region by patterning the semiconductor layer and the substrate. One of the non-vertical drain region and the non-vertical source region is in continuity with the n-drain region. The p-drain region is in contact with at least one of the n-drain region, the non-vertical drain region, and the non-vertical source region.

In one embodiment, the n-drain region, the p-drain region, the non-vertical drain region, and the non-vertical source region may be formed at the same level.

In one embodiment, the method may further include forming an isolation layer on the buried oxide layer to define the n-drain region, the p-drain region, the channel region, the non-vertical drain region, and the non-vertical source region. Top surfaces of the n-drain region, the p-drain region, the channel region, the non-vertical drain region, and the non-vertical source region may be formed at a lower level than a top surface of the isolation layer.

In one embodiment, the n-drain region may include a first protrusion, which may be aligned with the p-vertical channel region, and the p-drain region may include a second protrusion, which may be aligned with the n-vertical channel region.

In one embodiment, the method may further include forming a first gate dielectric layer between the p-vertical channel region and the first gate electrode, forming a second gate dielectric layer between the channel region and the second gate electrode, and forming a third gate dielectric layer between the n-vertical channel region and the third gate electrode. The first, second, and third gate dielectric layers may include the same material layers formed at the same time.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EMBODIMENTS

Figure 1:
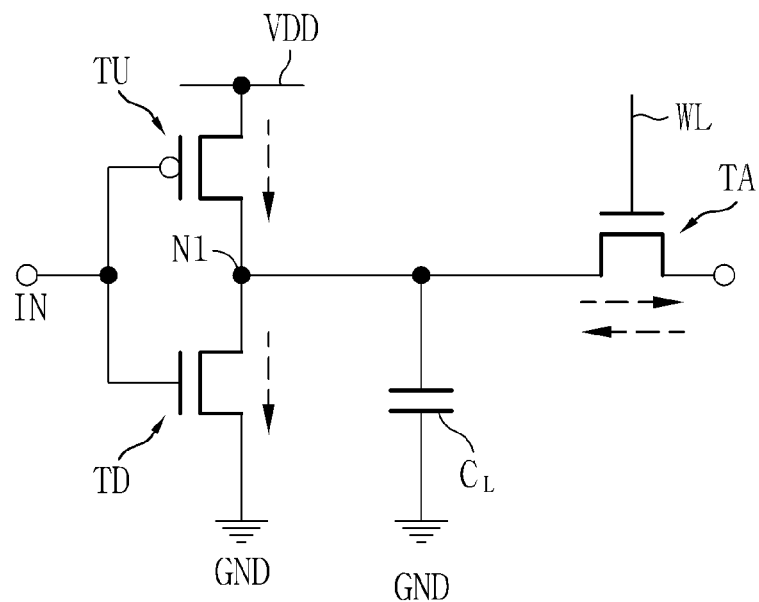
FIG. 1 is an equivalent circuit diagram of an electronic circuit including a complementary-metal-oxide-semiconductor (CMOS) inverter according to embodiments of the inventive concept.

Various example embodiments will now be described more fully with reference to the accompanying drawings in which some example embodiments are shown. The inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art. In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present invention.

Spatially relative terms, such as "top end," "bottom end," "top surface," "bottom surface," "above," "below" and the like, may be used herein for ease of description to describe one element or feature's relationship to another element(s) or feature(s) as illustrated in the figures. It will be understood that the spatially relative tennis are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiment 1

In an ultrathin body (UTB) SOI device or in a nanowire device, which are expected to be applied in the future to sub-20 nm devices, since the dopant of a channel region has little effect on the threshold voltage $V_T$ of the resulting device, such devices still do not solve the problem of heightened leakage current. Further, the approach of controlling the threshold voltages of devices by varying channel length is limited in viability since threshold voltage can be controlled only within a limited range and such variation in channel length is unsatisfactory in terms of integration density.

To obtain a low-power, high-speed circuit, the present inventive concepts provide semiconductor devices and methods of fabrication embodying multiple-threshold-voltage $V_T$ structures which have relative low leakage current characteristics.

Figure 2:
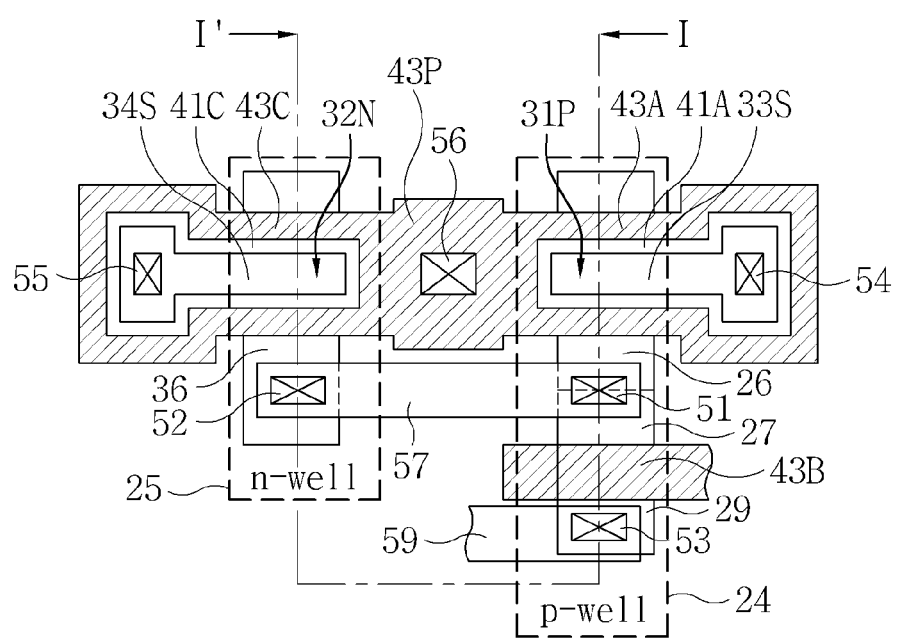
FIG. 2 is a layout illustrating a semiconductor device according to a first embodiment of the inventive concept.

FIG. 1 is an equivalent circuit diagram of an electronic circuit including a complementary-metal-oxide-semiconductor (CMOS) inverter according to embodiments of the inventive concept. FIG. 2 is a layout illustrating a semiconductor device according to a first embodiment of the inventive concept. FIGS. 3A through 3H are cross-sectional views taken along line I-I' of FIG. 2, illustrating the semiconductor device of FIG. 2.

Referring to FIG. 1, a pull-up transistor TU, a pull-down transistor TD, and an access transistor TA may be provided. In an embodiment, the pull-up transistor TU may be a PMOS transistor, and the pull-down transistor TD and the access transistor TA may be NMOS transistors. The pull-up transistor TU and the pull-down transistor TD may be connected to each other and constitute a CMOS inverter. A source electrode of the pull-up transistor TU may be connected to a power source VDD, and a source electrode of the pull-down transistor TD may be connected to a ground GND. Gate electrodes of the pull-up transistor TU and the pull-down transistor TD may be connected to each other. Drain electrodes of the pull-up transistor TU and the pull-down transistor TD may be connected to each other and constitute a node N1. A selected one of source and drain electrodes of the access transistor TA may be connected to the node N1. A load capacitor $C_L$ may be provided between the node N1 and the ground GND. A gate electrode of the access transistor TA may be connected to a word line WL.

Each arrow (→) of FIG. 1 refers to a direction in which current flows. As shown in FIG. 1, current may flow through the pull-up transistor TU and the pull-down transistor TD in one direction, or uni-directionally, while current may flow through the access transistor TA in both, opposed directions, or bi-directionally. In an optimized configuration, the pull-up transistor TU and the pull-down transistor TD may require a low-leakage current characteristic, and the access transistor TA may require a high driving current characteristic. To facilitate formation of low-power devices, the pull-up transistor TU and the pull-down transistor TD may be formed to have a lower threshold voltage $V_T$ than the access transistor TA.

Figure 3A:
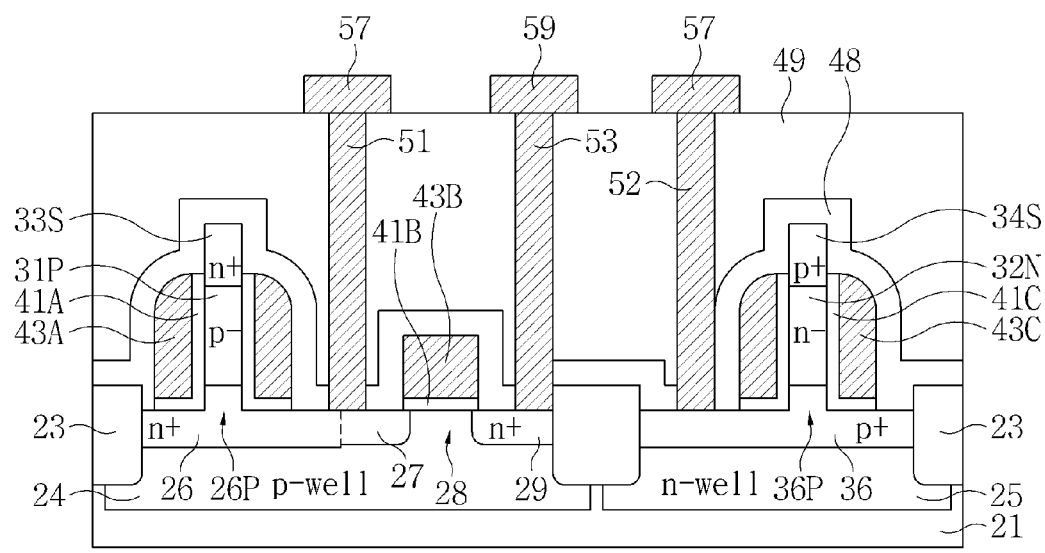
FIGS. 3A through 3H are cross-sectional views taken along line I-I' of FIG. 2, illustrating the semiconductor device of FIG. 2.

Referring to FIGS. 2 and 3A, a p-well 24, an n-well 25, and an isolation layer 23 may be formed in a semiconductor substrate 21. An n-drain region 26, a first source/drain region 27, and a second source/drain region 29 may be formed on the p-well 24. A p-vertical channel region 31P and an n-source region 33S may be formed on the n-drain region 26. The n-drain region 26 may include an n-protrusion 26P. The n-protrusion 26P may be disposed under the p-vertical channel region 31P, and the n-protrusion 26P may have sidewalls that are aligned with sidewalls of the p-vertical channel region 31P. A first gate electrode 43A may be formed on sidewalls of the p-vertical channel region 31P. A first gate dielectric layer 41A may be interposed between the first gate electrode 43A and the p-vertical channel region 31P and between the first gate electrode 43A and the n-drain region 26 and n-protrusion 26P.

A channel region 28 may be defined between the first source/drain region 27 and the second source/drain region 29. A second gate electrode 43B may be formed on the channel region 28. A second gate dielectric layer 41B may be interposed between the second gate electrode 43B and the channel region 28.

A p-drain region 36 may be formed on the n-well 25. An n-vertical channel region 32N and a p-source region 34S may be formed on the p-drain region 36. The p-drain region 36 may include a p-protrusion 36P. The p-protrusion 36P may be disposed under the n-vertical channel region 32N, and the p-protrusion 36P may have sidewalls that are aligned with the n-vertical channel region 32N. A third gate electrode 43C may be formed on sidewalls of the n-vertical channel region 32N. A third gate dielectric layer 41C may be interposed between the third gate electrode 43C and the n-vertical channel region 32N, and between the third gate electrode 43C and the p-drain region 36 and p-protrusion 26P.

A gate pad 43P may be formed on the isolation layer 23. The first and third gate electrodes 43A and 43C may be connected to the gate pad 43P. The gate pad 43P, the first gate electrode 43A, and the third gate electrode 43C may have an integral structure. An etch stop layer 48 may be formed to cover the entire surface of the semiconductor substrate 21. The etch stop layer 48 may function as a stress-inducing layer. An interlayer insulating layer 49 may be formed on the etch stop layer 48.

A first plug 51, a second plug 52, a third plug 53, a fourth plug 54, a fifth plug 55, and a sixth plug 56 may be formed through the interlayer insulating layer 49 and the etch stop layer 48. First and second interconnection lines 57 and 59 may be formed on the interlayer insulating layer 49. The first plug 51 may be connected to at least one of the n-drain region 26 and the first source/drain region 27. The second plug 52 may be connected to the p-drain region 36. The first interconnection line 57 may be in contact with the first and second plugs 51 and 52. The second interconnection line 59 may be in contact with the third plug 53. The third plug 53 may be connected to the second source/drain region 29. The fourth plug 54 may be connected to the n-source region 33S. The fifth plug 55 may be connected to the p-source region 34S. The sixth plug 56 may be connected to the gate pad 43P.

Figure 3B:
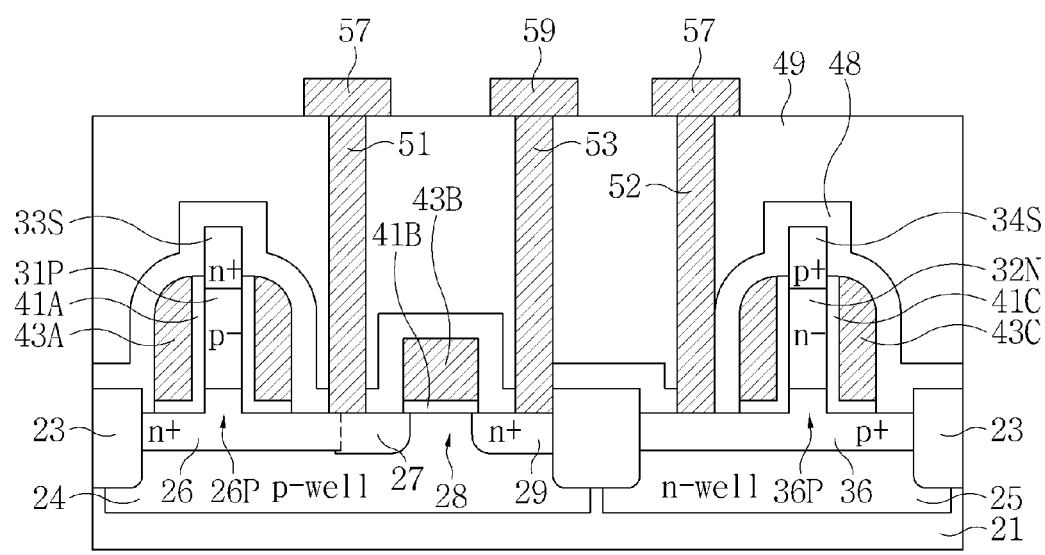
Figure 3C:
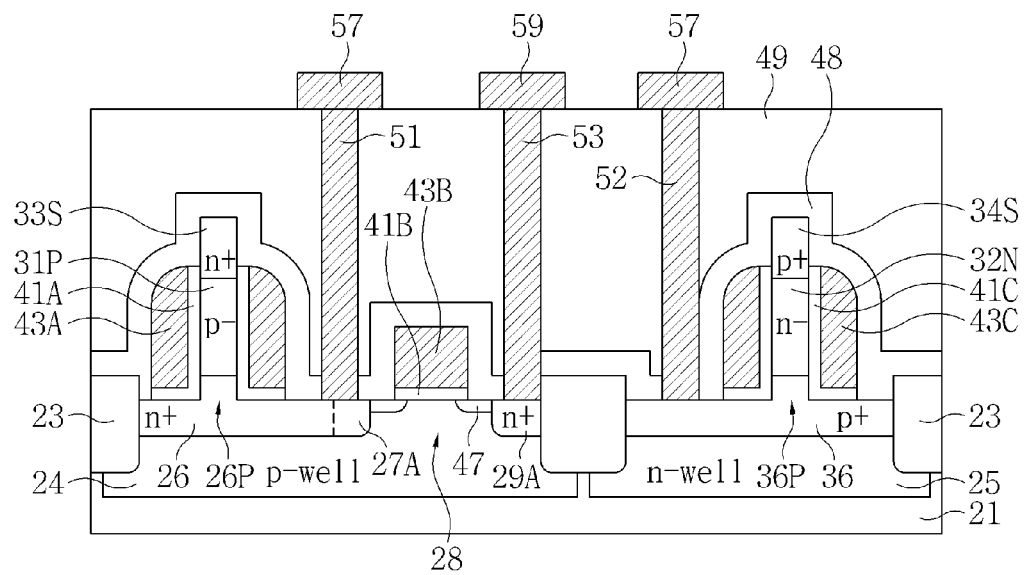

The n-drain region 26, the first source/drain region 27, the second source/drain region 29, the channel region 28, and the p-drain region 36 may be formed at the same level relative to the substrate 21. Top surfaces of the n-drain region 26, the first source/drain region 27, the second source/drain region 29, the channel region 28, and the p-drain region 36 may be formed at a lower level than a top surface of the isolation layer 23. The first source/drain region 27 may be in continuity with the n-drain region 26. Furthermore, the first source/drain region 27 and the n-drain region 26 may have an integral structure or otherwise be contiguous with each other. The n-drain region 26 and the first source/drain region 27 may include a single-crystalline semiconductor material containing n-type impurities. Bottoms of the first source/drain region 27 and the second source/drain region 29 at a higher level than a bottom of the n-drain region 26 as shown in FIG. 3A, or may optionally be formed at a lower level than a bottom of the n-drain region 26, as shown in FIG. 3B, or may optionally be formed at a same level as a bottom of the n-drain region 26, as shown in FIG. 3C.

Each of the p-vertical channel region 31P and the n-vertical channel region 32N may have a fin structure, a pillar structure, or a wire structure. A horizontal width of the p-vertical channel region 31P may be less than a vertical height thereof. A horizontal width of the n-vertical channel region 32N may be less than a vertical height thereof. In some embodiments, the p-vertical channel region 31P may vertically protrude over the n-drain region 26, and the n-vertical channel region 32N may vertically protrude over the p-drain region 36. In some embodiments, each of the p-vertical channel region 31P and the n-vertical channel region 32N may include a single-crystalline semiconductor material formed using an epitaxial growth technique. In some embodiments, each of horizontal widths of the p-vertical channel region 31P and the n-vertical channel region 32N may be 20 nm or less.

The n-source region 33S may be disposed on and aligned with the p-vertical channel region 31P and contact the p-vertical channel region 31P. The p-source region 34S may be disposed on and aligned with the n-vertical channel region 32N and contact the n-vertical channel region 32N. In some embodiments, each of the n-source region 33S and the p-source region 34S may include a single-crystalline semiconductor material formed using an epitaxial growth technique.

In some embodiments, the first, second, and third gate dielectric layers 41A, 41B, and 41C may include the same material layers formed at the same time. The first through third gate dielectric layers 41A, 41B, and 41C may have substantially the same thickness. The first through third gate dielectric layers 41A, 41B, and 41C may include a silicon oxide layer, a silicon nitride layer, a silicon oxynitride layer, a high-k dielectric layer, or a combination layer thereof.

The first gate electrode 43A may cover both opposite sidewalls of the p-vertical channel region 31P. The third gate electrode 43C may cover both opposite sidewalls of the n-vertical channel region 32N. The first, second, and third gate electrodes 43A, 43B, and 43C may include the same material layers that are formed at the same time. In various embodiments, the first through third gate electrodes 43A, 43B, and 43C may include a conductive layer, such as a metal layer, a metal nitride layer, a metal silicide layer, a polysilicon (poly-Si) layer, or a combination layer thereof, or other suitable conductive material layers.

Referring back to FIGS. 1, 2, and 3A, the n-drain region 26, the p-vertical channel region 31P, the n-source region 33S, the first gate dielectric layer 41A, and the first gate electrode 43A may correspond to the pull-down transistor TD. In this case, the pull-down transistor TD may be referred to as a first vertical transistor. The fourth plug 54 may be connected to the ground GND.

The p-drain region 36, the n-vertical channel region 32N, the p-source region 34S, the third gate dielectric layer 41C, and the third gate electrode 43C may correspond to the pull-up transistor TU. The pull-up transistor TU may be referred to as a second vertical transistor. The fifth plug 55 may be connected to the power source VDD.

The first source/drain region 27, the second source/drain region 29, the channel region 28, the second gate dielectric layer 41B, and the second gate electrode 43B may correspond to the access transistor TA. The access transistor TA may be referred to as a planar transistor. The planar transistor may be categorized as a non-vertical or horizontal transistor. In this case, the first source/drain region 27 may be referred to as a non-vertical drain region, while the second source/drain region 29 may be referred to as a non-vertical source region. In another case, the first source/drain region 27 may be referred to as a non-vertical source region, while the second source/drain region 29 may be referred to as a non-vertical drain region.

The n-drain region 26, the first plug 51, the first interconnection line 57, the second plug 52, the p-drain region 36, and the first source/drain region 27 may constitute the node N1. As described above, the first source/drain region 27 may be in continuity with, or contiguous with, the n-drain region 26. Thus, an electrical resistance of the node N1 may be greatly reduced. Furthermore, the sizes of the first source/drain region 27 and the n-drain region 26 may be minimized. That is, a structure in which the first source/drain region 27 and the n-drain region 26 are in continuity with each other at the same level may be highly advantageous to highly integrated semiconductor devices.

Also, it can be seen in the present embodiments of FIGS. 3A, 3B, and 3B that a portion of the gate electrode 43A of the first vertical transistor and a portion of the gate electrode 43B of the horizontal transistor are at a same vertical position in the vertical direction relative to the substrate 21.

Also, in the present embodiments, the gate electrode 43A of the first vertical transistor and the gate electrode 43B of the horizontal transistor are formed from the same layer of material. This simplifies the number of process steps required for fabricating the resulting device.

The first and second vertical transistors may have a lower threshold voltage than the planar transistor. That is, a semiconductor device having various threshold voltage levels may be embodied on the same substrate, and from the same fabrication, without the requirement of additional, unnecessary, process steps. Also, the first and second vertical transistors may exhibit enhanced subthreshold characteristics and a low leakage current characteristics. Furthermore, a circuit configuration including a combination of the first and second vertical transistors and the planar transistor may remarkably reduce power consumption of the semiconductor device.

Referring to FIG. 3B, in this embodiment the bottoms of the first and second source/drain regions 27 and 29 may be formed at a lower level than the bottom of the n-drain region 26.

Referring to FIG. 3C, in this embodiment, the n-drain region 26, a first source/drain region 27A, and a second source/drain region 29A may be formed on a p-well 24. Lightly doped regions 47 may be formed between the first and second source/drain regions 27A and 29A. A channel region 28 may be defined between the lightly doped regions 47. A top surface of the first source/drain region 27A may be formed at the same level as a top surface of the n-drain region 26, while a bottom surface of the first source/drain region 27A may be formed at the same level as a bottom surface of the n-drain region 26.

Figure 3D:
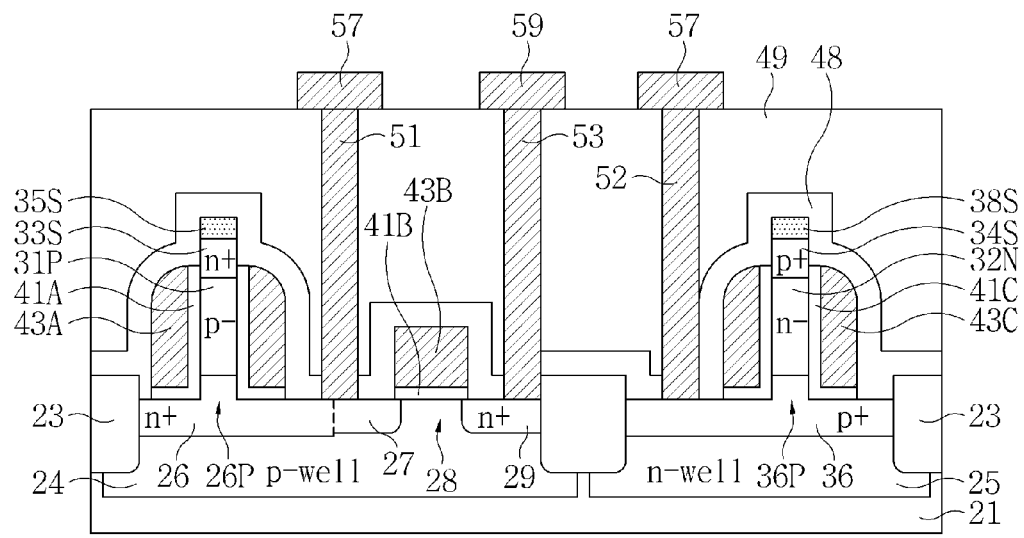

Referring to FIG. 3D, in this embodiment, a first metal silicide pattern 35S may be formed on the n-source region 33S, while a second metal silicide pattern 38S may be formed on the p-source region 34S.

Figure 3E:
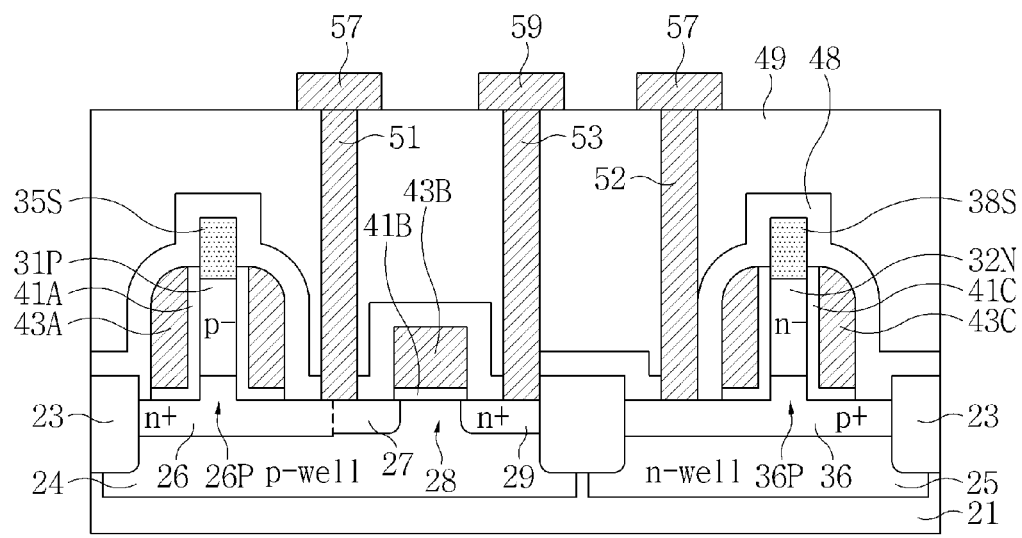

Referring to FIG. 3E, in this embodiment, the first metal silicide pattern 35S may be in direct contact with a p-vertical channel region 31P, while the second metal silicide pattern 38S may be in direct contact with an n-vertical channel region 32N.

Figure 3F:
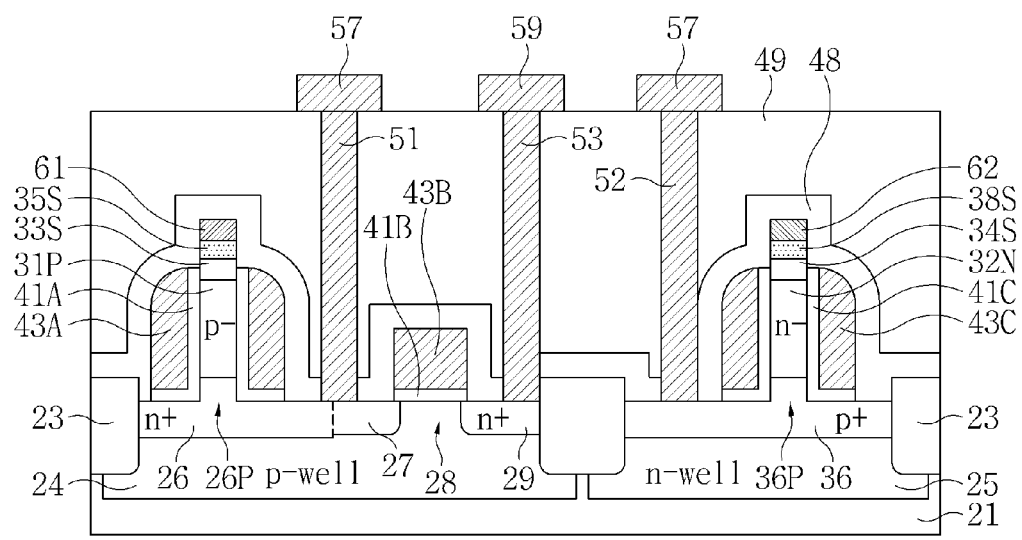

Referring to FIG. 3F, in this embodiment, a first metal silicide pattern 35S and a first metal pattern 61 may be sequentially stacked on the n-source region 33S, while a second metal silicide pattern 38S and a second metal pattern 62 may be sequentially stacked on the p-source region 34S.

In the various embodiments described herein, the first and second metal patterns 61 and 62 may comprise a material including tungsten (W), tungsten nitride (WN), titanium (Ti), titanium nitride (TiN), tantalum (Ta), tantalum nitride (TaN), cobalt (Co), nickel (Ni), ruthenium (Ru), platinum (Pt), titanium aluminum nitride (TiAlN), tantalum aluminum nitride (TaAlN), titanium silicon nitride (TiSiN), tantalum silicon nitride (TaSiN), or a combination thereof. The first and second metal silicide patterns 35S and 38S may comprise a material including WSi, TiSi, TaSi, CoSi, NiSi, or a combination thereof.

Figure 3G:
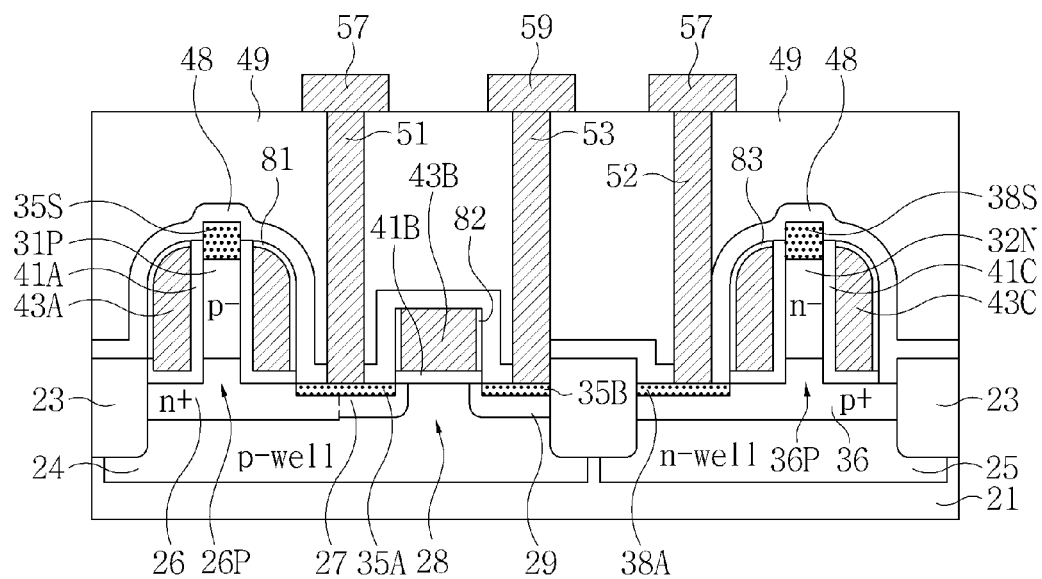

Referring to FIG. 3G in this embodiment, insulating spacers 81, 82, and 83 may be formed on sidewalls of the first, second, and third gate electrodes 43A, 43B, and 43C, respectively. The first metal silicide pattern 35S may be formed on the p-vertical channel region 31P, the second metal silicide pattern 38S may be formed on the n-vertical channel region 32N, a third metal silicide pattern 35A may be formed on the n-drain region 26 and the first source/drain region 27, a fourth metal silicide pattern 35B may be formed on the second source/drain region 29, and a fifth metal silicide pattern 38A may be formed on the p-drain region 36. The first through fifth metal silicide patterns 35S, 38S, 35A, 35B, and 38A may be covered with the etch stop layer 48. The first metal silicide pattern 35S may be in contact with the p-vertical channel region 31P, while the second metal silicide pattern 38S may be in contact with the n-vertical channel region 32N.

Figure 3H:
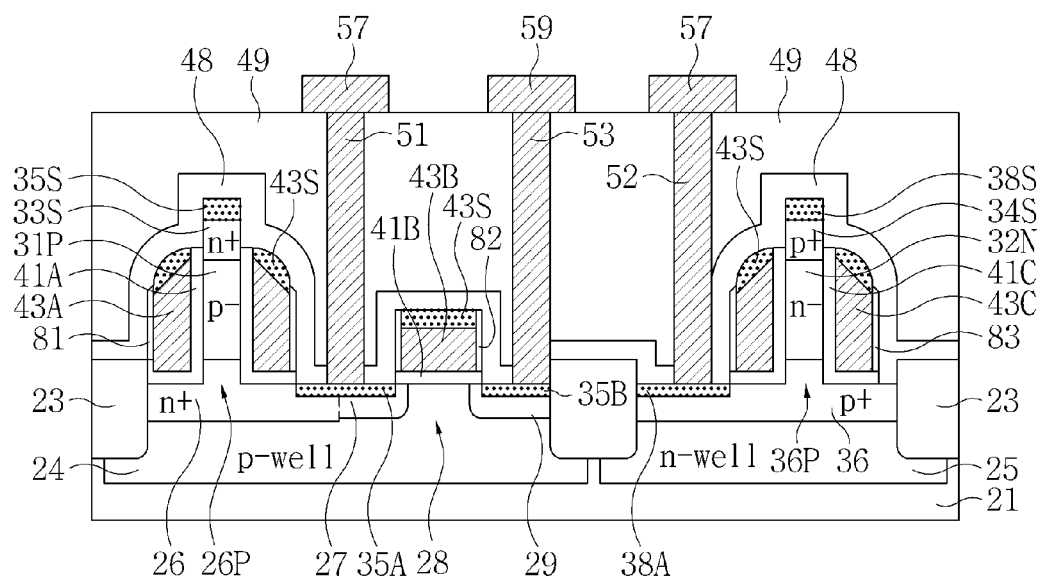

Referring to FIG. 3H, in this embodiment, the insulating spacers 81, 82, and 83 may be formed on the sidewalls of the first through third gate electrodes 43A, 43B, and 43C, respectively. The first metal silicide pattern 35S may be formed on the n-source region 33S, while the second metal silicide pattern 38S may be formed on the p-source region 34S. Also, the third metal silicide pattern 35A may be formed on the n-drain region 26 and the first source/drain region 27, the fourth metal silicide pattern 35B may be formed on the second source/drain region 29, and the fifth metal silicide pattern 38A may be formed on the p-drain region 36. Furthermore, gate silicide patterns 43S may be formed on the first through third gate electrodes 43A, 43B, and 43C.

In some embodiments, including those disclosed herein in connection with FIGS. 3A-3H described above, and with embodiments described below, including embodiments disclosed herein in connection with FIGS. 4, 5, 7A, 7B, 9A-9C, 11A-11C, and 12A-12D, it can be seen that the gate electrodes of the horizontal transistor and the vertical transistor are both in direct contact with the same layer of material that lies on the horizontal transistor and the vertical transistor. For example, in the embodiments of FIG. 3A, the gate electrode 43A of the vertical transistor is in direct contact with the etch stop layer 48. The same holds true for the gate electrode 43B of the horizontal transistor. In various embodiments, the layer of material in contact with both the horizontal and vertical transistors can comprise an etch stop layer or an insulating layer.

Embodiment 2

Figure 4:
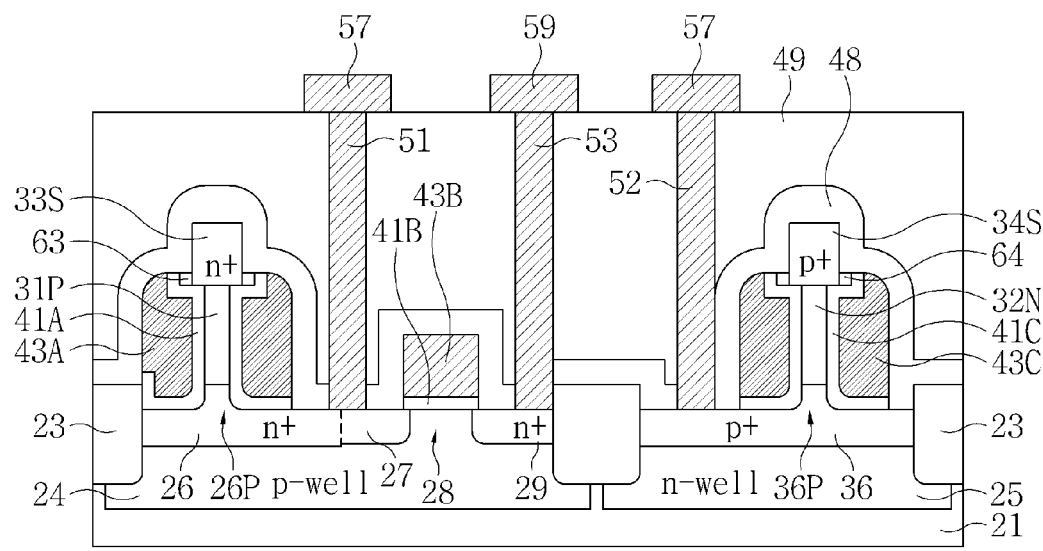
FIG. 4 is a cross-sectional view of a semiconductor device according to a second embodiment of the inventive concept.

FIG. 4 is a cross-sectional view of a semiconductor device according to a second embodiment of the inventive concept.

Referring to FIG. 4, in this embodiment, a p-vertical channel region 31P and an n-source region 33S may be formed on an n-drain region 26. First insulating spacers 63 may be formed on sidewalls of the n-source region 33S. The n-drain region 26 may include an n-protrusion 26P that extends in the vertical direction. A first gate dielectric layer 41A and a first gate electrode 43A may be formed on sidewalls of the p-vertical channel region 31P.

The p-vertical channel region 31P may have a width in the horizontal direction that is less than that of the n-source region 33S. The n-protrusion 26P may have substantially the same width in the horizontal direction as that of the p-vertical channel region 31P.

An n-vertical channel region 32N and a p-source region 34S may be formed on a p-drain region 36. Second insulating spacers 64 may be formed on sidewalls of the p-source region 34S. The p-drain region 36 may include a p-protrusion 36P that extends in the vertical direction. A third gate dielectric layer 41C and a third gate electrode 43C may be formed on sidewalls of the n-vertical channel region 32N.

The n-vertical channel region 32N may have a width in the horizontal direction that is less than that of the p-source region 34S. The p-protrusion 36P may have substantially the same horizontal width in the horizontal direction as that of the n-vertical channel region 32N.

Embodiment 3

Figure 5:
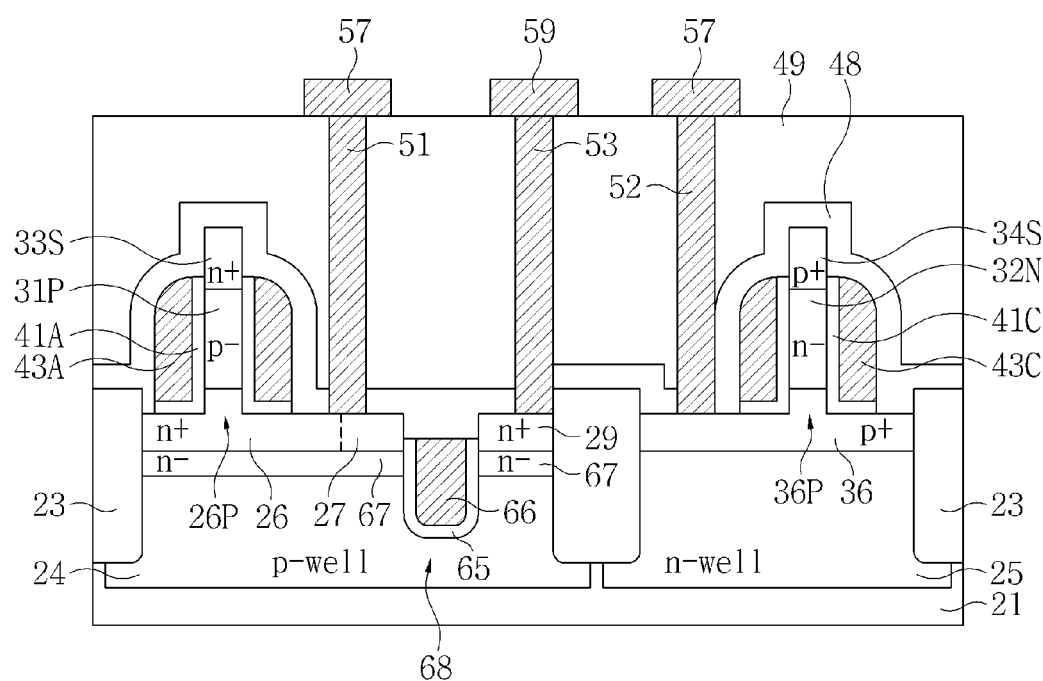
FIG. 5 is a cross-sectional view of a semiconductor device according to a third embodiment of the inventive concept.

FIG. 5 is a cross-sectional view of a semiconductor device according to a third embodiment of the inventive concept.

Referring to FIG. 5, lightly doped regions 67 may be formed under an n-drain region 26, a first source/drain region 27, and a second source/drain region 29. The lightly doped impurity regions 67 may include impurities of the same conductivity type as the n-drain region 26, the first source/drain region 27, and the second source/drain region 29. The lightly doped regions 67 may include n-type impurities. A second gate electrode 66 may be formed between the first and second source/drain regions 27 and 29. A gate dielectric layer 65 may be formed between the second gate electrode 66 and a p-well 24. A channel region 68 may be defined in the p-well 24 by the first and second source/drain regions 27 and 29, the lightly doped regions 67, and the second gate electrode 66.

A bottom of the second gate electrode 66 may be formed at a lower level than the first and second source/drain regions 27 and 29 and the lightly doped regions 67. A top of the second gate electrode 66 may be formed at a lower level than top surfaces of the first and second source/drain regions 27 and 29. The second gate electrode 66, the second gate dielectric layer 65, the channel region 68, the first and second source/drain regions 27 and 29, and the lightly doped regions 67 may constitute a recess channel transistor. The recess channel transistor may be categorized as a non-vertical transistor. In this case, although the second gate electrode 66 is at a different vertical position that that of the first gate electrode 43A, the first and second gate electrodes 43A, 66 can still be formed of the same layer of material. Also, it can be seen that the first and second gate electrodes 43A, 66 are both in direct contact with the same layer of material that lies on the horizontal transistor and the vertical transistor; namely etch stop layer 48.

Embodiment 4

Figure 6:
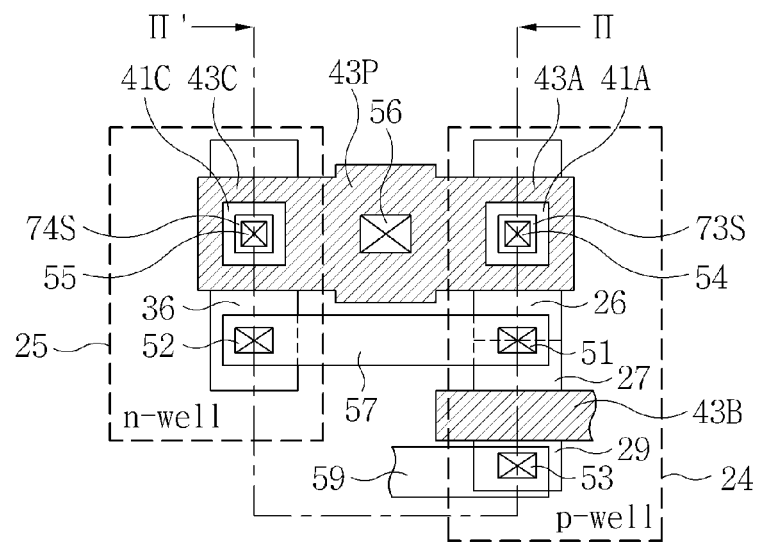
FIG. 6 is a layout illustrating a semiconductor device according to a fourth embodiment of the inventive concept.
Figure 7A:
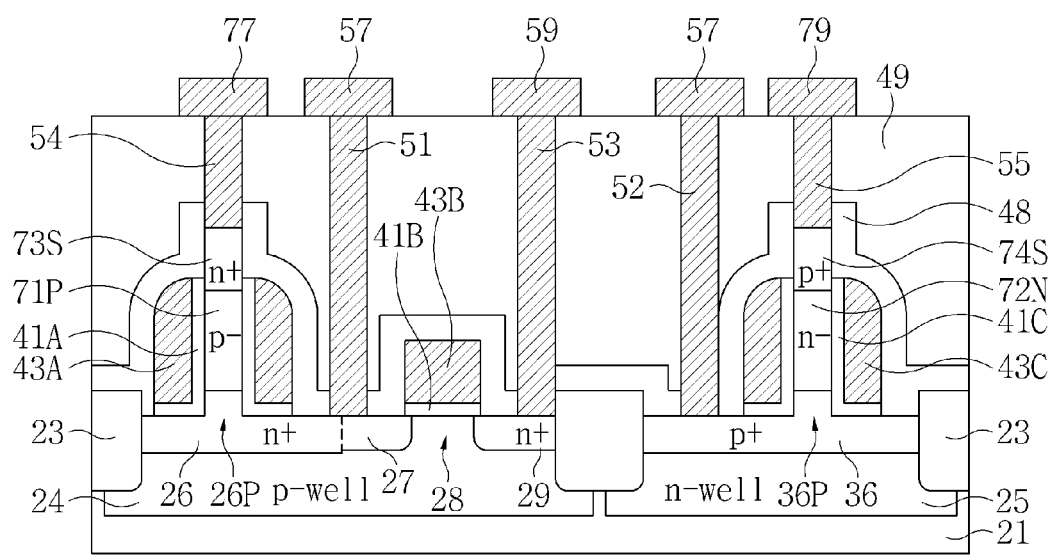
FIGS. 7A and 7B are cross-sectional views of the semiconductor device of FIG. 6.
Figure 7B:
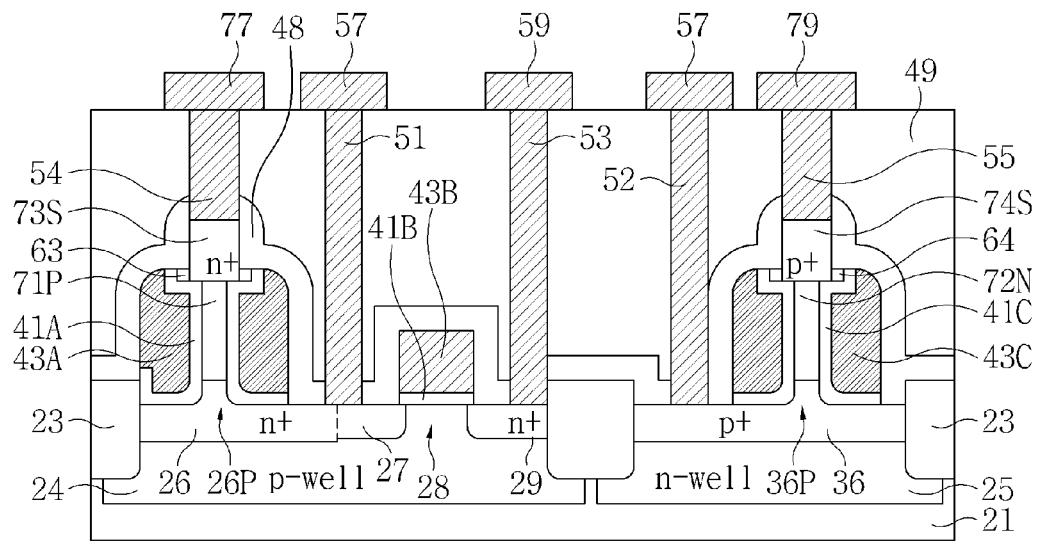

FIG. 6 is a layout illustrating a semiconductor device according to a fourth embodiment of the inventive concept, and FIGS. 7A and 7B are cross-sectional views of the semiconductor device taken along line II-II' of FIG. 6.

Referring to FIGS. 6 and 7A, a p-well 24, an n-well 25, and an isolation layer 23 may be formed in a semiconductor substrate 21. An n-drain region 26, a first source/drain region 27, and a second source/drain region 29 may be formed on the p-well 24. A p-vertical channel region 71P and an n-source region 73S may be formed on the n-drain region 26. The n-drain region 26 may include an n-protrusion 26P.

A first gate dielectric layer 41A and a first gate electrode 43A may be formed on sidewalls of the p-vertical channel region 71P.

A channel region 28 may be defined between the first and second source/drain regions 27 and 29. A second gate electrode 43B may be formed on the channel region 28. A second gate dielectric layer 41B may be interposed between the second gate electrode 43B and the channel region 28.

A p-drain region 36 may be formed on the n-well 25. An n-vertical channel region 72N and a p-source region 74S may be formed on the p-drain region 36. The p-drain region 36 may include a p-protrusion 36P. A third gate dielectric layer 41C and a third gate electrode 43C may be formed on sidewalls of the n-vertical channel region 72N.

A gate pad 43P may be formed on the isolation layer 23. The first and third gate electrodes 43A and 43C may be connected to the gate pad 43P. The gate pad 43P and the first and third gate electrodes 43A and 43C may have an integral structure. An etch stop layer 48 and an interlayer insulating layer 49 may be formed to cover the entire surface of the semiconductor substrate 21.

A first plug 51, a second plug 52, a third plug 53, a fourth plug 54, a fifth plug 55, and a sixth plug 56 may be formed through the interlayer insulating layer 49 and the etch stop layer 48. First through fourth interconnection lines 57, 59, 77, and 79 may be formed on the interlayer insulating layer 49. The first plug 51 may be connected to at least one of the n-drain region 26 and the first source/drain region 27. The second plug 52 may be connected to the p-drain region 36. The first interconnection line 57 may be in contact with the first and second plugs 51 and 52. The second interconnection line 59 may be in contact with the third plug 53. The third plug 53 may be connected to the second source/drain region 29. The fourth plug 54 may be connected to the n-source region 73S. The fifth plug 55 may be connected to the p-source region 74S. The sixth plug 56 may be connected to the gate pad 43P.

In the present embodiment, each of the p-vertical channel region 71P and the n-vertical channel region 72N may have a pillar structure. Each of the p-vertical channel region 71P and the n-vertical channel region 72N may have a cylindrical shape, a square cross-section pillar shape, a rectangular cross-section pillar shape, or a polygonal cross-section pillar shape. The p-vertical channel region 71P may protrude in a vertical direction over the n-drain region 26, while the n-vertical channel region 72N may protrude in a vertical direction over the p-drain region 36. Each of the p-vertical channel region 71P and the n-vertical channel region 72N may comprise a single crystal semiconductor material formed using an epitaxial growth technique.

In other embodiments, each of the p-vertical channel region 71P and the n-vertical channel region 72N may include a wire structure, or a nano-wire structure.

The n-source region 73S may be disposed on and have sidewalls that are aligned with those of the p-vertical channel region 71P and contact the p-vertical channel region 71P. The p-source region 74S may be disposed on and have sidewalls that are aligned with those of the n-vertical channel region 72N and contact the n-vertical channel region 72N. Each of the n-source region 73S and the p-source region 74S may comprise a single crystal semiconductor material formed using an epitaxial growth technique.

In some embodiments, the first gate electrode 43A may be formed to completely surround the sidewalls of the p-vertical channel region 71P, while the third gate electrodes 43C may be formed to completely surround the sidewalls of the n-vertical channel region 72N.

Referring to FIG. 7B, the p-vertical channel region 71P and the n-source region 73S may be formed on the n-drain region 26. First insulating spacers 63 may be formed on sidewalls of the n-source region 73S. The n-drain region 26 may include an n-protrusion 26P. The n-protrusion 26P may be disposed under and have sidewalls that are aligned with sidewalls of the p-vertical channel region 71P. A first gate dielectric layer 41P and a first gate electrode 43A may be formed on the sidewalls of the p-vertical channel region 71P.

The p-vertical channel region 71P may have a width in the horizontal direction that is less than that of the n-source region 73S. The n-protrusion 26P may have a width in the horizontal direction that is substantially the same as that of the p-vertical channel region 71P.

The n-vertical channel region 72N and the p-source region 74S may be formed on the p-drain region 36. Second insulating spacers 64 may be formed on sidewalls of the p-source region 74S. The p-drain region 36 may include a p-protrusion 36P. A third gate dielectric layer 41C and a third gate electrode 43C may be formed on the sidewalls of the n-vertical channel region 72N.

The n-vertical channel region 72N may have a width in the horizontal direction that is less than that of the p-source region 74S. The p-protrusion 36P may have a width in the horizontal direction that is substantially the same as that of the n-vertical channel region 72N.

Embodiment 5

Figure 8:
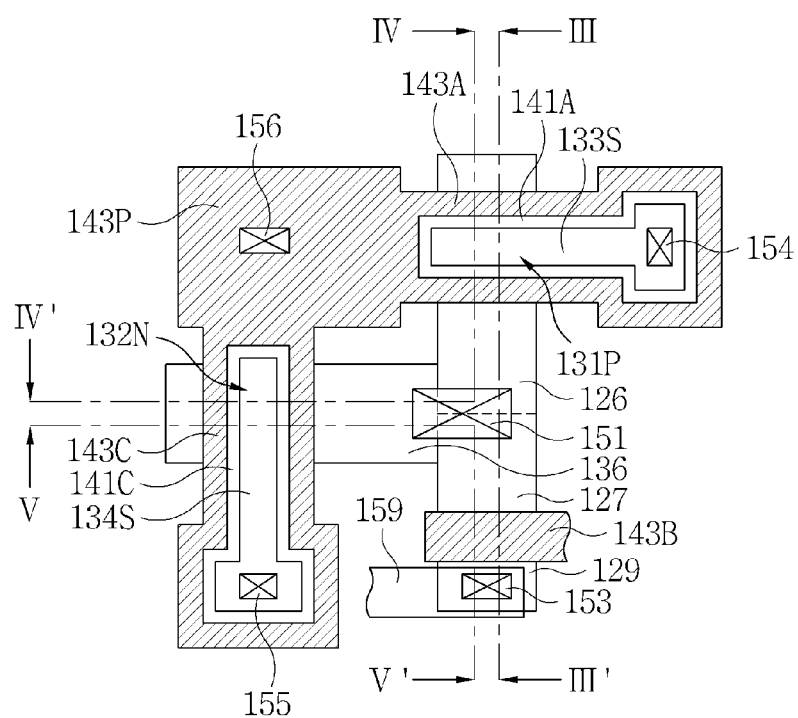
FIG. 8 is a layout illustrating a semiconductor device according to a fifth embodiment of the inventive concept.
Figure 9A:
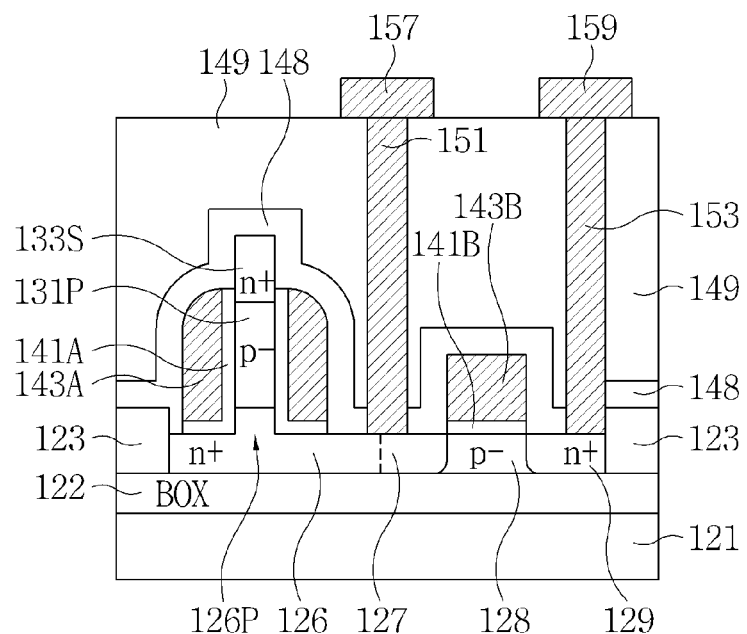
FIGS. 9A through 9C are cross-sectional views of the semiconductor device of FIG. 8.
Figure 9B:
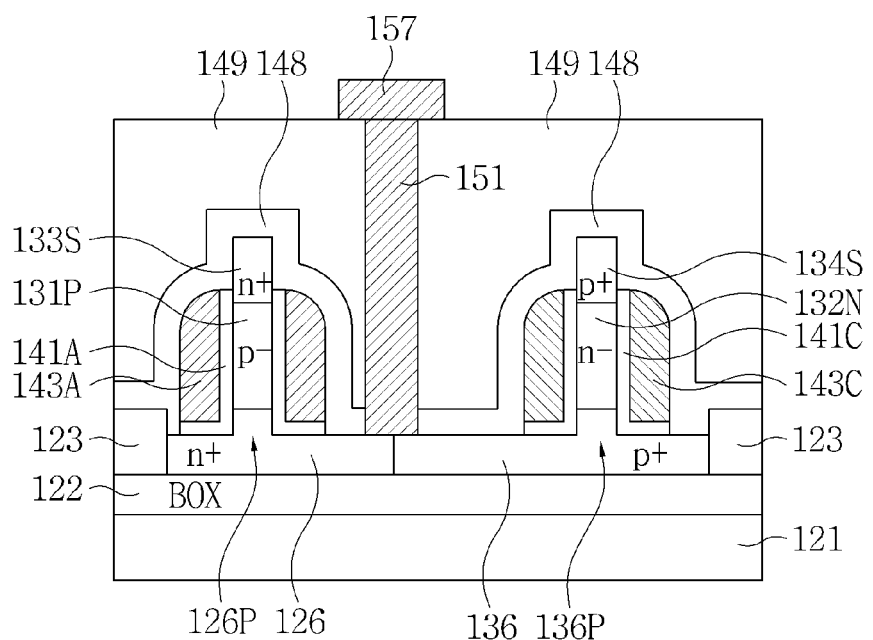
Figure 9C:
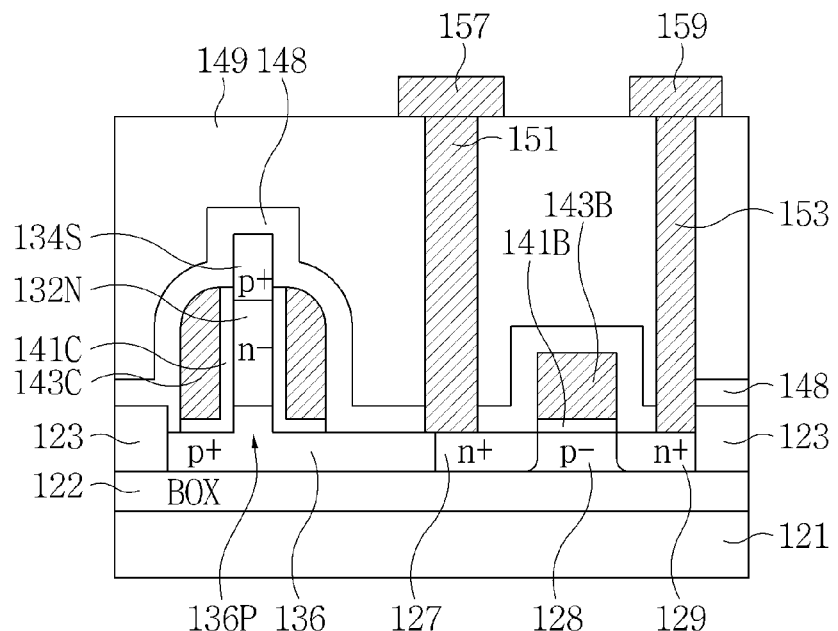

FIG. 8 is a layout illustrating a semiconductor device according to a fifth embodiment of the inventive concept. FIGS. 9A through 9C are cross-sectional views of the semiconductor device taken along lines III-III', IV-IV', and V-V' of FIG. 8, respectively.

Referring to FIGS. 8 and 9A through 9C, a buried oxide layer 122 may be formed on a semiconductor substrate 121. An isolation layer 123 may be formed on the buried oxide layer 122 to define an n-drain region 126, a first source/drain region 127, a second source/drain region 129, a channel region 128, and a p-drain region 136.

A p-vertical channel region 131P and an n-source region 133S may be formed on the n-drain region 126. The n-drain region 126 may include an n-protrusion 126P. A first gate dielectric layer 141A and a first gate electrode 143A may be formed on sidewalls of the p-vertical channel region 131P.

A second gate electrode 143B may be formed on the channel region 128. A second gate dielectric layer 141B may be interposed between the second gate electrode 143B and the channel region 128.

An n-vertical channel region 132N and a p-source region 134S may be formed on the p-drain region 136. The p-drain region 136 may include a p-protrusion 136P. A third gate dielectric layer 141C and a third gate electrode 143C may be formed on sidewalls of the n-vertical channel region 132N.

A gate pad 143P may be formed on the isolation layer 123. The first and third gate electrodes 143A and 143C may be connected to the gate pad 143P. An etch stop layer 148 and an interlayer insulating layer 149 may be formed to cover the entire surface of the semiconductor substrate 121.

A first plug 151, a second plug 153, a third plug 154, a fourth plug 155, and a fifth plug 156 may be formed through the interlayer insulating layer 149 and the etch stop layer 148. First and second interconnection lines 157 and 159 may be formed on the interlayer insulating layer 149. The first plug 151 may be connected to at least one of the n-drain region 126, the p-drain region 136, and the first source/drain region 127. The first interconnection line 157 may be in contact with the first plug 151. The second interconnection line 159 may be in contact with the second plug 153.

The n-drain region 126, the first source/drain region 127, the second source/drain region 129, the channel region 128, and the p-drain region 136 may be formed at the same vertical level, relative to the substrate. Top surfaces of the n-drain region 126, the first source/drain region 127, the second source/drain region 129, the channel region 128, and the p-drain region 136 may be formed at a lower level than a top surface of the isolation layer 123. The first source/drain region 127 may be in continuity with, or, in other words, contiguous with, the n-drain region 126. Furthermore, the first source/drain region 127 and the n-drain region 126 may be integral with each other. The p-drain region 136 may be in contact with at least one of the n-drain region 126 and the first source/drain region 127. Each of the n-drain region 126 and the first source/drain region 127 may comprise a single crystal semiconductor material having n-type impurities. The p-drain region 136 may comprise a single crystal semiconductor material having p-type impurities.

The n-drain region 126, the p-drain region 136, and the first source/drain region 127 may constitute a node (refer to N1 in FIG. 1). In some embodiments, the electric resistance of the node N1 may be markedly reduced. The first source/drain region 127 and the n-drain region 126 may be in continuity with, or contiguous with, each other at the same vertical level relative to the substrate. Such a structure in which the p-drain region 136 is in contact with the n-drain region 126 and the first source/drain region 127 is highly advantageous in that it lends itself well to highly integrated configurations.

Embodiment 6

Figure 10:
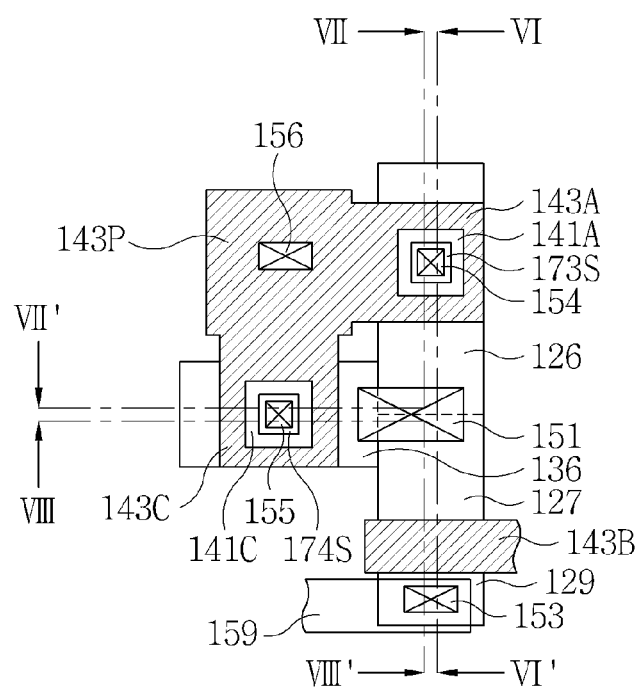
FIG. 10 is a layout illustrating a semiconductor device according to a sixth embodiment of the inventive concept.
Figure 11A:
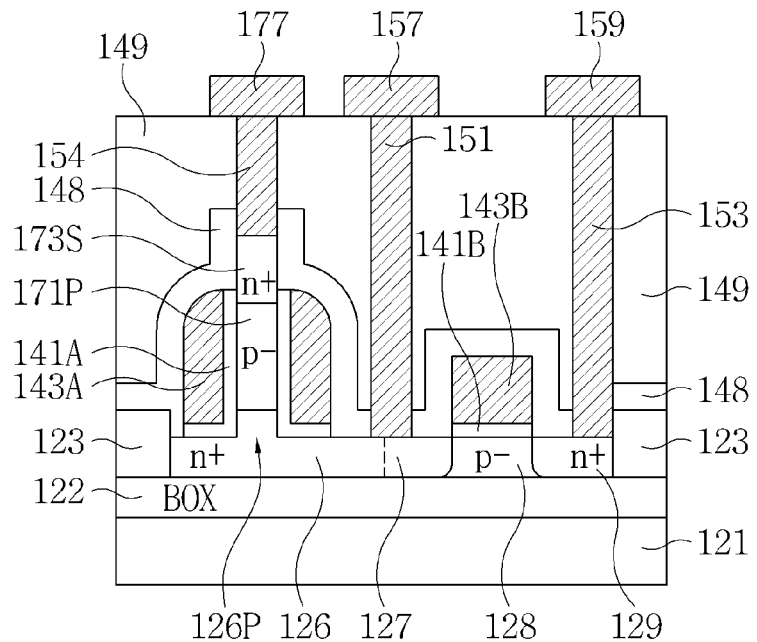
FIGS. 11A through 12D are cross-sectional views of the semiconductor device of FIG. 10.
Figure 11B:
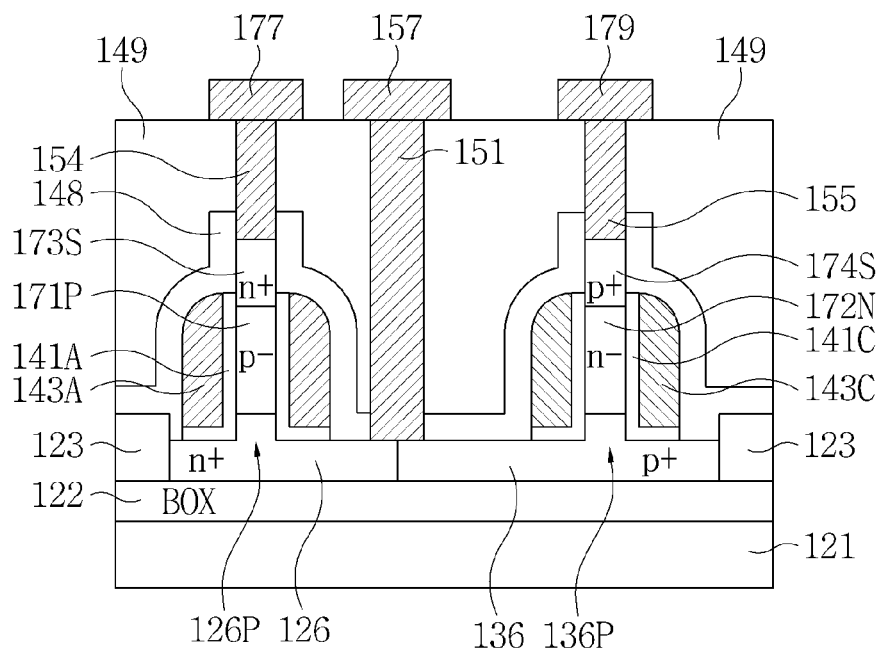
Figure 11C:
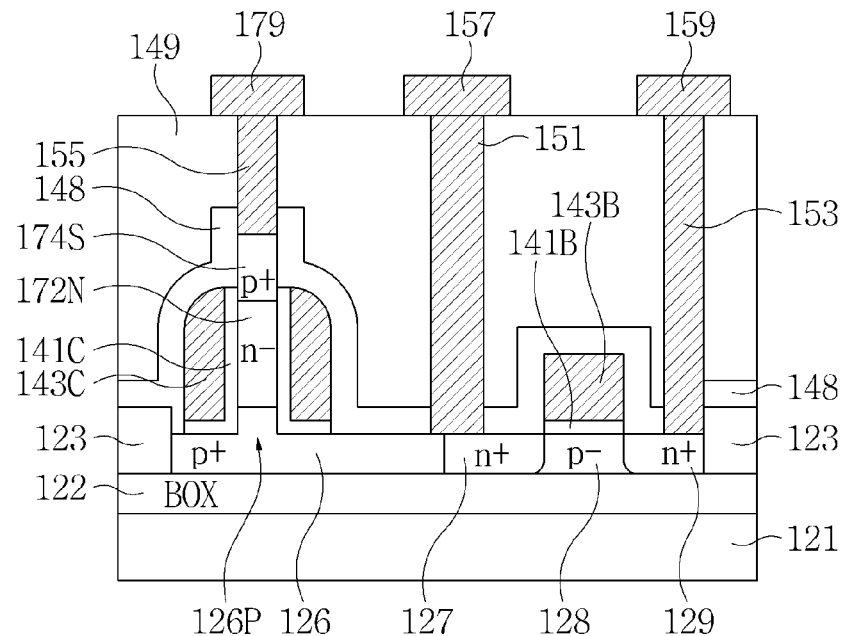
Figure 12A:
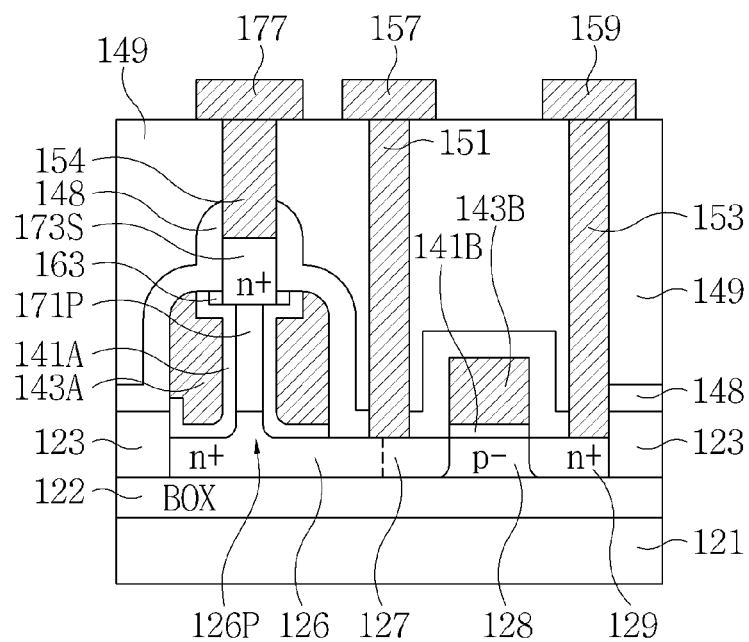
Figure 12B:
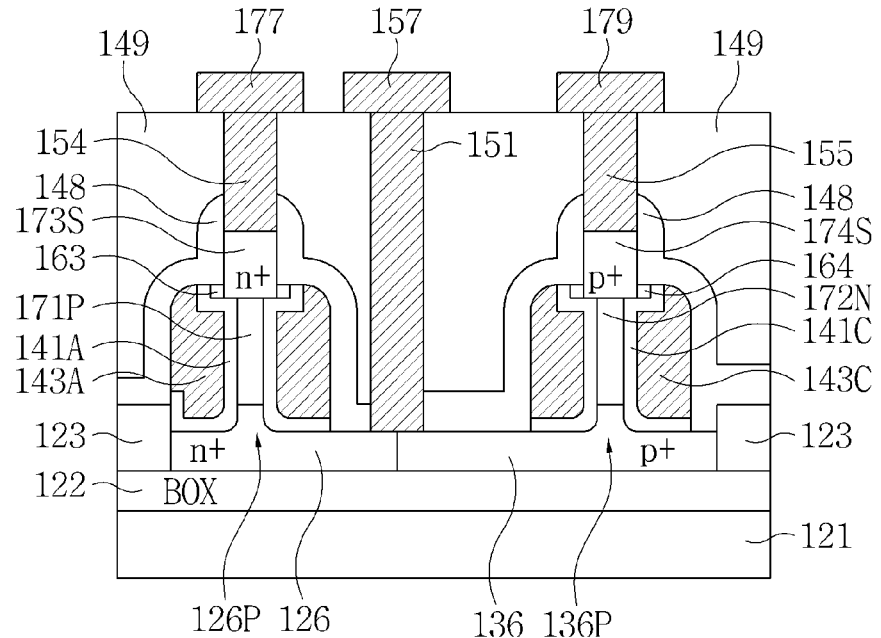
Figure 12C:
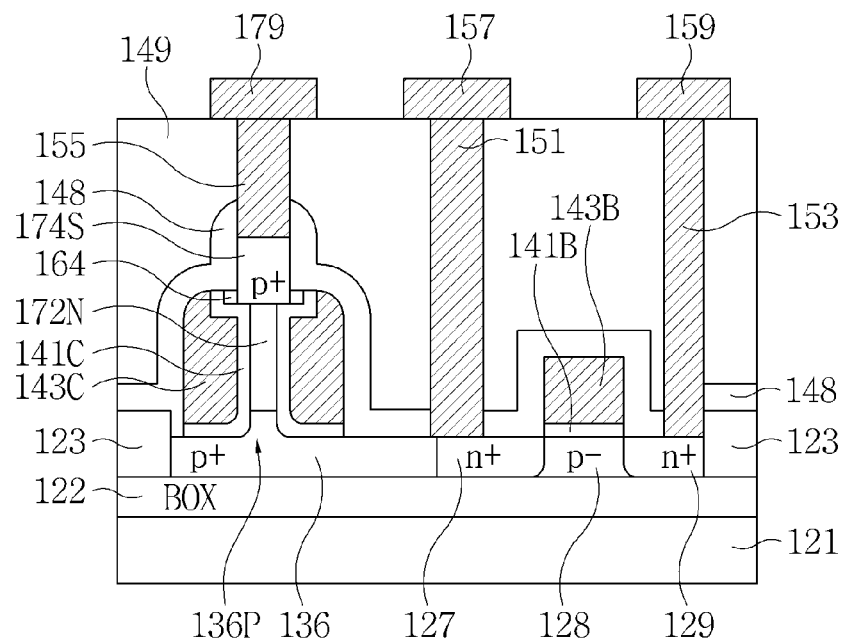
Figure 12D:
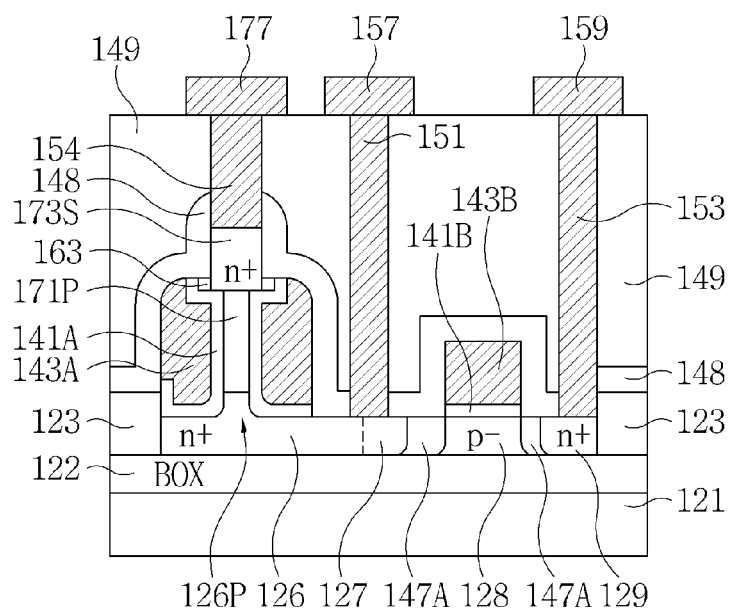

FIG. 10 is a layout illustrating a semiconductor device according to a sixth embodiment of the inventive concept. FIGS. 11A, 12A, and 12D are cross-sectional views taken along line VI-VI' of FIG. 10, FIGS. 11B and 12B are cross-sectional views taken along line VII-VII' of FIG. 10, and FIGS. 11C and 12C are cross-sectional views taken along line VIII-VIII' of FIG. 10.

Referring to FIGS. 10, 11A, 11B, and 11C, a buried oxide layer 122 may be formed on a semiconductor substrate 121. An isolation layer 123 may be formed on the buried oxide layer 122 to define an n-drain region 126, a first source/drain region 127, a second source/drain region 129, a channel region 128, and a p-drain region 136.

A p-vertical channel region 171P and an n-source region 173S may be formed on the n-drain region 126. The n-drain region 126 may include an n-protrusion 126P. A first gate dielectric layer 141A and a gate electrode 143A may be formed on sidewalls of the p-vertical channel region 171P.

A channel region 128 may be defined between the first and second source/drain regions 127 and 129. A second gate electrode 143B may be formed on the channel region 128. A second gate dielectric layer 141B may be interposed between the second gate electrode 143B and the channel region 128.

An n-vertical channel region 172N and a p-source region 174S may be formed on the p-drain region 136. The p-drain region 136 may include a p-protrusion 136P. A third gate dielectric layer 141C and a third gate electrode 143C may be formed on sidewalls of the n-vertical channel region 172N.

A gate pad 143P may be formed on the isolation layer 123. The first and third gate electrodes 143A and 143C may be connected to the gate pad 143P. An etch stop layer 148 and an interlayer insulating layer 149 may be formed to cover the entire surface of the semiconductor substrate 121.

A first plug 151, a second plug 153, a third plug 154, a fourth plug 155, and a fifth plug 156 may be formed through the interlayer insulating layer 149 and the etch stop layer 148. First through fourth interconnection lines 157, 159, 177, and 179 may be formed on the interlayer insulating layer 149. The first plug 151 may be connected to at least one of the n-drain region 126, the p-drain region 136, and the first source/drain region 127. The first interconnection line 157 may be in contact with the first plug 151. The second interconnection line 159 may be in contact with the second plug 153.

Each of the p-vertical channel region 171P and the n-vertical channel region 172N may have a pillar structure. In other embodiments, each of the p-vertical channel region 171P and the n-vertical channel region 172N may have a wire structure, or nano-wire structure.

The first gate electrode 143A may be formed to completely surround sidewalls of the p-vertical channel region 171P, and the third gate electrode 143C may be formed to completely surround sidewalls of the n-vertical channel region 172N.

Referring to FIGS. 10, 12A, 12B, and 12C, a p-vertical channel region 171P and an n-source region 173S may be formed on the n-drain region 126. First insulating spacers 163 may be formed on sidewalls of the n-source region 173S. The n-drain region 126 may include an n-protrusion 126P. A first gate dielectric layer 141A and a first gate electrode 143A may be formed on sidewalls of the p-vertical channel region 171P.

The p-vertical channel region 171P may have a width in the horizontal direction that is less than that of the n-source region 173S. The n-protrusion 126P may have substantially the same width in the horizontal direction as that of the p-vertical channel region 171P.

An n-vertical channel region 172N and a p-source region 174S may be formed on the p-drain region 136. Second insulating spacers 164 may be formed on sidewalls of the p-source region 174S. The p-drain region 136 may include a p-protrusion 136P. A third gate dielectric layer 141C and a third gate electrode 143C may be formed on sidewalls of the n-vertical channel region 172N.

The n-vertical channel region 172N may horizontal width that is less than that of the p-source region 174S. The p-protrusion 136P may have substantially the same width in the horizontal direction as that of the n-vertical channel region 172N.

Referring to FIGS. 10 and 12D, impurity regions 147A may be formed adjacent to both sides of the second gate electrode 143B. The impurity regions 147 may be aligned with sidewalls of the second gate electrode 143B. The impurity regions 147A may have different widths due to alignment errors of the second gate electrode 143B present during its formation. A channel region 128 may be defined between the impurity regions 147A.

Embodiment 7

FIGS. 13 through 24 are cross-sectional views taken along line I-I' of FIG. 2, illustrating a method of forming a semiconductor device according to a seventh embodiment of the inventive concept.

Figure 13:
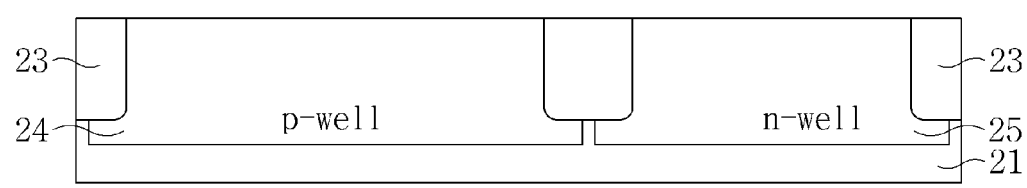
FIGS. 13 through 24 are cross-sectional views illustrating a method of forming a semiconductor device according to a seventh embodiment of the inventive concept.

Referring to FIGS. 2 and 13, a p-well 24, an n-well 25, and an isolation layer 23 may be formed in a semiconductor substrate 21. In some embodiments, the semiconductor substrate 21 may comprise a semiconductor wafer formed of single crystal material. For example, the semiconductor substrate 21 may be a silicon wafer having p-type impurities. The p-well 24 may include single crystalline silicon having p-type impurities, while the n-well 25 may include single crystalline silicon having n-type impurities. The isolation layer 23 may be an insulating layer formed of silicon oxide, silicon nitride, silicon oxynitride, or a combination thereof using a shallow trench isolation (STI) technique. The p-well 24 and the n-well 25 may be electrically isolated from one another by the isolation layer 23. A top surface of the isolation layer 23, the p-well 24, and the n-well 25 may lie on substantially the same planar surface.

Figure 14A:
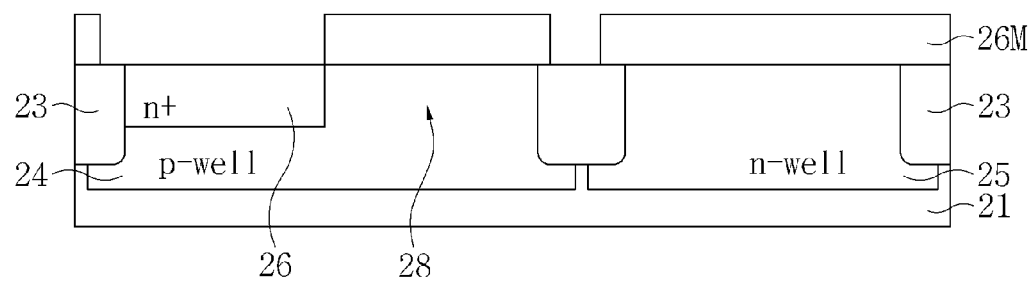

Referring to FIGS. 2 and 14A, a first mask pattern 26M may be formed to cover the n-well 25 and partially expose the p-well 24. N-type impurities may be implanted into the p-well 24 using the first mask pattern 26M as an ion implantation mask, thereby forming an n-drain region 26. A channel region 28 may be defined adjacent to the n-drain region 26. The channel region 28 may include single crystalline silicon material having p-type impurities. The first mask pattern 26M may be removed.

Figure 14B:
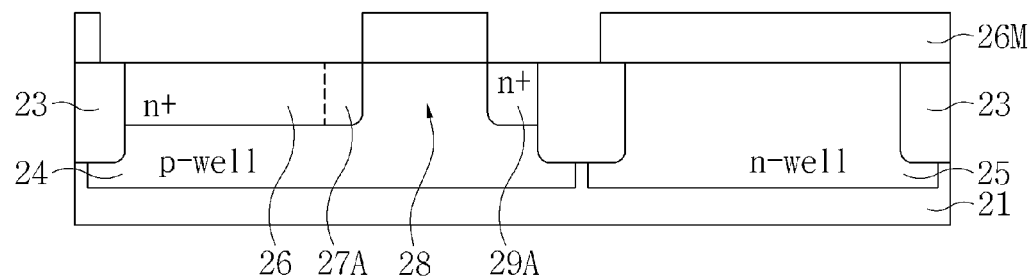

Referring to FIG. 14B, in applied embodiments, a first mask pattern 26M may be formed to cover the n-well 25 and partially expose the p-well 24. N-type impurities may be implanted into the p-well 24 using the first mask pattern 26M as an ion implantation mask, thereby forming an n-drain region 26, a first source/drain region 27A, and a second source/drain region 29A. A channel region 28 may be defined between the first and second source/drain regions 27A and 29A. The channel region 28 may include single crystalline silicon having p-type impurities. The first mask pattern 26M may be removed.

Figure 15:
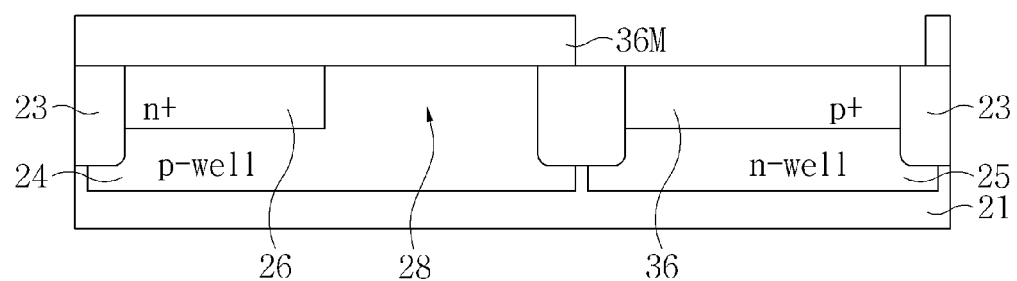

Referring to FIGS. 2 and 15, a second mask pattern 36M may be formed to cover the p-well 24 and expose the n-well 25. P-type impurities may be implanted into the n-well 25 using the second mask pattern 36M as an ion implantation mask, thereby forming a p-drain region 36. The second mask pattern 36M may be removed, thereby exposing top surfaces of the n-drain region 26 and the p-drain region 36.

Figure 16:
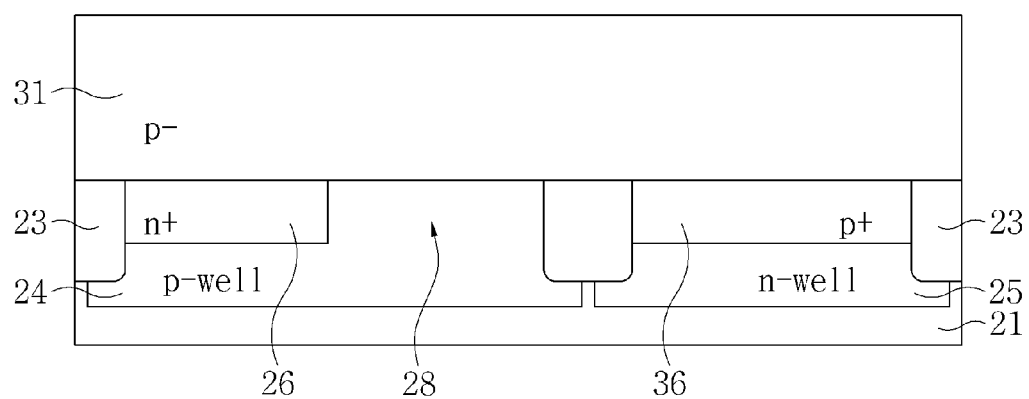

Referring to FIGS. 2 and 16, a first semiconductor layer 31 may be formed on the semiconductor substrate 21. The first semiconductor layer 31 may be in contact with top surfaces of the n-drain region 26 and the p-drain region 36. In some embodiments, the first semiconductor layer 31 may be formed using an epitaxial growth technique. The first semiconductor layer 31 may include an n-type semiconductor, a p-type semiconductor, or an intrinsic semiconductor.

Hereinafter, it is assumed that the first semiconductor layer 31 is a first p-semiconductor layer. For example, the first p-semiconductor layer 31 may include single crystalline silicon having p-type impurities.

Figure 17:
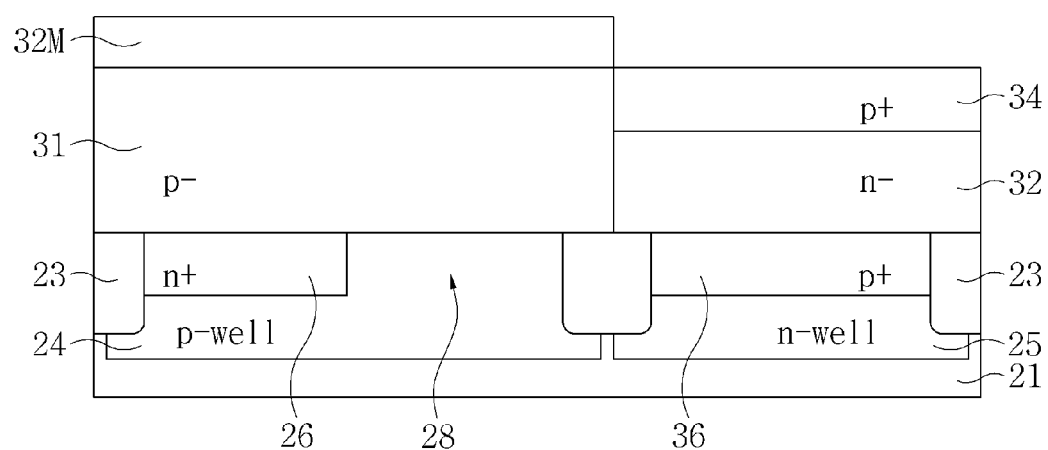

Referring to FIGS. 2 and 17, a third mask pattern 32M may be formed on the first p-semiconductor layer 31. A first n-semiconductor layer 32 and a second p-semiconductor layer 34 may be formed in the first p-semiconductor layer 31 by performing an ion implantation process using the third mask pattern 32M as an ion implantation mask. The third mask pattern 32M may be removed. The first n-semiconductor layer 32 may be in contact with the p-drain region 36. The second p-semiconductor layer 34 may be formed on the first n-semiconductor layer 32. As a result, the first p-semiconductor layer 31 may be defined on the p-well 24.

Figure 18:
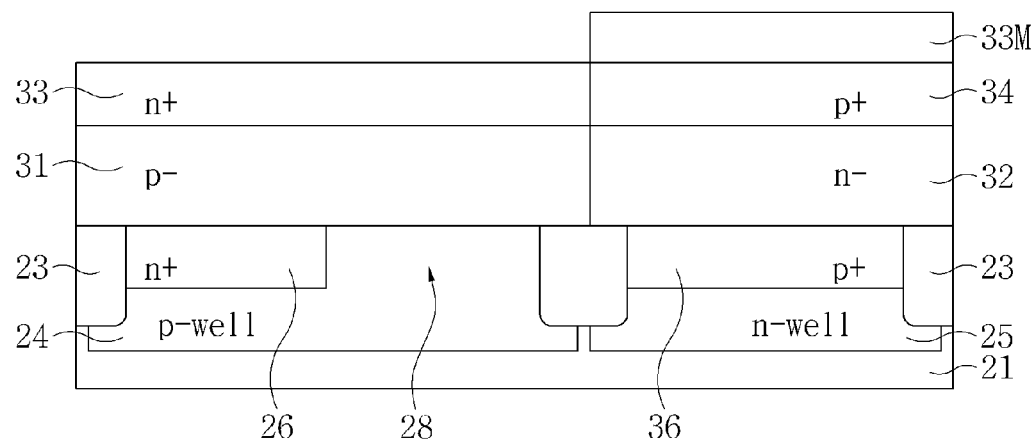

Referring to FIGS. 2 and 18, a fourth mask pattern 33M may be formed to cover the second p-semiconductor layer 34 and expose the first p-semiconductor layer 31. A second n-semiconductor layer 33 may be formed by performing an ion implantation process using the fourth mask pattern 33M as an ion implantation mask. The fourth mask pattern 33M may be removed. The first p-semiconductor layer 31 may therefore be defined between the second n-semiconductor layer 33 and the n-drain region 26.

Figure 19:
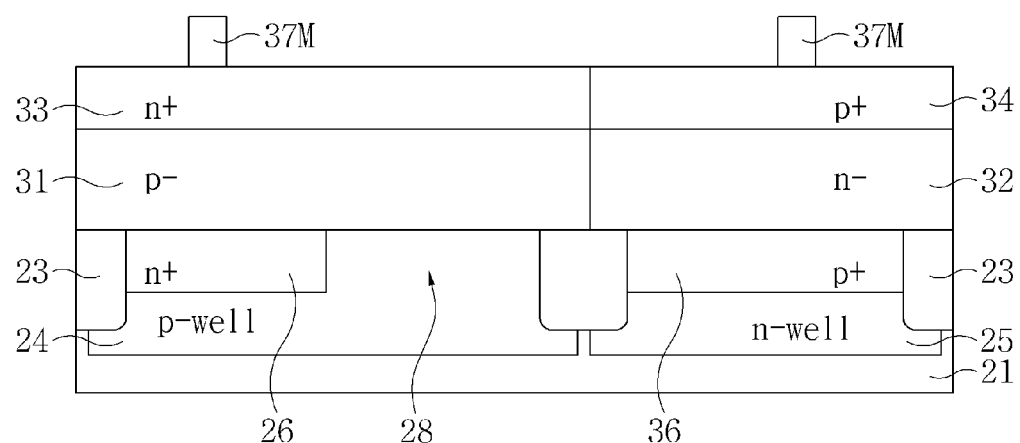
Figure 20:
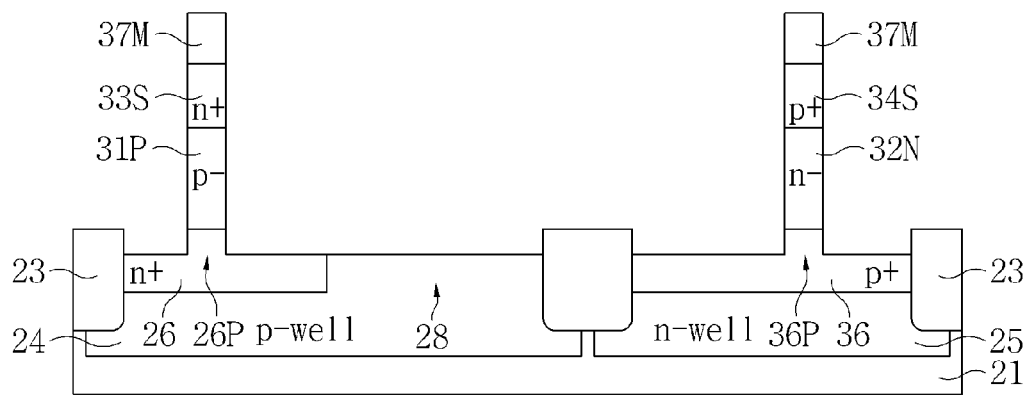

Referring to FIGS. 2, 19, and 20, a fifth mask pattern 37M may be formed on the second n-semiconductor layer 33 and the second p-semiconductor layer 34. The second n-semiconductor layer 33, the first p-semiconductor layer 31, the n-drain region 26, the channel region 28, the second p-semiconductor layer 34, the first n-semiconductor layer 32, and the p-drain region 36 may be anisotropically etched using the fifth mask pattern 37M as an etch mask, thereby forming an n-source region 33S, a p-vertical channel region 31P, a p-source region 34S, and an n-vertical channel region 32N.

The n-drain region 26, the channel region 28, and the p-drain region 36 may be partially recessed and retained at a lower level than the top surface of the isolation layer 23. The n-drain region 26 may thereby include an n-protrusion 26P, and the p-drain region 36 may thereby include a p-protrusion 36P. The n-protrusion 36 may be disposed under and have sidewalls that are aligned with those of the p-vertical channel region 31P, while the p-protrusion 36P may be disposed under and have sidewalls that are aligned with those of the n-vertical channel region 32N.

Figure 21:
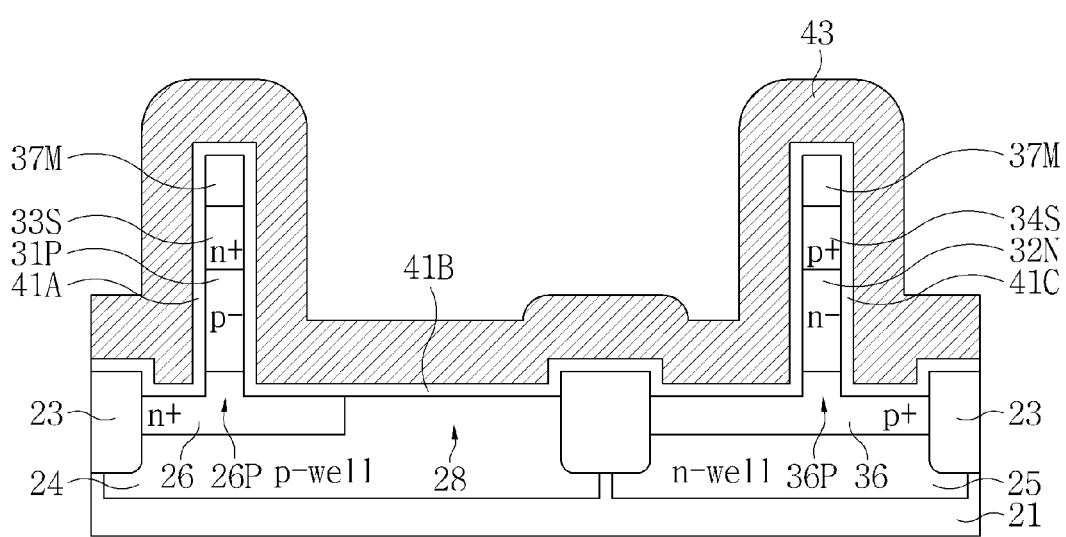

Referring to FIGS. 2 and 21, a gate dielectric layer 41A, 41B, and 41C may be formed to cover the resulting surface of the semiconductor substrate 21. A gate conductive layer 43 may be formed on the gate dielectric layer 41A, 41B, and 41C. The gate dielectric layer 41A, 41B, and 41C may include a first gate dielectric layer portion 41A covering sidewalls of the p-vertical channel region 31P, a second gate dielectric layer portion 41B covering the channel region 28, and a third gate dielectric layer 41C portion covering sidewalls of the n-vertical channel region 32N.

The gate dielectric layer 41A, 41B, and 41C may comprise a silicon oxide layer, a silicon nitride layer, a silicon oxynitride layer, a high-k dielectric layer, or a combination thereof. The first gate dielectric layer 41A, the second gate dielectric layer 41B, and the third gate dielectric layer 41C portions may be formed using the same material layer at the same time. The gate conductive layer 43 may include a metal layer, a metal nitride layer, a metal silicide layer, a polysilicon (poly-Si) layer, a conductive carbon layer, or a combination thereof.

Figure 22:
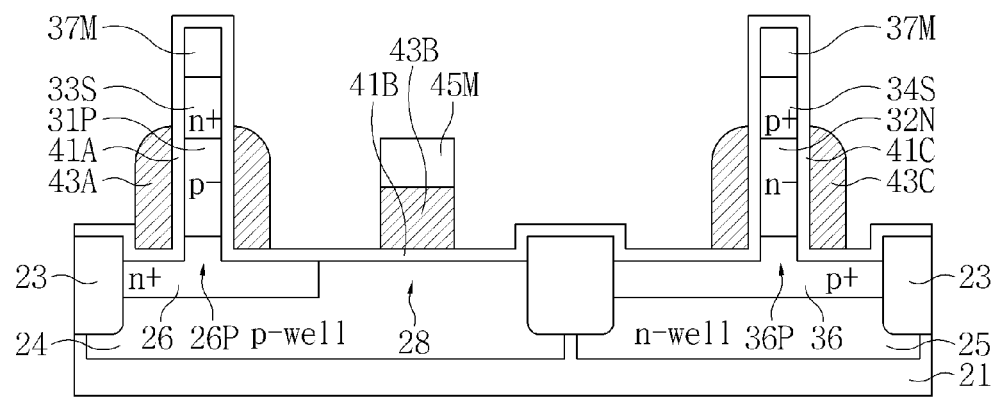

Referring to FIGS. 2 and 22, a sixth mask pattern 45M may be formed on the gate conductive layer 43. The gate conductive layer 43 may be anisotropically etched using the sixth mask pattern 45M as an etch mask, thereby forming a first gate electrode 43A, a second gate electrode 43B, and a third gate electrode 43C. The sixth mask pattern 45M may cover the second gate electrode 43B. Also, the sixth mask pattern 45M may cover a gate pad 43P.

Figure 23:
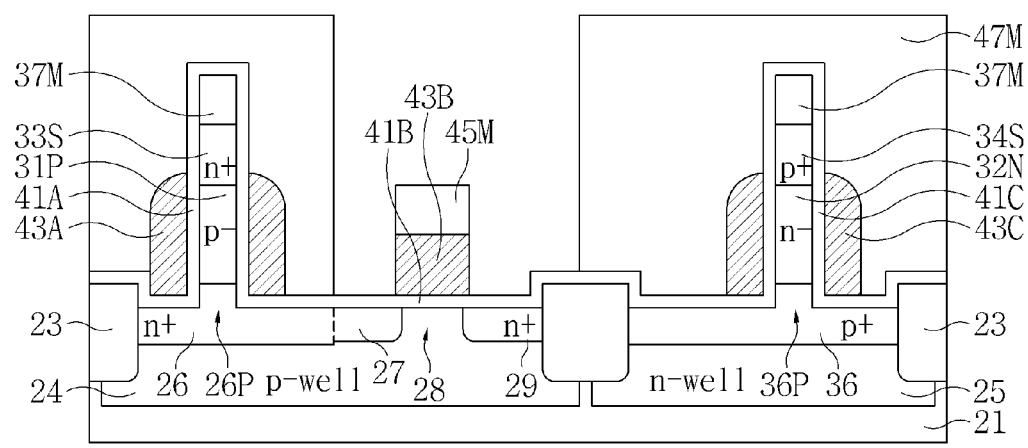

Referring to FIGS. 2 and 23, a seventh mask pattern 47M may be formed to cover the n-well 25 and the n-drain region 26. N-type impurities may be implanted into the channel region 28 adjacent to both sides of the second gate electrode 43B using the seventh mask pattern 47M as an ion implantation mask, thereby forming first and second source/drain regions 27 and 29. Thereafter, the seventh mask pattern 47M may be removed. As a result, the channel region 28 may be defined between the first and second source/drain regions 27 and 29.

Subsequently, the sixth and fifth mask patterns 45M and 37M may be removed. The gate dielectric layer 41A, 41B, and 41C portions may also be partially removed.

Figure 24:
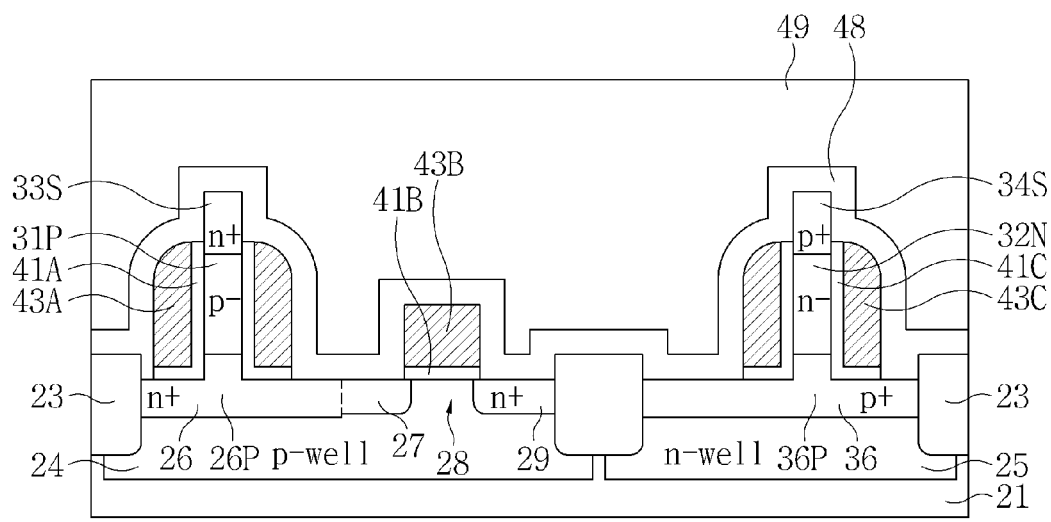

Referring to FIGS. 2 and 24, an etch stop layer 48 may be formed to cover the resulting surface of the semiconductor substrate 21. An interlayer insulating layer 49 may be formed on the etch stop layer 48. A top surface of the interlayer insulating layer 49 may be planarized.

Referring back to FIGS. 2 and 3A, a first plug 51, a second plug 52, a third plug 53, a fourth plug 54, a fifth plug 55, and a sixth plug 56 may be formed through the interlayer insulating layer 49 and the etch stop layer 48. First and second interconnection lines 57 and 59 may be formed on the interlayer insulating layer 49 to form the resulting semiconductor device.

Embodiment 8

FIGS. 25 through 31 are cross-sectional views illustrating a method of forming a semiconductor device according to an eighth embodiment of the inventive concept.

Figure 25:
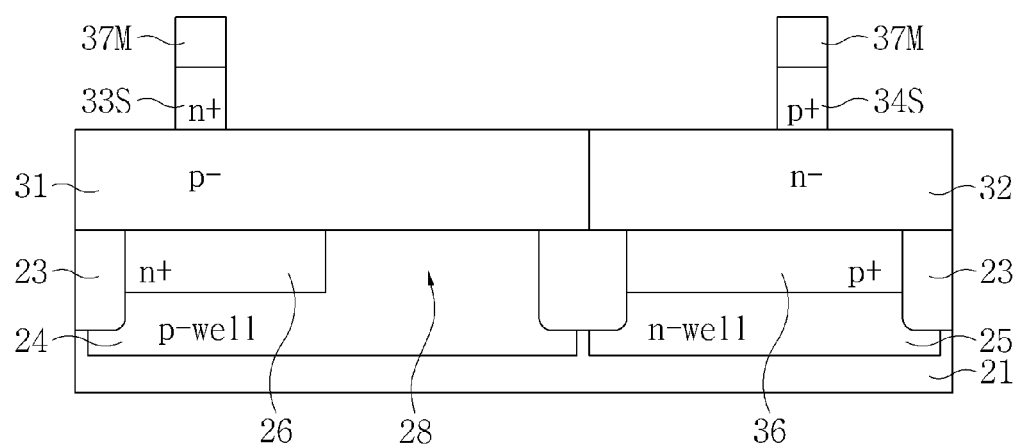
FIGS. 25 through 31 are cross-sectional views illustrating a method of forming a semiconductor device according to an eighth embodiment of the inventive concept.

Referring to FIG. 25, a p-well 24, an n-well 25, an isolation layer 23, an n-drain region 26, a channel region 28, a p-drain region 36, a first p-semiconductor layer 31, a first n-semiconductor layer 32, an n-source region 33S, a p-source region 34S, and a fifth mask pattern 37M may be formed on a semiconductor substrate 21.

Figure 26:
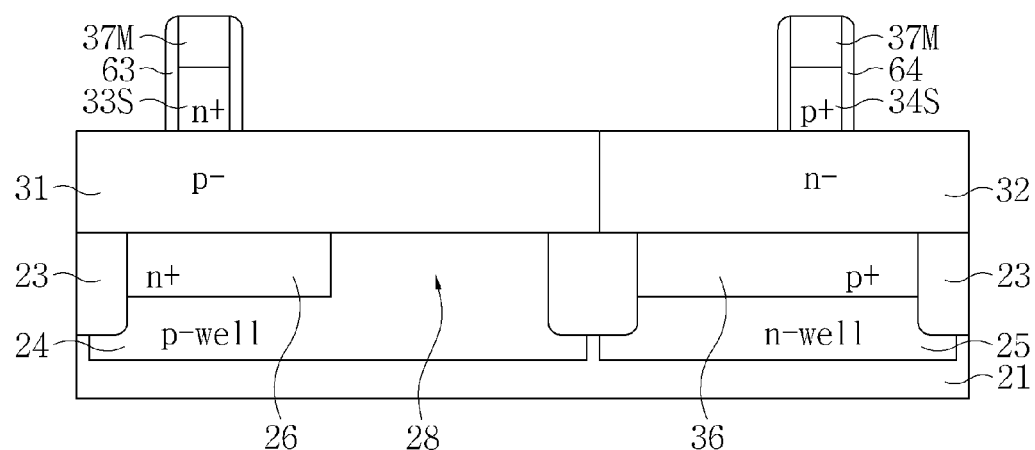

Referring to FIG. 26, first insulating spacers 63 may be formed on sidewalls of the fifth mask pattern 37M and the n-source region 33S, and second insulating spacers 64 may be formed on sidewalls of the fifth mask pattern 37M and the p-source region 34S.

Figure 27:
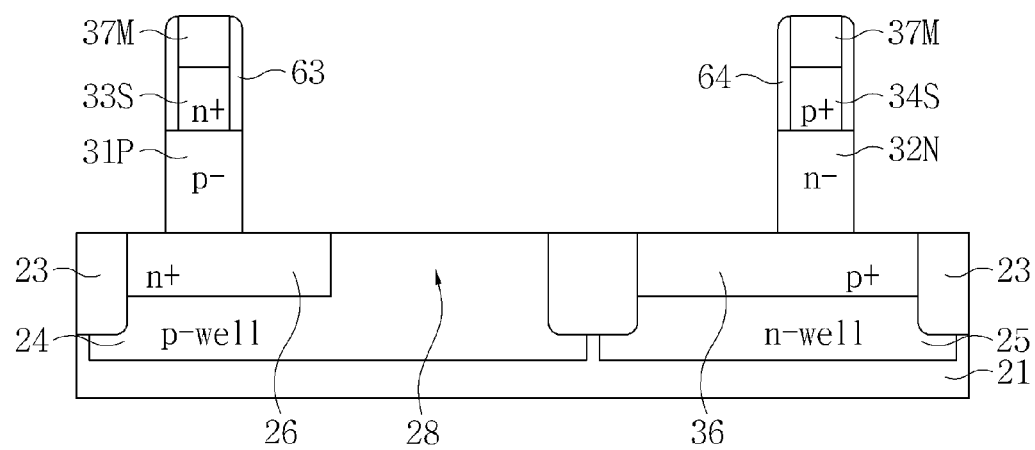

Referring to FIG. 27, the first p-semiconductor layer 31 and the first n-semiconductor layer 32 may be anisotropically etched using the fifth mask pattern 37M and the first and second insulating spacers 63 and 64 as an etch mask, thereby forming a p-vertical channel region 31P and an n-vertical channel region 32N.

Figure 28:
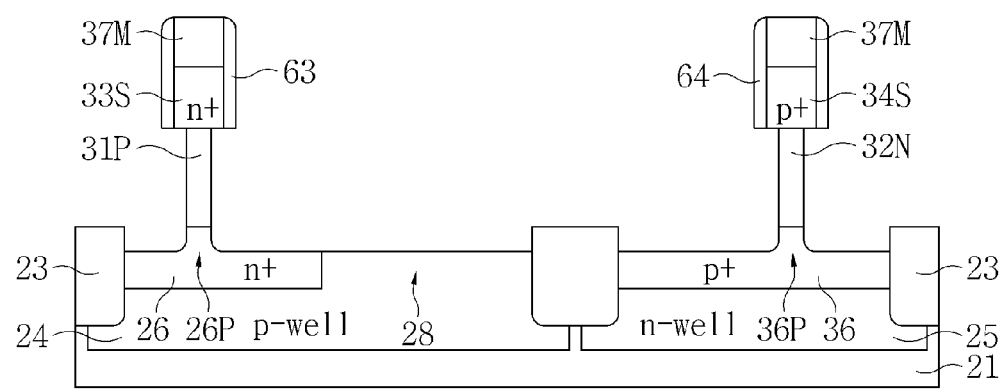

Referring to FIG. 28, the thicknesses of the p-vertical channel region 31P and the n-vertical channel region 32N in the horizontal direction may be reduced using a pullback process. The p-vertical channel region 31P may have a smaller width in the horizontal direction than that of the n-source region 33S. The n-vertical channel region 32N may have a width in the horizontal direction that is less than that of the p-source region 34S.

The pullback process may include isotropically etching the p-vertical channel region 31P and the n-vertical channel region 32N. During the pullback process, the n-drain region 26, the channel region 28, and the p-drain region 36 may become partially recessed and retained at a lower level than a top surface of the isolation layer 23. The n-drain region 26 may include an n-protrusion 26P, while the p-drain region 36 may include a p-protrusion 36P. The n-protrusion 26P may be disposed under and have sidewalls that are aligned with those of the p-vertical channel region 31P, while the p-protrusion 36P may be disposed under and have sidewalls that are aligned with those of the n-vertical channel region 32N.

Figure 29:
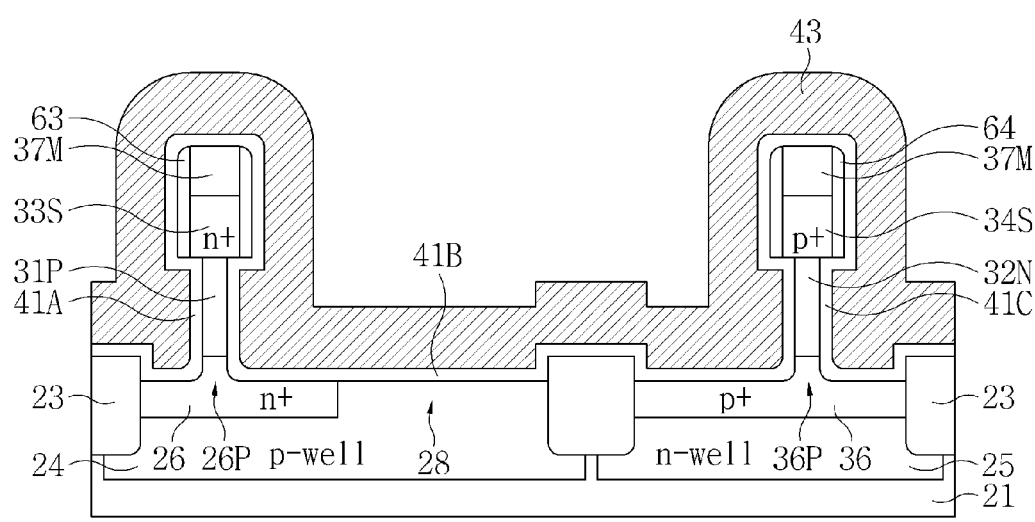

Referring to FIG. 29, a gate dielectric layer 41A, 41B, and 41C may be formed to cover the surface of the semiconductor substrate 21. A gate conductive layer 43 may be formed on the gate dielectric layer 41A, 41B, and 41C. The gate dielectric layer 41A, 41B, and 41C may include a first gate dielectric layer 41A portion covering sidewalls of the p-vertical channel region 31P, a second gate dielectric layer 41B portion covering the channel region 28, and a third gate dielectric layer 41C portion covering sidewalls of the n-vertical channel region 32N.

Figure 30:
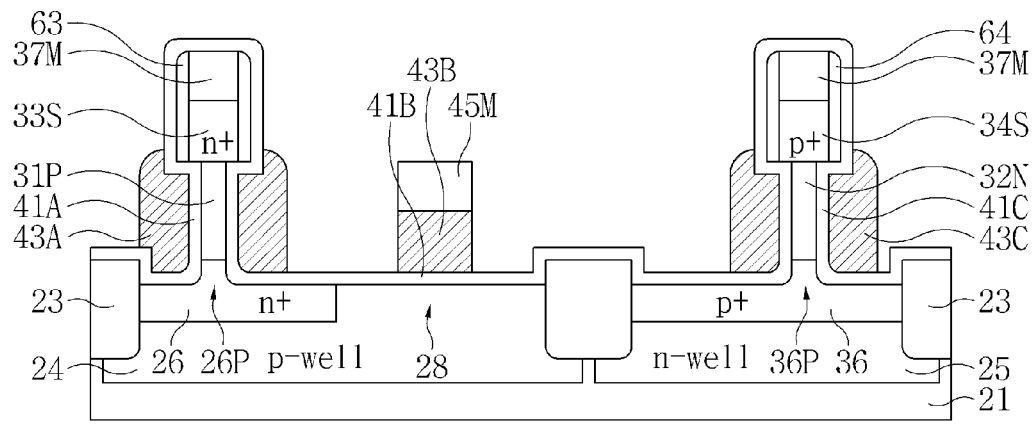

Referring to FIG. 30, a sixth mask pattern 45M may be formed on the gate conductive layer 43. The gate conductive layer 43 may be anisotropically etched using the sixth mask pattern 45M as an etch mask, thereby forming a first gate electrode 43A, a second gate electrode 43B, and a third gate electrode 43C. The sixth mask pattern 45M may cover the second gate electrode 43B. The sixth and fifth mask patterns 45M and 37M may be removed. The gate dielectric layer 41A, 41B, and 41C and the first and second insulating spacers 63 and 64 also may be partially removed.

Figure 31:
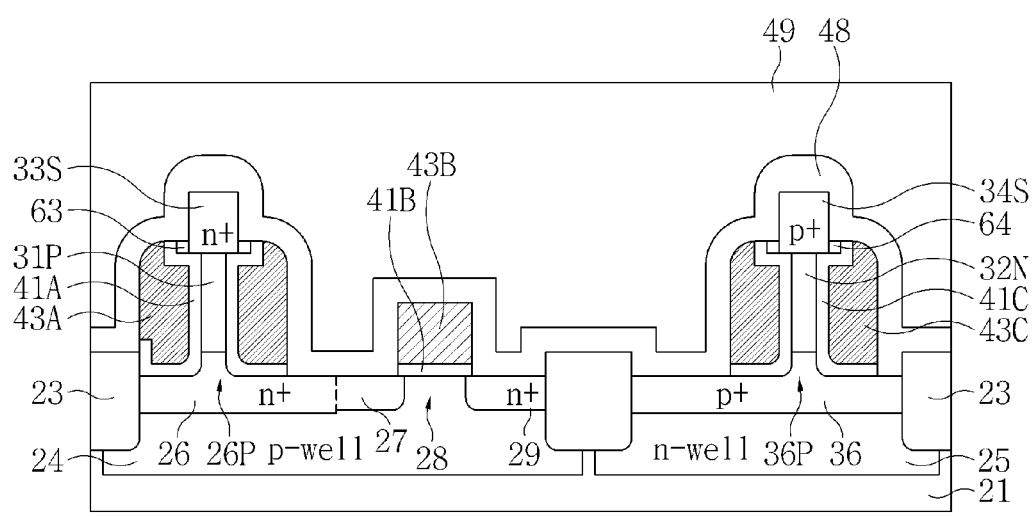

Referring to FIG. 31, n-type impurities may be implanted into the channel region 28 adjacent to both sides of the second gate electrode 43B, thereby forming a first source/drain region 27 and a second source/drain region 29. The channel region 28 may be defined between the first and second source/drain regions 27 and 29. An etch stop layer 48 may be formed to cover the surface of the semiconductor substrate 21. An interlayer insulating layer 49 may be formed on the etch stop layer 48.

Referring back to FIG. 4, a first plug 51, a second plug 52, and a third plug 53 may be formed through the interlayer insulating layer 49 and the etch stop layer 48. First and second interconnection lines 57 and 59 may be formed on the interlayer insulating layer 49 to form the resulting semiconductor device.

Embodiment 9

FIGS. 32 through 39 are cross-sectional views illustrating a method of forming a semiconductor device according to a ninth embodiment of the inventive concept.

Figure 32:
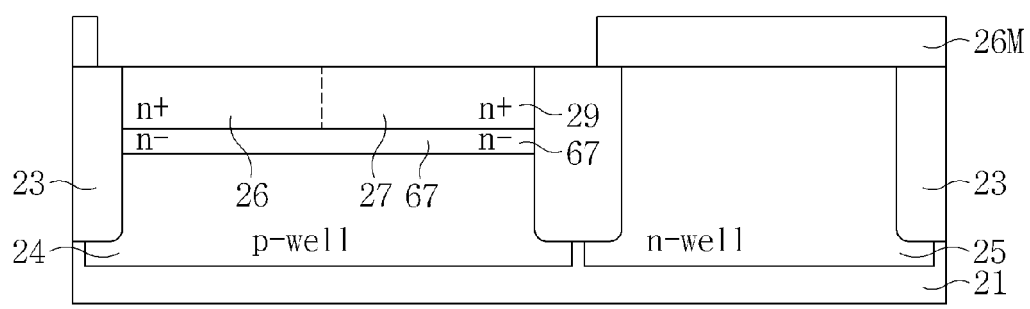
FIGS. 32 through 39 are cross-sectional views illustrating a method of forming a semiconductor device according to a ninth embodiment of the inventive concept.

Referring to FIG. 32, a p-well 24, an n-well 25, and an isolation layer 23 may be formed in a semiconductor substrate 21. A first mask pattern 26M may be formed to cover the n-well 25 and expose the p-well 24. N-type impurities may be implanted into the p-well 24 using the first mask pattern 26M as an ion implantation mask, thereby forming an n-drain region 26, a first source/drain region 27, a second source/drain region 29, and a lightly doped region 67. The lightly doped region 67 may be formed under the n-drain region 26, the first source/drain region 27, and the second source/drain region 29. The first mask pattern 26M may then be removed.

Figure 33:
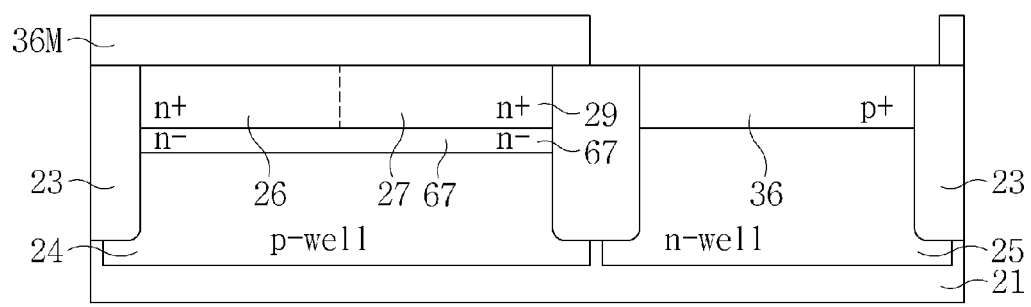

Referring to FIG. 33, a second mask pattern 36M may be formed to cover the p-well 24 and expose the n-well 25. P-type impurities may be implanted into the n-well 25 using the second mask pattern 36M as an ion implantation mask, thereby forming a p-drain region 36. The second mask pattern 36M may be removed to expose top surfaces of the n-drain region 26 and the p-drain region 36.

Figure 34:
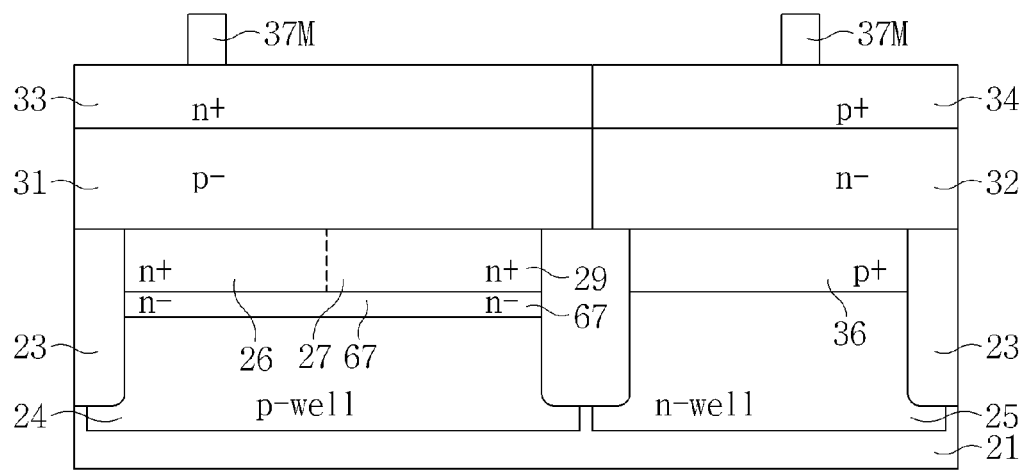

Referring to FIG. 34, a first p-semiconductor layer 31, a first n-semiconductor layer 32, a second n-semiconductor layer 33, a second p-semiconductor layer 34, and a fifth mask pattern 37M may be formed. The first p-semiconductor layer 31 and the second n-semiconductor layer 33 may be sequentially stacked on the n-drain region 26 and the first and second source/drain regions 27 and 29. The first n-semiconductor layer 32 and the second p-semiconductor layer 34 may be sequentially stacked on the p-drain region 36.

Figure 35:
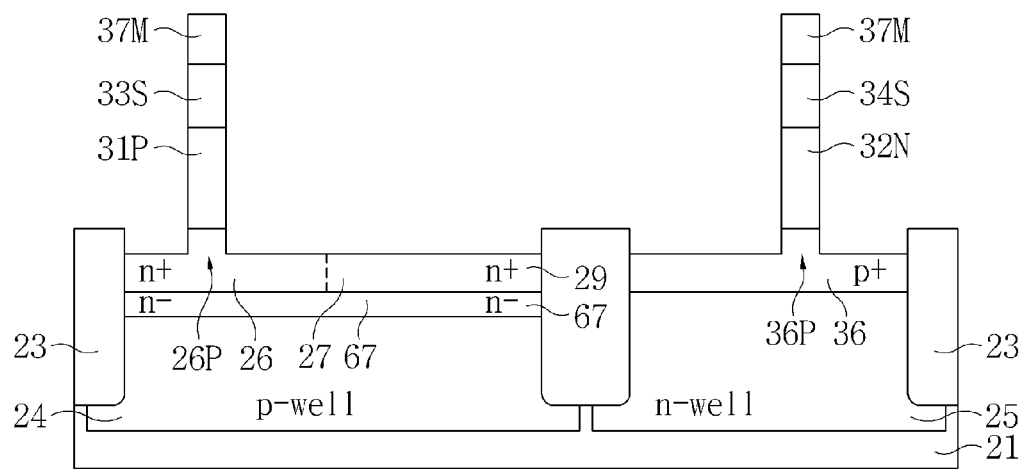

Referring to FIG. 35, the second n-semiconductor layer 33, the first p-semiconductor layer 31, the n-drain region 26, the first source/drain region 27, the second source/drain region 29, the second p-semiconductor layer 34, the first n-semiconductor layer 32, and the p-drain region 36 may be anisotropically etched using the fifth mask pattern 37M as an etch mask, thereby forming an n-source region 33S, a p-vertical channel region 31P, a p-source region 34S, and an n-vertical channel region 32N. The n-drain region 26, the first source/drain region 27, the second source/drain region 29, and the p-drain region 36 may be partially recessed and retained at a lower level than a top surface of the isolation layer 23. The n-drain region 26 may include an n-protrusion 26P, while the p-drain region 36 may include a p-protrusion 36P.

Figure 36:
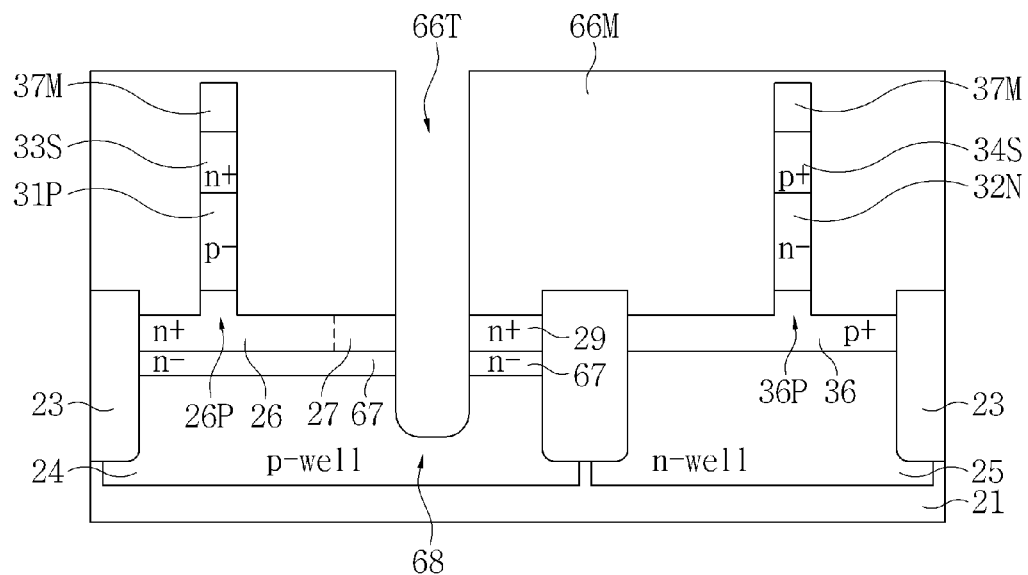

Referring to FIG. 36, a sixth mask pattern 66M may be formed on the semiconductor substrate 21. The first source/drain region 27, the second source/drain region 29, the lightly doped region 67, and the p-well 24 may be anisotropically etched using the sixth mask pattern 66M as an etch mask, thereby forming a gate trench 66T. The gate trench 66T may penetrate not only a region between the first and second source/drain regions 27 and 29 but also the lightly doped region 67. The lightly doped region 67 may be divided into two regions by the gate trench 66T. A channel region 68 may be defined by the gate trench 66T in the p-well 24. The sixth mask pattern 66M may be removed.

Figure 37:
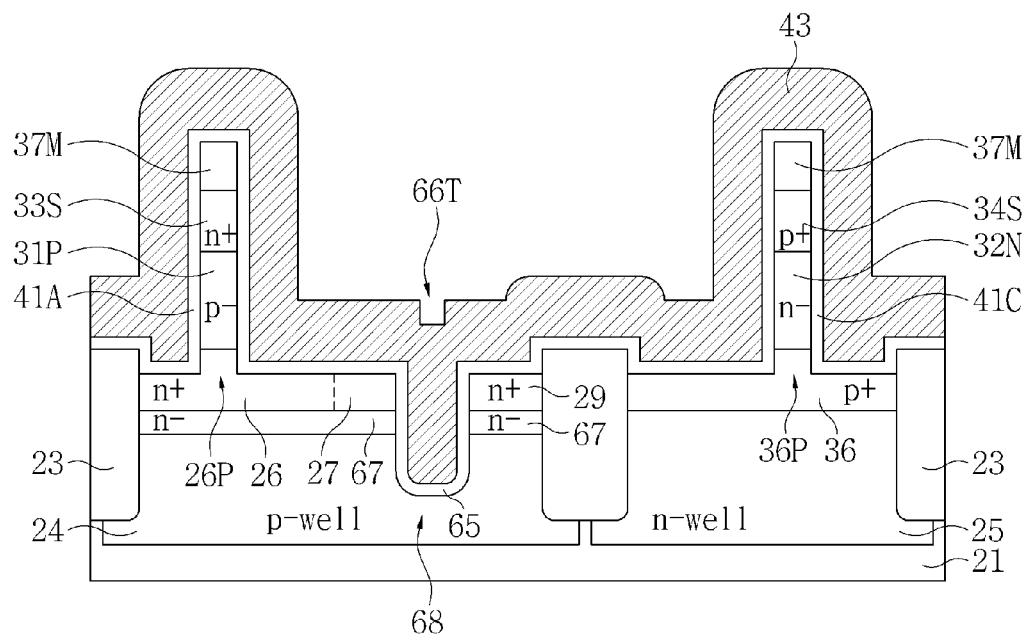

Referring to FIG. 37, a gate dielectric layer 41A, 65, and 41C may be formed to cover the surface of the semiconductor substrate 21. A gate conductive layer 43 may be formed on the gate dielectric layer 41A, 65, and 41C. The gate conductive layer 43 may completely fill the gate trench 66T.

Figure 38:
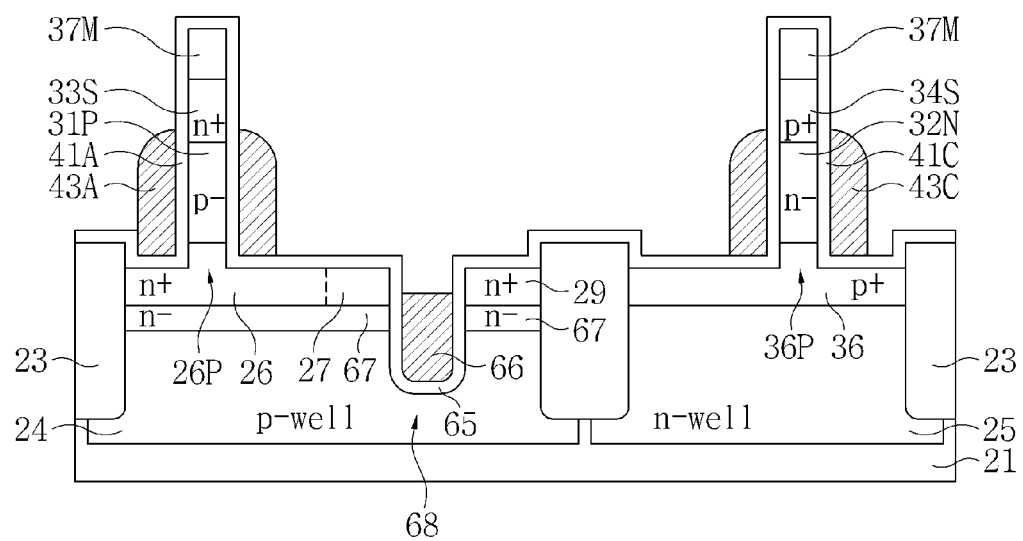

Referring to FIG. 38, the gate conductive layer 43 may be anisotropically etched, thereby forming a first gate electrode 43A, a second gate electrode 66, and a third gate electrode 43C. The second gate electrode 66 may be retained within the gate trench 66T. A first gate dielectric layer 41A may be retained between the first gate electrode 43A and the p-vertical channel region 31P, and a second gate dielectric layer 65 may be retained between the second gate electrode 66 and the channel region 68. Also, a third gate dielectric layer 41C may be retained between the third gate electrode 43C and the n-vertical channel region 32N.

A bottom of the second gate electrode 66 may be formed at a lower level than the first and second source/drain regions 27 and 29 and the lightly doped regions 67. A top of the second gate electrode 66 may be formed at a lower level than top surfaces of the first and second source/drain regions 27 and 29. The second gate electrode 66, the second gate dielectric layer 65, the channel region 68, the first source/drain region 27, the second source/drain region 29, and the lightly doped regions 67 may constitute a recess channel transistor. The recess channel transistor may be categorized as a non-vertical, or horizontal, transistor.

Subsequently, the gate dielectric layer 41A, 65, and 41C are partially etched and the fifth mask pattern 37M may be removed.

Figure 39:
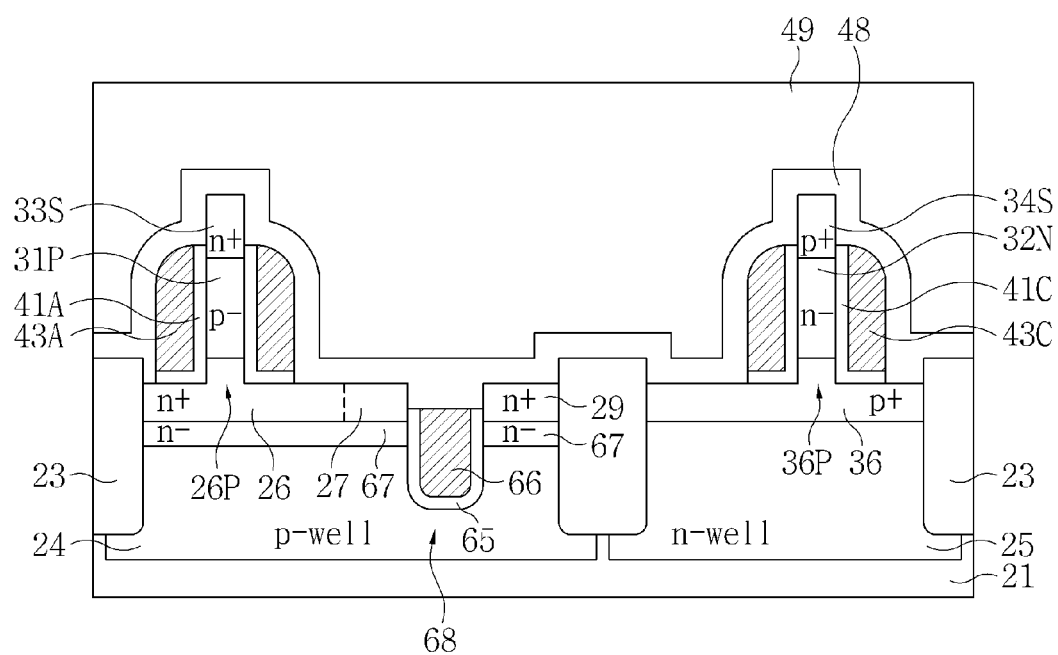
Figure 40A:
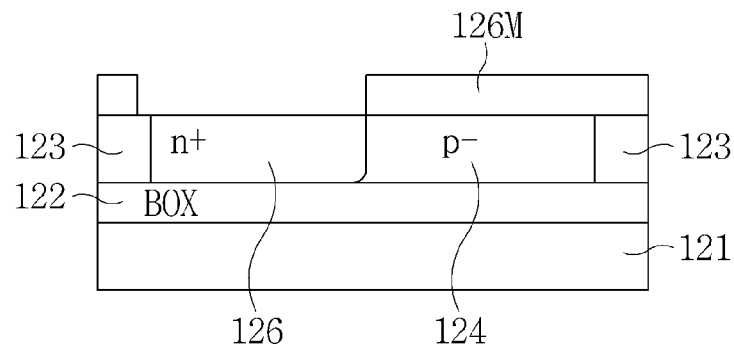
FIGS. 40A through 43C are cross-sectional views illustrating a method of forming a semiconductor device according to a tenth embodiment of the inventive concept.
Figure 40B:
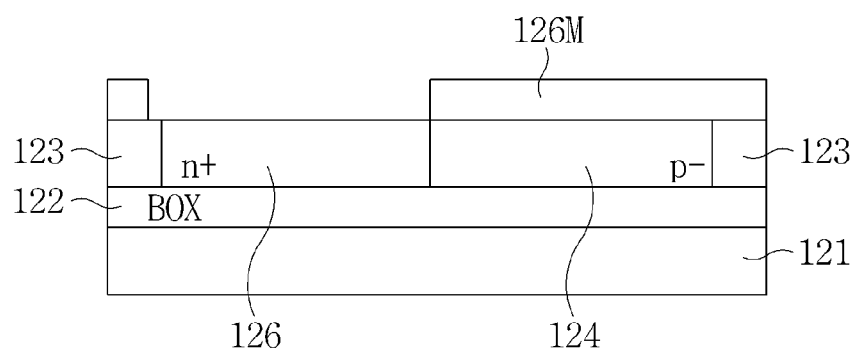
Figure 40C:
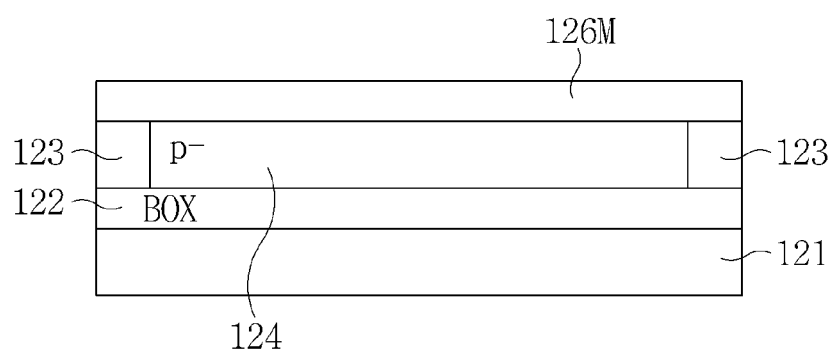
Figure 41A:
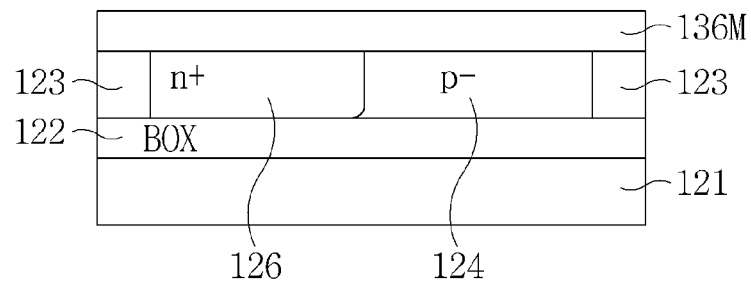
Figure 41B:
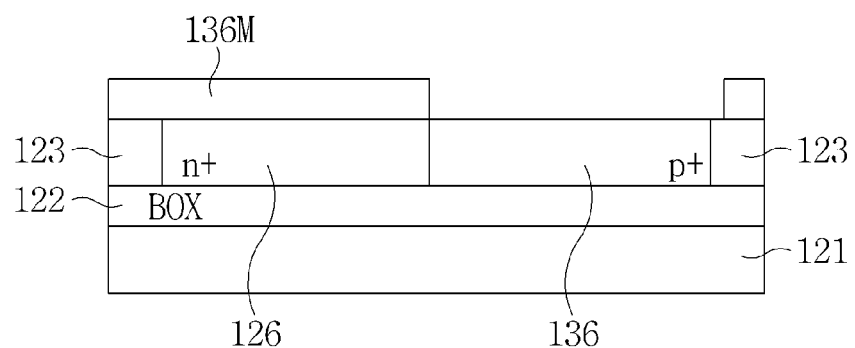
Figure 41C:
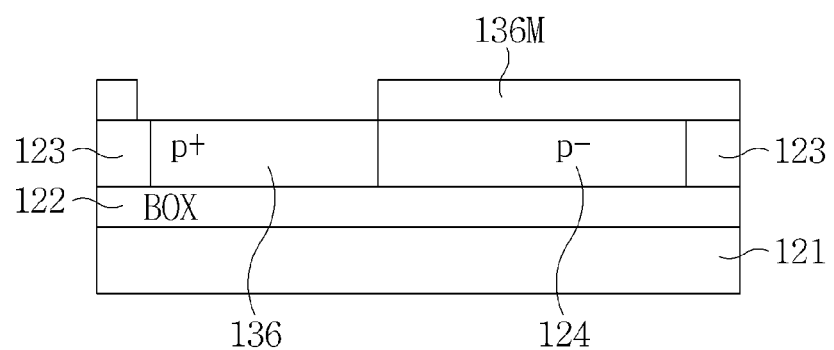
Figure 42A:
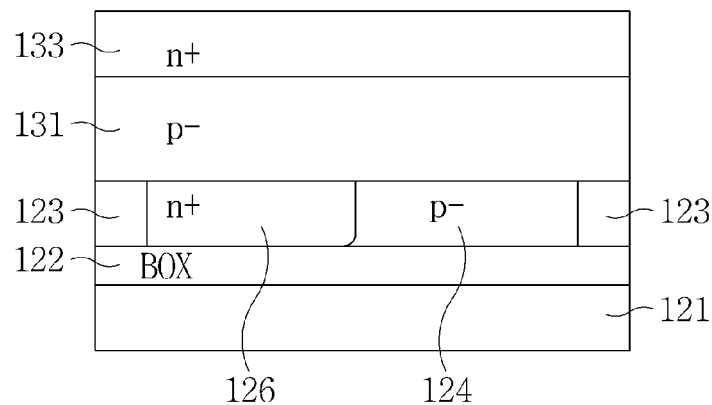
Figure 42B:
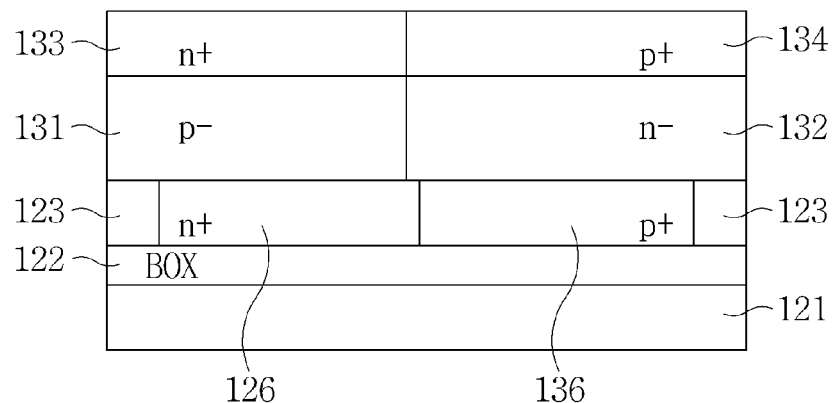
Figure 42C:
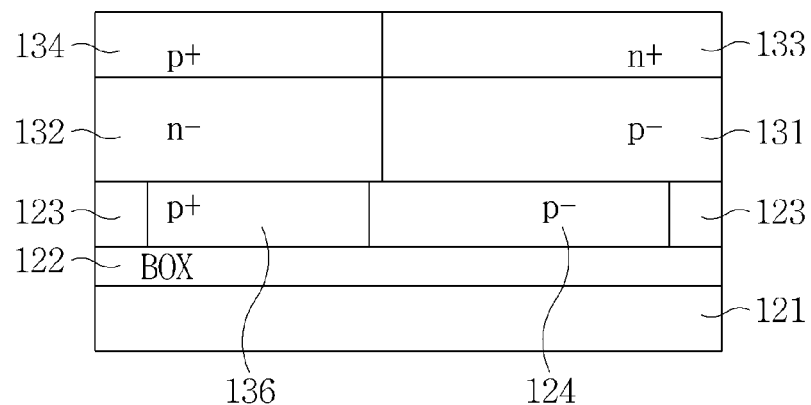
Figure 43A:
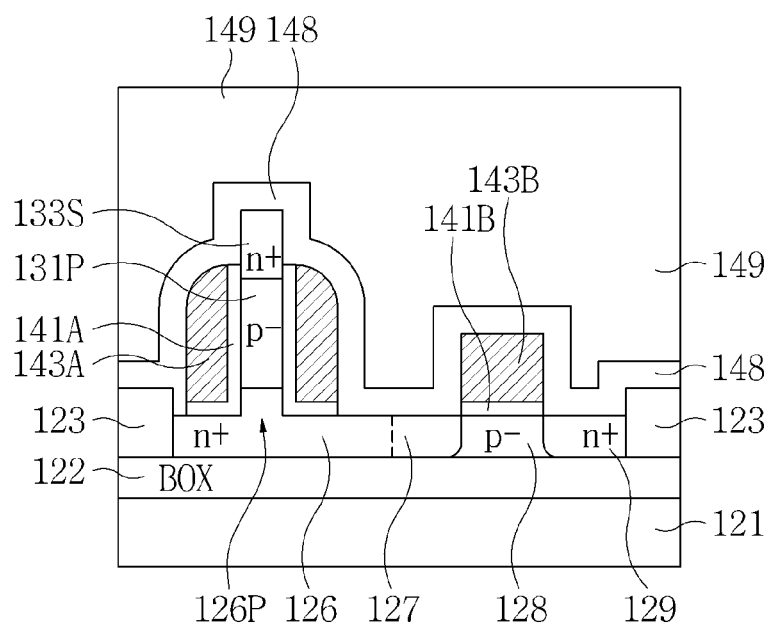
Figure 43B:
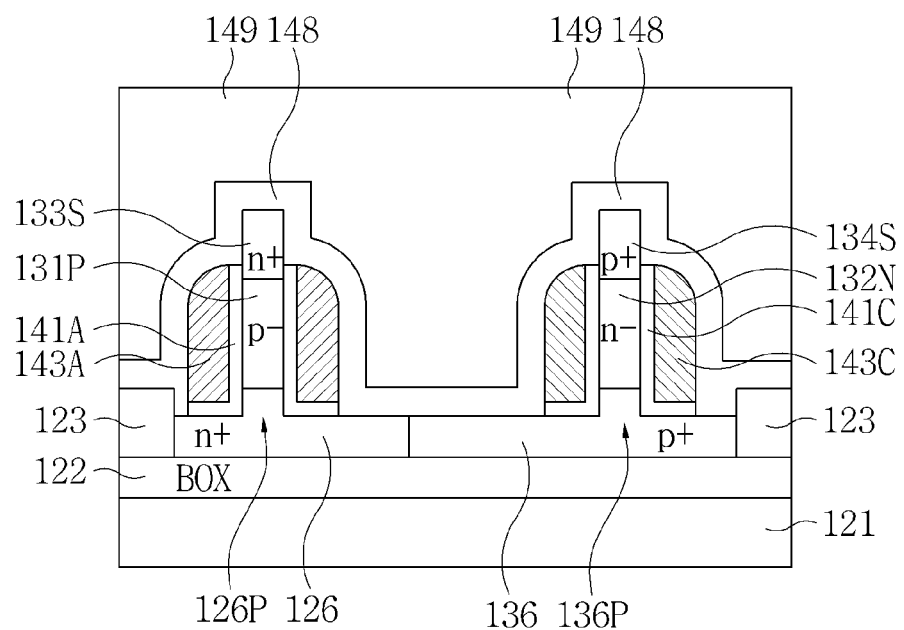
Figure 43C:
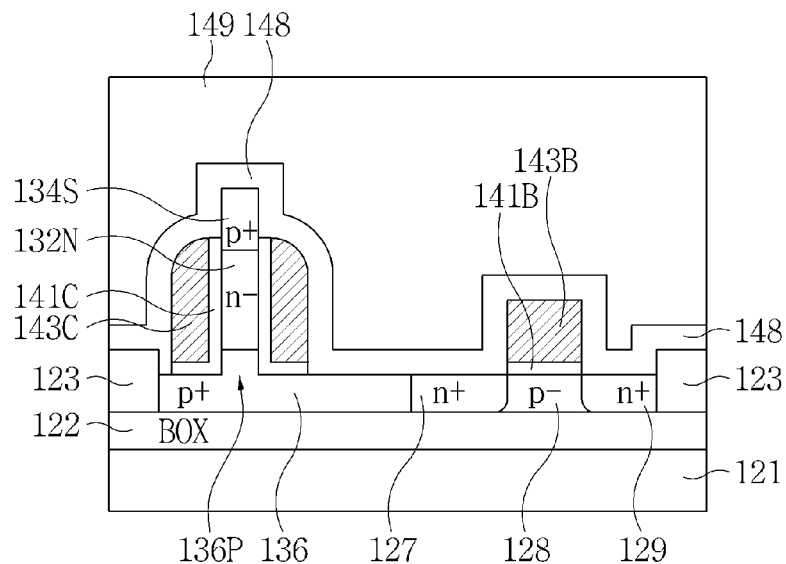

Referring to FIG. 39, an etch stop layer 48 may be formed to cover the surface of the semiconductor substrate 21. An interlayer insulating layer 49 may be formed on the etch stop layer 48. The etch stop layer 48 may cover the second gate electrode 66.

Referring back to FIG. 5, a first plug 51, a second plug 52, and a third plug 53 may be formed through the interlayer insulating layer 49 and the etch stop layer 48. First and second interconnection lines 57 and 59 may be formed on the interlayer insulating layer 49 to form the resulting semiconductor device.

Embodiment 10

FIGS. 40A through 43C are cross-sectional views taken along lines III-III', IV-IV', and V-V' of FIG. 8, illustrating a method of forming a semiconductor device according to a tenth embodiment of the inventive concept.

Referring to FIGS. 8, 40A, 40B, and 40C, a buried oxide layer 122 may be formed on a semiconductor substrate 121. An active region 124 and an isolation layer 123 may be formed on the buried oxide layer 122. Top surfaces of the active region 124 and the isolation layer 123 may be exposed on substantially the same plane surface. A first mask pattern 126M may be formed on the active region 124 and the isolation layer 123. An n-drain region 126 may be formed in the active region 124 by performing an ion implantation process using the first mask pattern 126M as an ion implantation mask.

The buried oxide layer 122 may be an insulating layer, such as a silicon oxide layer. In this case, the semiconductor substrate 121 may be a silicon-on-insulator (SOI) wafer. The active region 124 may include a single crystalline semiconductor having p-type impurities. The isolation layer 123 may penetrate the active region 124 and contact the buried oxide layer 122.

Referring to FIGS. 8, 41A, 41B, and 41C, a second mask pattern 136M may be formed on the n-drain region 126, the active region 124, and the isolation layer 123. P-impurities may be implanted into the active region 124 using the second mask pattern 136M as an ion implantation mask, thereby forming a p-drain region 136.

Referring to FIGS. 8, 42A, 42B, and 42C, a first p-semiconductor layer 131 may be formed on the n-drain region 126 and the active region 124, and a first n-semiconductor layer 132 may be formed on the p-drain region 136. A second n-semiconductor layer 133 may be formed on the first p-semiconductor layer 131, and a second p-semiconductor layer 134 may be formed on the first n-semiconductor layer 132.

Referring to FIGS. 8, 43A, 43B, and 43C, a p-vertical channel region 131P and an n-source region 133S may be formed on the n-drain region 126 in about the same manners as in the previous embodiments. The n-drain region 126 may include an n-protrusion 126P. A first gate electrode 143A may be formed on sidewalls of the p-vertical channel region 131P. A first gate dielectric layer 141A may be formed between the first gate electrode 143A and the p-vertical channel region 131P.

A second gate electrode 143B may be formed on the active region 124. A first source/drain region 127 and a second source/drain region 129 may be formed in the active region 124 adjacent to both sides of the second gate electrode 143B. A channel region 128 may be defined in the active region 124 between the first and second source/drain regions 127 and 129. A second gate dielectric layer 141B may be formed between the second gate electrode 143B and the channel region 128.

An n-vertical channel region 132N and a p-source region 134S may be formed on the p-drain region 136. The p-drain region 136 may include a p-protrusion 136P. A third gate electrode 143C may be formed on sidewalls of the n-vertical channel region 132N. A third gate dielectric layer 141C may be formed between the third gate electrode 143C and the n-vertical channel region 132N.

A gate pad 143P may be formed on the isolation layer 123. An etch stop layer 148 may be formed to cover the entire surface of the semiconductor substrate 121. An interlayer insulating layer 149 may be formed on the etch stop layer 148.

Referring to FIGS. 8, 9A, 9B, and 9C, a first plug 151, a second plug 153, a third plug 154, a fourth plug 155, and a fifth plug 156 may be formed through the interlayer insulating layer 149 and the etch stop layer 148. First and second interconnection lines 157 and 159 may be formed on the interlayer insulating layer 149 to form the resulting semiconductor device.

Experimental Example

Figure 44A:
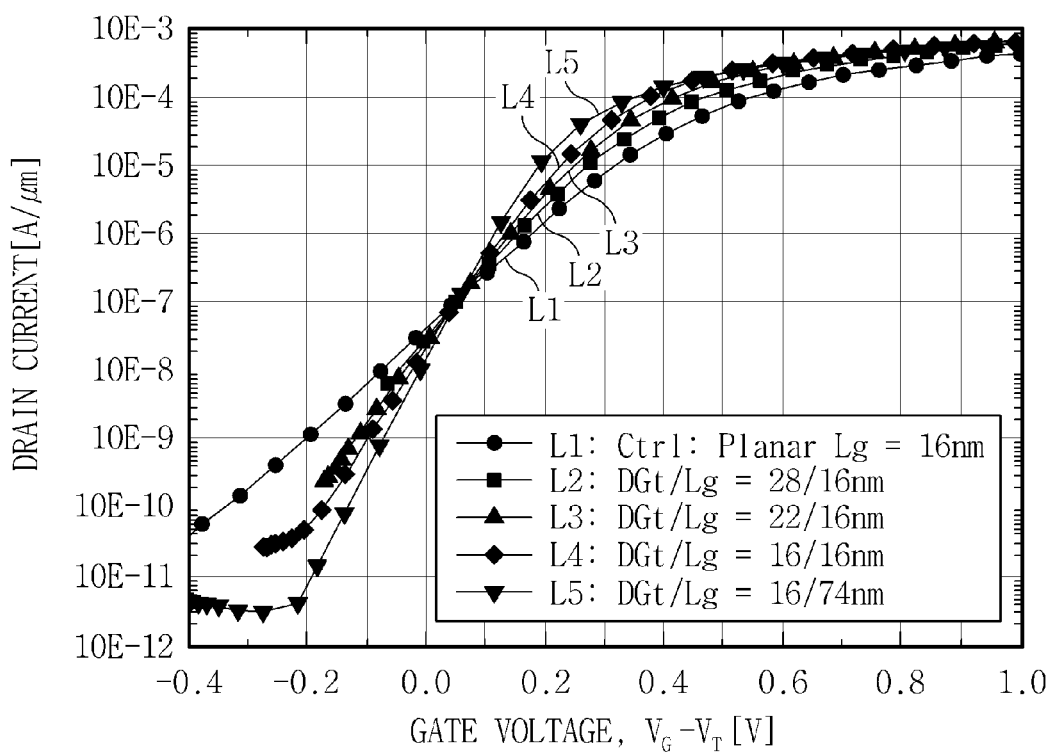
FIGS. 44A and 44B are current-voltage (IV) graphs showing drain current characteristics of Experimental Examples according to the inventive concept.
Figure 44B:
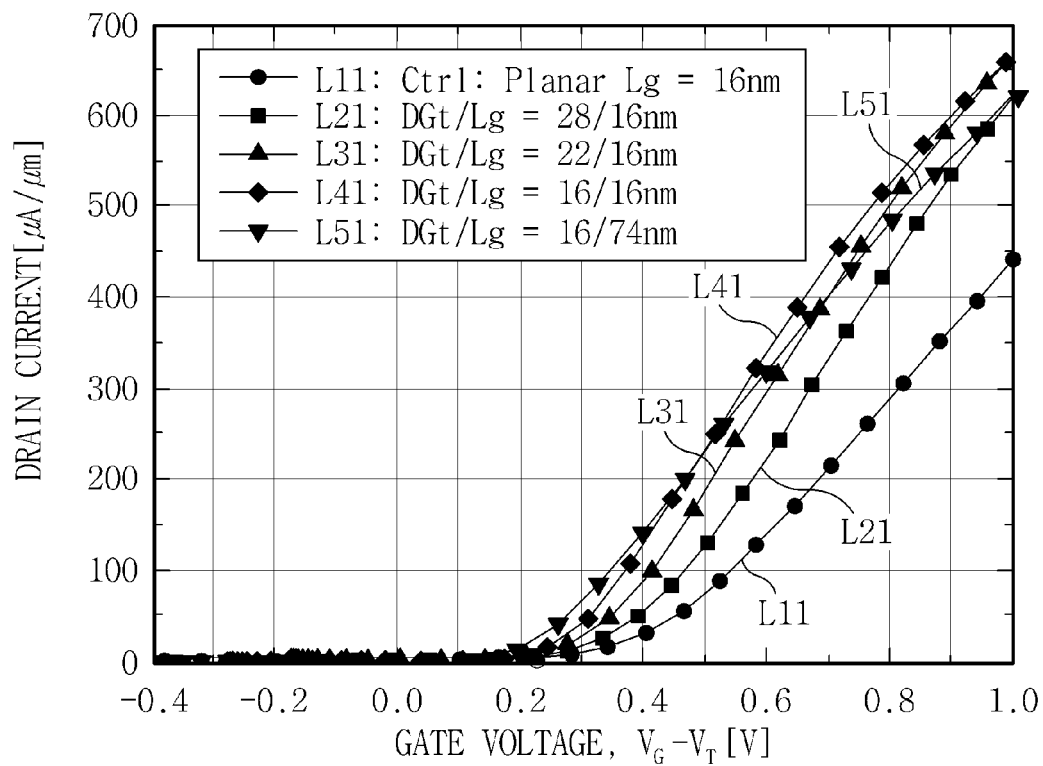

FIGS. 44A and 44B are current-voltage (IV) graphs showing drain current characteristics of Experimental Examples according to the inventive concepts. In FIGS. 44A and 44B, the horizontal axis denotes a gate bias voltage expressed in units of volts (V). A vertical axis of FIG. 44A denotes a drain current expressed in units of A/μm on a logarithmic scale, while a vertical axis of FIG. 44B denotes a drain current expressed in units of μA/μm on a linear scale.

Referring to FIG. 44A, curve L1 shows a drain current characteristic of a planar transistor having a similar construction to the second gate electrode 43B of FIG. 3A, and curves L2 through L5 show drain current characteristics of vertical transistors having similar constructions to the p-vertical channel region 31P and the first gate electrode 43A of FIG. 3A. In this case, each of the vertical transistors may be interpreted as a double-gate transistor. In the curve L1, the second gate electrode 43B has a horizontal width Lg of about 16 nm. In the curve L2, the p-vertical channel region 31P has a horizontal width DGt of about 28 nm and a vertical height Lg of about 16 nm. In the curve L3, the p-vertical channel region 31P has a horizontal width DGt of about 22 nm and a vertical height Lg of about 16 nm. In the curve L4, the p-vertical channel region 31P has a horizontal width DGt of about 16 nm and a vertical height Lg of about 16 nm. In the curve L5, the p-vertical channel region 31P has a horizontal width DGt of about 16 nm and a vertical height Lg of about 74 nm.

As shown in FIG. 44A, it can be seen that each of the vertical transistors may exhibit a lower leakage current characteristic than the planar transistor. Also, it can be inferred that with a reduction in the horizontal width DGt of the p-vertical channel region 31P, the subthreshold current may increase, and off-current may decrease.

Referring to FIG. 44B, it can be seen from curves L11 to L51 that each vertical transistor may exhibit a higher on-current characteristic than the planar transistor. Also, it may be inferred that with a reduction in a horizontal width DGt of a p-vertical channel region 31P, on-current may increase.

Embodiment 11

Figure 45:
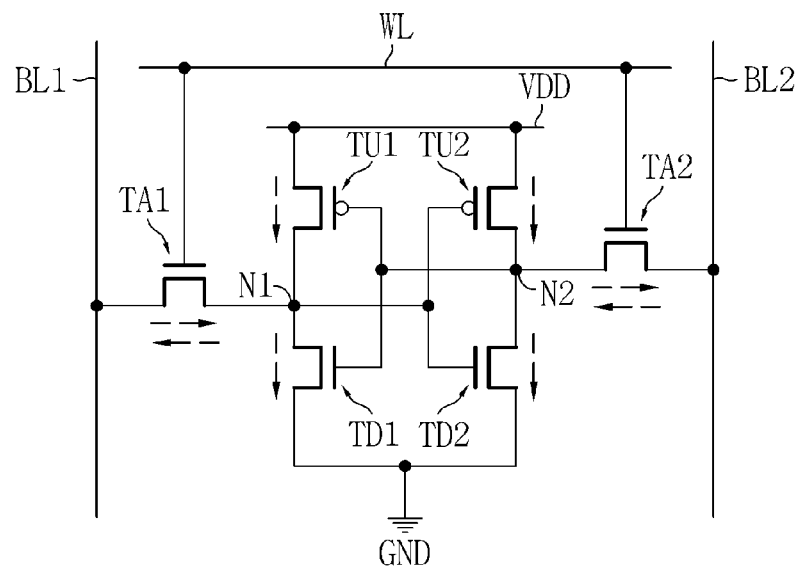
FIG. 45 is an equivalent circuit diagram of a CMOS static random access memory (SRAM) cell according to an eleventh embodiment of the inventive concept.

FIG. 45 is an equivalent circuit diagram of a CMOS SRAM cell according to an eleventh embodiment of the inventive concept.

Referring to FIG. 45, the CMOS SRAM cell may include a pair of pull-down transistors TD1 and TD2, a pair of access transistors TA1 and TA2, and a pair of pull-up transistors TU1 and TU2. Both of the pull-down transistors TD1 and TD2 and both of the access transistors TA1 and TA2 may be NMOS transistors, and both of the pull-up transistors TU1 and TU2 may be PMOS transistors.

The first pull-down transistor TD1 and the first access transistor TA1 may be connected in series to each other. A source of the first pull-down transistor TD1 may be electrically connected to a ground GND, while a drain of the first access transistor TA1 may be electrically connected to a first bit line BL1. Similarly, the second pull-down transistor TD2 and the second access transistor TA2 may be connected in series to each other. A source of the second pull-down transistor TD2 may be electrically connected to the ground GND, and a drain of the second access transistor TA2 may be electrically connected to a second bit line BL2.

Meanwhile, a source and drain of the first pull-down transistor TU1 may be electrically connected to a power source VDD and a drain of the first pull-down transistor TD1, respectively. Similarly, a source and drain of the second pull-up transistor TU2 may be electrically connected to the power source VDD and a drain of the second pull-down transistor TD2, respectively. The drain of the first pull-up transistor TU1, the drain of the first pull-down transistor TD1, and a source of the first access transistor TA1 may correspond to a first node N1. Also, the drain of the second pull-up transistor TU2, the drain of the second pull-down transistor TD2, and a source of the second access transistor TA2 may correspond to a second node N2. A gate electrode of the first pull-down transistor TD1 and a gate electrode of the first pull-up transistor TU1 may be electrically connected to the second node N2, while a gate electrode of the second pull-down transistor TD2 and a gate electrode of the second pull-up transistor TU2 may be electrically connected to the first node N1. Also, gate electrodes of the first and second access transistors TA1 and TA2 may be electrically connected to a word line WL.

Each arrow (→) of FIG. 45 denotes a direction in which current flows. As shown in FIG. 45, current may flow through the pull-up transistors TU1 and TU2 and the pull-down transistors TD1 and TD2 in one direction, while the access transistors TA1 and TA2 may operate to have current flow in opposite directions.

The semiconductor devices and methods of forming the same described with reference to FIGS. 1 through 43C may be variously applied to the CMOS SRAM cell. For example, as described with reference to FIGS. 2 and 3A, the n-drain region 26, the p-vertical channel region 31P, the n-source region 33S, the first gate dielectric layer 41A, and the first gate electrode 43A may correspond to the first pull-down transistor TD1. The p-drain region 36, the n-vertical channel region 32N, the p-source region 34S, the third gate dielectric layer 41C, and the third gate electrode 43C may correspond to the first pull-up transistor TU1. Also, the first source/drain region 27, the second source/drain region 29, the channel region 28, the second gate dielectric layer 41B, and the second gate electrode 43B may correspond to the first access transistor TA1.

The n-drain region 26, the first plug 51, the first interconnection line 57, the second plug 52, the p-drain region 36, and the first source/drain region 27 may constitute the first node N1. As described above, the first source/drain region 27 may be contiguous with the n-drain region 26. As a result, an electric resistance of the first node N1 may be markedly reduced. Furthermore, the sizes of the first source/drain region 27 and the n-drain region 26 may be relatively minimized. That is, a structure in which the first source/drain region 27 and the n-drain region 26 are in continuity with each other and at the same level may be highly advantageous to an increase in the integration density of the CMOS SRAM cell. The first pull-down transistor TD1 and the first pull-up transistor TU1 may have a heightened subthreshold characteristics and low leakage current characteristics. In addition, a circuit configuration including a combination of the first pull-down transistor TD1, the first pull-up transistor TU1, and the first access transistor TA1 may exhibit remarkably reduced power consumption in a CMOS SRAM cell.

Embodiment 12

Figure 46:
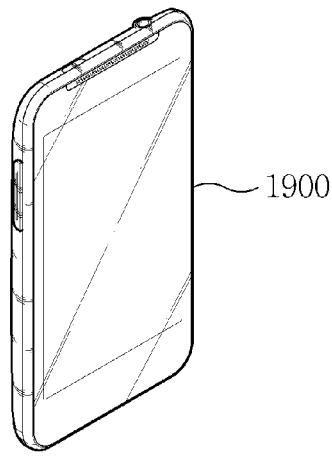
FIGS. 46 and 47 are a perspective view and block diagram, respectively, of an electronic system according to a twelfth embodiment of the inventive concept.
Figure 47:
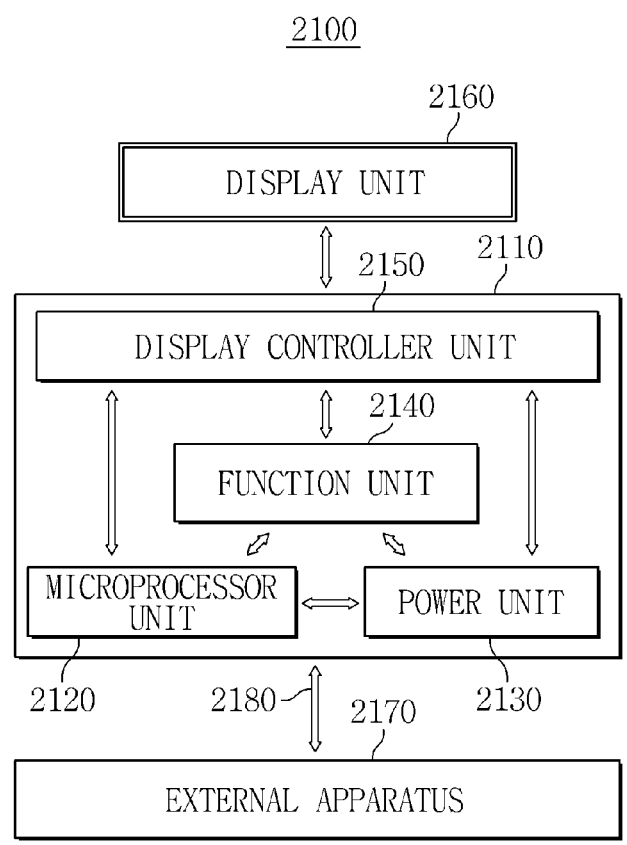

FIGS. 46 and 47 are a perspective view and block diagram, respectively, of an electronic system according to a twelfth embodiment of the inventive concept.

Referring to FIG. 46, the semiconductor devices and methods of forming the same described with reference to FIGS. 1 through 45 may be effectively applied to electronic systems 1900, such as portable telephones, netbooks, laptop computers, or tablet personal computers (PC).

Referring to FIG. 47, semiconductor devices configured in accordance with the embodiments in connection with FIGS. 1 through 45 may be applied to an electronic system 2100. The electronic system 2100 may include a body 2110, a microprocessor unit (MPU) 2120, a power unit 2130, a function unit 2140, and a display controller unit 2150. The body 2110 may be a mother board including a printed circuit board (PCB). The MPU 2120, the power unit 2130, the function unit 2140, and the display controller unit 2150 may be mounted on the body 2110. A display unit 2160 may be disposed inside or outside the body 2110. For example, the display unit 2160 may be disposed on the surface of the body 2110 and display an image processed by the display controller unit 2150.

The power unit 2130 may receive a predetermined voltage from an external battery (not shown), divide the voltage into voltages having required voltage levels, and supply the divided voltages to the MPU 2120, the function unit 2140, and the display controller unit 2150. The MPU 2120 may receive the voltage from the power unit 2130 and control the function unit 2140 and the display unit 2160. The function unit 2140 may perform various functions of the electronic system 2100. For instance, when the electronic system 2100 is a portable phone, the function unit 2140 may include several components capable of portable phone functions, such as the output of an image to the display unit 2160 or the output of a voice to a speaker, by dialing or communication with an external apparatus 2170. Also, when the electronic system 2100 includes a camera, the electronic system 2100 may serve as a camera image processor.

In applied embodiments, when the electronic system 2100 is connected to a memory card to increase the capacity, thereof, the function unit 2140 may be a memory card controller. The function unit 2140 may transmit and receive signals to and from the external apparatus 2170 through a wired or wireless communication unit 2180. Furthermore, when the electronic system 2100 requires a universal serial bus (USB) to expand functions thereof, the function unit 2140 may serve as an interface controller.

Semiconductor devices configured in accordance with the embodiments described above in connection with FIGS. 1 through 45 may be applied to at least one of the MPU 2120 and the function unit 2140. For example, the MPU 2120 or the function unit 2140 may include the pull-down transistor TD, the pull-up transistor TU, and the access transistor TA. In this case, the electronic system 2100 may be effectively made more lightweight, thinner, simpler, and smaller and exhibit low power consumption characteristics.

According to the embodiments of the inventive concepts, a semiconductor device including a first vertical transistor, a second vertical transistor, and a non-vertical transistor may be provided. A first drain region of the first vertical transistor, a second drain region of the second vertical transistor, a non-vertical drain region of the non-vertical transistor, and a non-vertical source region of the non-vertical transistor may be formed at the same level. One of the non-vertical drain region and the non-vertical source region may be contiguous with the first drain region. The second drain region may be connected to the first drain region. As a result, a semiconductor device that may increase integration density and reduce power consumption may be embodied.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the inventive concepts as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory cell of a memory device comprising:
    a first pull-up transistor and a first pull-down transistor coupled at a first node and connected in series between a first voltage source and a second voltage source, gates of the first pull-up transistor and the first pull-down transistor coupled at a second node;
    a first access transistor coupled between the first node and a first bit line of the memory device, a gate of the first access transistor coupled to a word line of the memory device;
    a second pull-up transistor and a second pull-down transistor coupled at the second node and connected in series between the first voltage source and the second voltage source, gates of the second pull-up transistor and the second pull-down transistor coupled to the first node; and
    a second access transistor coupled between the second node and a second bit line of the memory device, a gate of the second access transistor coupled to the word line of the memory device;
    wherein the first pull-up transistor, the first pull-down transistor, the second pull-up transistor and the second pull-down transistor each comprise vertical channel transistors having channel regions that extend in a vertical direction relative to a substrate of the memory device, and each comprise gate electrodes at sidewalls of the vertically extending channel regions;
    wherein the first access transistor and the second access transistor each comprise horizontal channel transistors having channel regions that extend in a horizontal direction of the substrate, and each comprise gate electrodes on the channel regions; and
    wherein the gate electrodes of the first pull-up transistor, the first pull-down transistor, the second pull-up transistor and the second pull-down transistor and the gate electrodes of the first access transistor and the second access transistor comprise portions of a same layer of material.

2. The memory cell of claim 1 wherein the vertical channel transistors each comprise:
    a first diffusion region on the substrate;
    the channel region on the first diffusion region and extending in the vertical direction relative to the horizontal direction of extension of the substrate;
    a second diffusion region on the channel region; and
    the gate electrode at a sidewall of, and insulated from, the channel region;
    and wherein the horizontal channel transistors each comprise:
    a first diffusion region and a second diffusion region on the substrate and spaced apart from each other;
    the channel region on the substrate between the first diffusion region and the second diffusion region; and
    the gate electrode on the channel region and isolated from the channel region.

3. The memory cell of claim 2 wherein the first diffusion region of each of the horizontal channel transistors is contiguous with the first diffusion region of one of the vertical channel transistors.

4. The memory cell of claim 3 wherein the first diffusion region of each of the horizontal transistors that is contiguous with the first diffusion region of one of the vertical transistors has a lower boundary that is higher in vertical position than a lower boundary of the first diffusion region of the vertical transistor, relative to an upper surface of the substrate.

5. The memory cell of claim 3 wherein the first diffusion region of each of the horizontal transistors that is contiguous with the first diffusion region of one of the vertical transistors has a lower boundary that is lower in vertical position than a lower boundary of the first diffusion region of the vertical transistor, relative to an upper surface of the substrate.

6. The memory cell of claim 3 wherein the first diffusion region of each of the horizontal transistors that is contiguous with the first diffusion region of one of the vertical transistors has a lower boundary that has a same vertical position as a lower boundary of the first diffusion region of the vertical transistor, relative to an upper surface of the substrate.

7. The memory cell of claim 2 wherein:
the first diffusion region of each vertical transistor comprises a drain of the vertical transistor;
the second diffusion region of each vertical transistor comprises a source of the vertical transistor;
the first diffusion region of each horizontal transistor comprises one of a drain and source of the horizontal transistor; and
the second diffusion region of each horizontal transistor comprises the other of the drain and source of the horizontal transistor.

8. The memory cell of claim 2 wherein the first diffusion region of the vertical transistors and the first diffusion region and second diffusion regions of the horizontal transistors lie at a same vertical position relative to the substrate.

9. The memory cell of claim 2 wherein the first diffusion regions of the vertical transistors each includes a vertical protrusion extending in the vertical direction, and wherein the vertical channel region is on the vertical protrusion.

10. The memory cell of claim 2 wherein the vertical transistors each further comprise a silicide region on the second diffusion region, and a metal pattern on the silicide region.

11. The memory cell of claim 2 wherein the second diffusion region of each vertical transistor comprises a silicide region in direct contact with the vertical channel region of the vertical transistor.

12. The memory cell of claim 2 wherein the first diffusion region of the horizontal transistors and the first diffusion region of the vertical transistors both have a silicide region thereon.

13. The memory cell of claim 2 wherein the second diffusion region of the vertical transistors has a width in the horizontal direction that is greater than a width of the channel region of the vertical transistors in the horizontal direction.

14. The memory cell of claim 2 wherein the gate electrodes of the horizontal transistors have a bottom that is at a position that is lower than a lower boundary of the first and second diffusion regions of the horizontal transistors.

15. The memory cell of claim 2 further comprising an interlayer via in direct contact with a top of the second diffusion region of the vertical transistors.

16. The memory cell of claim 1 wherein a portion of the gate electrodes of the first pull-up transistor, the first pull-down transistor, the second pull-up transistor and the second pull-down transistor and a portion of the gate electrodes of the first access transistor and the second access transistor are at a same vertical position in the vertical direction relative to the substrate.

17. The memory cell of claim 1 further comprising a layer of material on the horizontal transistor and the vertical transistor, the gate electrodes of the first pull-up transistor, the first pull-down transistor, the second pull-up transistor and the second pull-down transistor and the gate electrodes of the first access transistor and the second access transistor both in direct contact with the layer of material.

18. The memory cell of claim 17 wherein the layer of material comprises at least one of an etch stop layer, or an insulating layer.

19. The memory cell of claim 1 further comprising a buried oxide layer on the substrate and wherein the vertical transistor and the horizontal transistor are on the buried oxide layer.

20. The memory cell of claim 1 wherein the channel region of the vertical transistor comprises single-crystal material.

* * * * *

UNITED STATES PATENT AND TRADEMARK OFFICE
CERTIFICATE OF CORRECTION

PATENT NO. : 9,461,054 B2
APPLICATION NO. : 14/789433
DATED : October 4, 2016
INVENTOR(S) : Min-Chul Sun et al.

It is certified that error appears in the above-identified patent and that said Letters Patent is hereby corrected as shown below:

On the Title Page

Item (73) in the Assignee after "Samsung Electronics Co., Ltd (KR)" insert -- and SNU R & DB Foundation (KR) --

Signed and Sealed this
Twenty-seventh Day of March, 2018

Andrei Iancu
*Director of the United States Patent and Trademark Office*